United States Patent
Watanabe et al.

(10) Patent No.: US 8,652,668 B2
(45) Date of Patent: Feb. 18, 2014

(54) SECONDARY BATTERY; SOLAR POWER GENERATION SYSTEM, WIND POWER GENERATION SYSTEM, AND VEHICLE PROVIDED THEREWITH; AND METHOD FOR FABRICATION OF A SECONDARY BATTERY

(75) Inventors: Yuki Watanabe, Osaka (JP); Naoto Nishimura, Osaka (JP); Kazuya Sakashita, Osaka (JP); Yoshihiro Tsukuda, Osaka (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 574 days.

(21) Appl. No.: 13/027,631

(22) Filed: Feb. 15, 2011

(65) Prior Publication Data

US 2011/0200855 A1     Aug. 18, 2011

(30) Foreign Application Priority Data

Feb. 15, 2010  (JP) ................. 2010-030246
May 10, 2010   (JP) ................. 2010-108602

(51) Int. Cl.
*H01M 2/38*     (2006.01)

(52) U.S. Cl.
USPC .............. 429/80; 137/260; 29/623.2

(58) Field of Classification Search
USPC ............. 429/63, 64, 72, 80, 81; 29/623.2; 137/260, 261; 141/1.1, 32
See application file for complete search history.

(56) References Cited

U.S. PATENT DOCUMENTS 1,301,780 A *     4/1919    Lotsch ........................ 429/80
2011/0108134 A1 * 5/2011    Nishimura et al. ........ 137/260

FOREIGN PATENT DOCUMENTS

| CN | 201146212 Y | 11/2008 |
|----|-------------|---------|
| JP | 2001-210309 | 8/2001  |
| JP | 2003-036892 | 2/2003  |
| JP | 2005-026040 | 1/2005  |
| JP | 2005-353472 | 12/2005 |

* cited by examiner

*Primary Examiner* — Carlos Barcena
*Assistant Examiner* — Lilia V Nedialkova
(74) *Attorney, Agent, or Firm* — Nixon & Vanderhye, P.C.

(57) ABSTRACT

A secondary battery with improved life characteristics is provided. The secondary battery (lithium-ion secondary battery) has: an electrode assembly including positive electrodes and negative electrodes; and a package container for housing the electrode assembly along with non-aqueous electrolyte liquid. The package container includes a package can for housing the electrode assembly and a sealing plate sealing the opening of the package can. On the sealing plate, an elevated portion is formed that projects toward the electrode assembly and has, on the side opposite from the electrode assembly, a cavity portion for storing refill non-aqueous electrolyte liquid. The elevated portion has a hole for feeding the refill non-aqueous electrolyte liquid stored in the cavity portion toward the electrode assembly. The hole is sealed with a sealing stopper formed of a resin material letting the refill non-aqueous electrolyte liquid leak toward the electrode assembly.

12 Claims, 46 Drawing Sheets

SECONDARY BATTERY; SOLAR POWER GENERATION SYSTEM, WIND POWER GENERATION SYSTEM, AND VEHICLE PROVIDED THEREWITH; AND METHOD FOR FABRICATION OF A SECONDARY BATTERY

This nonprovisional application claims priority under 35 U.S.C. §119(a) on Patent Application No. 2010-030246 filed in Japan on Feb. 15, 2010 and Patent Application No. 2010-108602 filed in Japan on May 20, 2010, the entire contents of which are hereby incorporated by reference.

BACKGROUND OF THE INVENTION

1. Field of the Invention

The present invention relates to a secondary battery. The present invention also relates to a solar power generating system, a wind power generation system, and a vehicle provided with a secondary battery. The present invention further relates to a method for fabrication of a secondary battery.

2. Description of Related Art

In recent years, as consumer electronics, such as cellular phones, portable electronic appliances, personal digital assistants, are rapidly made compact, lightweight, and versatile, for use as their electric power sources there has been strong demand for the development of secondary batteries that are compact and lightweight, that offer high energy density, and that stand repeated charge-discharge cycles for a long period of time. As secondary batteries that meet those requirements, most promising are lithium-ion secondary batteries, which offer higher energy density than other secondary batteries, and a wide range of research is being conducted to develop lithium-ion secondary batteries with increasingly enhanced properties.

Moreover, in recent years, in view of environmental issues such as global warming, lithium-ion secondary batteries have been increasingly used for storage of electric power in solar power generation systems, wind power generation systems, and the like. Furthermore, as measures to reduce $CO_2$ emissions and cope with energy issues, there has been a high expectation for the spread of fuel-efficient, low-emission vehicles, such as hybrid electric vehicles (HEVs) and electric vehicles (EVs), and the development and commercialization of lithium-ion secondary batteries intended for use as vehicle-mounted batteries are underway.

As discussed above, the application of lithium-ion secondary batteries is no longer limited to portable appliances such as cellular phones but is now widening into the driving of large motors as in electric vehicles. As the demand for lithium-ion secondary batteries increases, they have come to be expected to offer high capacities and long lives of 500 cycles or more.

On the other hand, it is known that the capacity of a secondary battery whose capacity has diminished can be restored by refilling it with fresh electrolyte liquid. For example, JP-A-2001-210309 proposes a secondary battery provided with an refill tap which is removable to allow refilling of electrolyte liquid.

Inconveniently, however, with the secondary battery disclosed in JP-A-2001-210309, the battery capacity is restored by refilling of electrolyte liquid, but it is not that the life until the refilling is improved. Thus, each time the battery capacity diminishes, the battery needs to be refilled. Moreover, the refilling of electrolyte liquid needs to be conducted in a low-humidity environment, and thus requires special equipment such as a humidity-controlled glove box. This makes the refilling difficult, and thus makes it difficult to improve the life of the battery. In particular, a secondary battery used for storage of electric power or the like is bulky and troublesome to move, and this makes extremely difficult its maintenance such as refilling. Thus, with the conventional secondary battery disclosed in JP-A-2001-210309, it is practically impossible to improve the life of the battery.

SUMMARY OF THE INVENTION

The present invention has been devised to solve the inconveniences mentioned above, and it is an object of the invention to provide a secondary battery with improved life characteristic; a solar power generating system, a wind power generation system, and a vehicle provided with such a secondary battery; and a method for fabrication of a secondary battery.

To achieve the above object, according to a first aspect of the invention, a secondary battery includes: an electrode assembly including a positive electrode and a negative electrode disposed to face the positive electrode; a package container in which the electrode assembly is sealed along with electrolyte liquid; and an elevated portion provided on the package container to project toward the electrode assembly, the elevated portion having, on the side thereof opposite from the projecting side thereof, a cavity portion in which refill electrolyte liquid is stored. Here, the package container includes a housing container in which the electrode assembly is housed and a lid member (opening sealing member) which seals the housing container. Moreover, the elevated portion includes a leaking portion which lets the refill electrolyte liquid stored in the cavity portion leak toward the electrode assembly, and the elevated portion is formed on at least one of the lid member and the largest of the faces constituting the housing container.

In this secondary battery according to the first aspect, as described above, forming the elevated portion so that it projects toward the electrode assembly and has a cavity portion on its side opposite from the electrode assembly makes it possible to stole refill non-aqueous electrolyte liquid in the cavity portion. And forming the leaking portion in the elevated portion makes it possible to feed the electrolyte liquid stored in the cavity portion toward the electrode assembly through the leaking portion.

Here, the discharge capacity of a secondary battery whose discharge capacity has diminished through charge-discharge cycles can be restored by refilling it with fresh electrolyte. Thus, by feeding the electrolyte liquid stored in the cavity portion toward the electrode assembly through the leaking portion, it is possible to improve charge-discharge cycle characteristics.

Thus, according to the first aspect, with the construction described above, it is possible to refill the electrode assembly with electrolyte liquid easily, and thus to improve life characteristics of the battery easily.

On the other hand, making secondary batteries larger and flatter for electric power storage, car-mounted, and other applications tends to diminish the mechanical strength of the package container, making the batteries more liable to deformation.

According to the first aspect, however, as described above, the elevated portion is provided at least one of the sealing member and the largest of the faces constituting the housing container. Thus, the elevated portion reinforces the large-area part which tends to be low in mechanical strength. This helps improve the rigidity of the package container, and thus helps suppress deformation of the battery.

In this way, with the secondary battery according to the first aspect, owing to the construction described above, it is possible to increase the rigidity of the package container and in addition improve life characteristics.

In the secondary battery according to the first aspect described above, preferably, the lid member has a first plate member on which the elevated portion is formed and a second plate member which is fitted to the first plate member so as to cover the cavity portion. With this construction, it is possible to further improve the rigidity of the lid member, and thus it is possible, when the lid member is welded to the package container, to suppress development of strain in the lid member. In larger secondary batteries, the welding distances are longer, and this makes the lid member more likely to develop strain during welding. With the construction described above, however, it is possible to suppress development of strain in the lid member, and thus, even in larger batteries, it is possible to weld the lid member to the package container easily. This makes it possible to make secondary batteries larger easily, and thus to obtain large-capacity secondary batteries easily. Moreover, by suppressing stress in the lid member, it is possible to fix together the lid member and the package container firmly, and thus to improve reliability and safety.

In the secondary battery according to the first aspect described above, preferably, the leaking portion includes: a hole formed in the elevated portion; and a sealing member sealing the hole and letting the electrolyte liquid in the cavity portion leak toward the electrode assembly. With this construction, it is possible to feed the electrolyte liquid stored in the cavity portion toward the electrode assembly easily. This makes it possible to improve charge-discharge cycle characteristics easily. Moreover, by feeding the electrolyte liquid stored in the cavity portion toward the electrode assembly, it is possible to suppress drying out of the electrolyte liquid, and thus to easily suppress deterioration in battery performance due to drying out of electrolyte liquid.

In this case, preferably, the sealing member is formed of a resin material which becomes imbued (swells) with the electrolyte liquid to let, at the lapse of a predetermined time, the electrolyte liquid in the cavity portion leak toward the electrode assembly. With this construction, as the resin deteriorates by exposure to the electrolyte liquid, it lets the electrolyte liquid stored in the cavity portion leak toward the electrode assembly, and thus it is possible to refill the electrode assembly with electrolyte liquid easily. This makes it possible to feed the electrolyte liquid stored in the cavity portion toward the electrode assembly more easily.

In the construction described above in which the sealing member is formed of a resin material, it is preferable that the resin material contain at least one substance selected from the group consisting of styrene-butadiene rubber, ethylene propylene diene monomer, butyl rubber, silicone rubber, and rubber containing fluorine resin.

In the secondary battery according to the first aspect described above, it is preferable that the elevated portion be so shaped as to form a groove as seen from the side opposite from the electrode assembly. With this construction, it is possible to store electrolyte liquid inside the groove, and in addition it is possible to increase the rigidity of the package container easily.

In the secondary battery according to the first aspect described above, preferably, the face of the package container on which the elevated portion is formed has a substantially rectangular shape as seen in a plan view, and the elevated portion extends in the longer-side direction. With this construction, it is possible to increase the rigidity of the package container effectively.

Alternatively, in the secondary battery according to the first aspect described above, the face of the package container on which the elevated portion is formed has a substantially rectangular shape as seen in a plan view, and the elevated portion extends in a direction crossing the longer-side direction.

Alternatively, in the secondary battery according to the first aspect described above, the face of the package container on which the elevated portion is formed has a substantially rectangular shape having longer and shorter sides as seen in a plan view, and the elevated portion describes a substantially rhombic shape.

In this case, it is preferable that the elevated portion describing a substantially rhombic shape be so disposed that the diagonal lines thereof are parallel to the longer and shorter sides, respectively, of the package container.

In the secondary battery according to the first aspect described above, preferably, the elevated portion includes, as the leaking portion, one or more leaking portions. That is, in the elevated portion, only one leaking portion may be formed, or a plurality of leaking portions may be formed.

In the secondary battery according to the first aspect described above, preferably, the elevated portion may comprise a plurality of elevated portions, and the leaking portion is formed in each of those elevated portions. With this construction, it is possible to store refill non-aqueous electrolyte liquid in each of the cavity portions provided as a result of the elevated portions being formed, and in addition it is possible to feed the electrolyte liquid stored in each of the cavity portions toward the electrode assembly through the leaking portion provided in each of the elevated portions. Thus, it is possible to increase the amount of electrolyte liquid that can be stored in the cavity portion, and thus it is possible to feed electrolyte liquid toward the electrode assembly for a long period. This makes it possible to improve charge-discharge cycle characteristics more easily. Moreover, by forming the plurality of elevated portions, it is possible to increase the rigidity of the package container easily.

In the construction described above in which a plurality of elevated portions are provided, preferably, the face of the package container on which the elevated portions are formed has a substantially rectangular shape as seen in a plan view, and at least part of the elevated portions extend in the longer-side direction.

Alternatively, in the construction described above in which a plurality of elevated portions are provided, the face of the package container on which the elevated portions are formed has a substantially rectangular shape as seen in a plan view, and at least part of the elevated portions extend in a direction crossing the longer-side direction.

Alternatively, in the construction described above in which a plurality of elevated portions are provided, at least part of the elevated portions describe a substantially rhombic shape as seen in a plan view.

In the secondary battery according to the first aspect described above, preferably, the leaking portion is so located as not to make contact with the electrode assembly. With this construction, it is possible to suppress the inconvenience of the electrode assembly being damaged due to the leaking portion making contact with it. This makes it possible to suppress occurrence of internal short-circuiting due to damage to the electrode assembly. Consequently, it is possible to suppress lowering in charge-discharge cycle characteristics and in reliability resulting from occurrence of internal short-circuiting. If internal short-circuiting occurs during assembly of batteries, reduced yields may result. Thus, by suppressing occurrence of internal short-circuiting, it is also possible to achieve an effect of improving yields.

In the secondary battery according to the first aspect described above, preferably, the elevated portion has rounded or chamfered corners. With this construction, it is possible to effectively suppress damage to the electrode assembly resulting from the elevated portion making contact with it. This makes it possible to suppress occurrence of internal short-circuiting effectively.

In the secondary battery according to the first aspect described above, it is preferable that the cavity portion formed by the elevated portion have a width of 5 mm or more. With this construction, it is possible to make it easier to suppress damage to the electrode assembly resulting from the elevated portion making contact with it. Moreover, with this construction, it is possible to suppress the inconvenience of the cavity portion having too small a volume due to its having too small a width. This makes it possible to suppress the inconvenience of difficulty in restoring the discharge capacity due to the amount of electrolyte liquid stored in the cavity portion being too small.

In the secondary battery according to the first aspect described above, preferably, there is further provided a separator disposed between the positive and negative electrodes, and the positive electrode, the separator, and the negative electrode are stacked sequentially to give the electrode assembly a stacked structure. With this construction, it is possible to obtain a secondary battery of a stacked type with high rigidity, excellent life characteristics, and high reliability.

In the secondary battery according to the first aspect described above, it is preferable that the face of the housing container with the largest area serve as the bottom face thereof, and that the positive and negative electrodes be housed inside the housing container so as to face the bottom face. Using the face of the package container with the largest area as its bottom face and providing on the side opposite from the bottom face an opening through which to house the electrodes in this way makes it possible to house large-area electrodes easily. This makes it possible to fabricate large-capacity secondary batteries easily. In a case where the package container is formed as a metal can, there is a limit to the deep drawing of the can, and there are restrictions on materials that can be used. In addition, a plurality of expensive dies are needed. In these respects also, it is advantageous to fabricate a secondary battery by use of a package container having a large-area bottom face as described above. That is, with the construction described above, it is possible to improve the flexibility in the choice of the material and the workability during fabrication.

According to a second aspect of the invention, a solar power generating system includes a secondary battery according to the first aspect described above. Using a secondary battery according to the first aspect described above for the purpose of storing electric power in a solar power generating system in this way makes it possible to prolong the life of electric power storage equipment, and to reduce the cost of the system as a whole.

According to a third aspect of the invention, a wind power generating system includes a secondary battery according to the first aspect described above. Using a secondary battery according to the first aspect described above for the purpose of storing electric power in a wind power generating system in this way makes it possible to prolong the life of electric power storage equipment, and to reduce the cost of the system as a whole.

According to a fourth aspect of the invention, a vehicle includes a secondary battery according to the first aspect described above.

According to a fifth aspect of the invention, a secondary battery includes: a battery portion having a positive electrode, a negative electrode, and a separator and filled with non-aqueous electrolyte liquid; a non-aqueous electrolyte liquid storage portion in which refill non-aqueous electrolyte liquid is stored; a package member in which the battery portion and the non-aqueous electrolyte liquid storage portion are housed; a partition wall disposed inside the package member, between the battery portion and the non-aqueous electrolyte liquid storage portion; and a seeping portion (leaking portion) provided on the partition wall and letting the refill non-aqueous electrolyte liquid seep out from the non-aqueous electrolyte liquid storage portion into the battery portion.

In this secondary battery according to the fifth aspect, as described above, owing to the provision of the non-aqueous electrolyte liquid storage portion for storing refill non-aqueous electrolyte liquid, it is possible to refill, safely and easily, the battery portion with the refill non-aqueous electrolyte liquid stored in the non-aqueous electrolyte liquid storage portion through the seeping portion (leaking portion). This makes it possible to improve the life characteristics of the battery.

In the secondary battery according to the fifth aspect described above, it is preferable that the non-aqueous electrolyte liquid storage portion comprise a tank in which the refill non-aqueous electrolyte liquid is stored. With this construction, it is possible to make the fabrication procedure of the secondary battery simple, and in addition, by storing refill non-aqueous electrolyte liquid inside the package container of the secondary battery, to refill the battery portion with the refill non-aqueous electrolyte liquid safely and easily.

In the secondary battery according to the fifth aspect described above, preferably, the seeping portion includes: an opening formed in the partition wall and having an internal thread on the inside thereof; and an external thread meshing with the internal thread. With this construction, it is possible to let the refill non-aqueous electrolyte liquid seep out through the gap between the internal and external threads.

In this case, it is preferable that the external thread be formed of resin, or that the seeping portion have an O-ring or a seal formed of resin disposed around the external thread. A resin screw, or a resin O-ring or seal, as the resin deteriorates with time, lets the refill non-aqueous electrolyte liquid seep out into the battery portion.

In the secondary battery according to the fifth aspect described above, preferably, when the battery is placed for use, the refill non-aqueous electrolyte liquid is located at the top and the battery portion is located at the bottom. With this construction, it is possible to let the refill non-aqueous electrolyte liquid seep out into the battery portion easily.

According to a sixth aspect of the invention, an electronic or electric device includes a secondary battery according to the fifth aspect described above. That is, a secondary battery according to the fifth aspect described above can be suitably used as an electric power source for an electronic or electric device. For example, such batteries can be used as electric power storage batteries in solar and wind power generating systems; they can also be used as electric power sources in lap-top personal commuters, electrically driven tools, motor-assisted bicycles, EVs, HEVs, digital cameras, cellular phones, and video camcorders.

According to a seventh aspect of the invention, a method for fabrication of a secondary battery includes: a step of welding a non-aqueous electrolyte liquid container having at least one opening to a lid portion; a step of filling the non-aqueous electrolyte liquid container with refill non-aqueous electrolyte liquid; a step of joining the lid portion having the opening sealed with a sealing stopper to a package member in which an electric power storage element having a negative electrode, a positive electrode, and a separator is housed; a step of filling non-aqueous electrolyte liquid through a filling hole in the lid portion or the package member; and a step of sealing the filling hole to achieve air-tightness. Through these steps, it is possible to easily fabricate a secondary battery that can be used maintenance-free for a long period.

According to an eighth aspect of the invention, a method for fabrication of a secondary battery includes: a step of housing in a package member an electric power storage element having negative and positive electrodes stacked or wound with a separator therebetween; a step of fitting inside the package member a partition wall plate having an opening previously formed therein or a partition wall plate having a cut part serving as an opening; a step of filling non-aqueous electrolyte liquid through the opening; a step of sealing the opening with a sealing stopper, joining the lid portion, and filling refill non-aqueous electrolyte liquid through a filling hole in the lid portion or the package member; and a step of sealing the filling hole in the lid portion or the package member. By this fabrication method also, it is possible to easily fabricate a secondary battery that can be used maintenance-free for a long period.

As described above, according to the present invention, it is possible to easily obtain a secondary battery with improved life characteristic; a solar power generating system, a wind power generation system, and a vehicle provided with such a secondary battery; and a method for fabrication of a secondary battery.

Moreover, according to the invention, it is possible to realize a secondary battery that achieves feeding of refill non-aqueous electrolyte liquid to the battery portion with a safe, inexpensive, and simple construction and that can thus be used maintenance-free for a long period. This makes it possible to obtain a secondary battery whose discharge capacity diminishes less through repeated charge-discharge cycles, that is, a secondary battery with a long charge-discharge cycle life.

DETAILED DESCRIPTION OF PREFERRED EMBODIMENTS

Hereinafter, embodiments of the present invention will be described in detail with reference to the accompanying drawings. The embodiments presented below deal with cases in which the invention is applied to a lithium-ion secondary battery of a stacked type as an example of a secondary battery.

Embodiment 1

Figure 1:
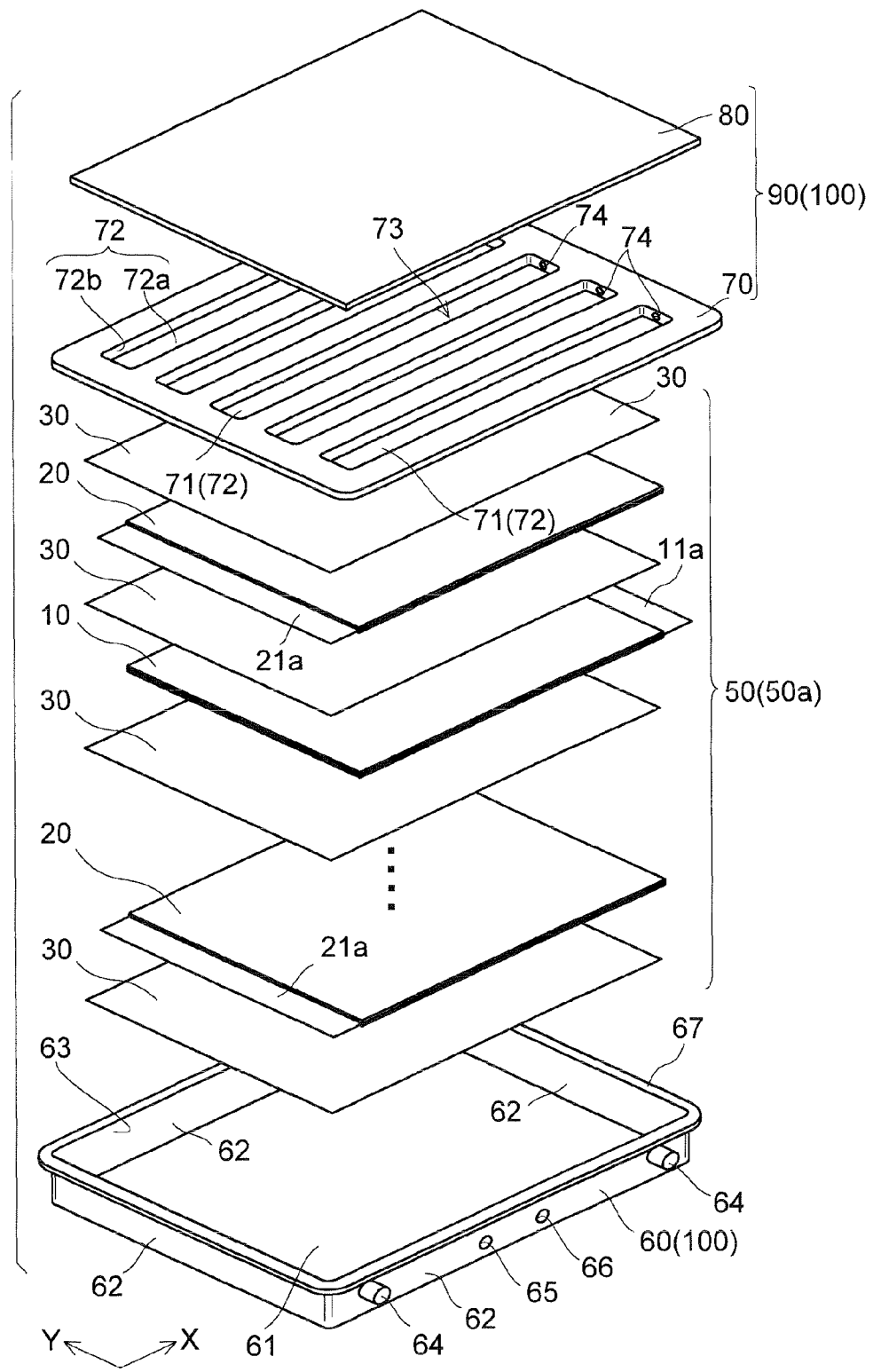
FIG. 1 is an exploded perspective view of a lithium-ion secondary battery according to Embodiment 1 of the invention.
Figure 2:
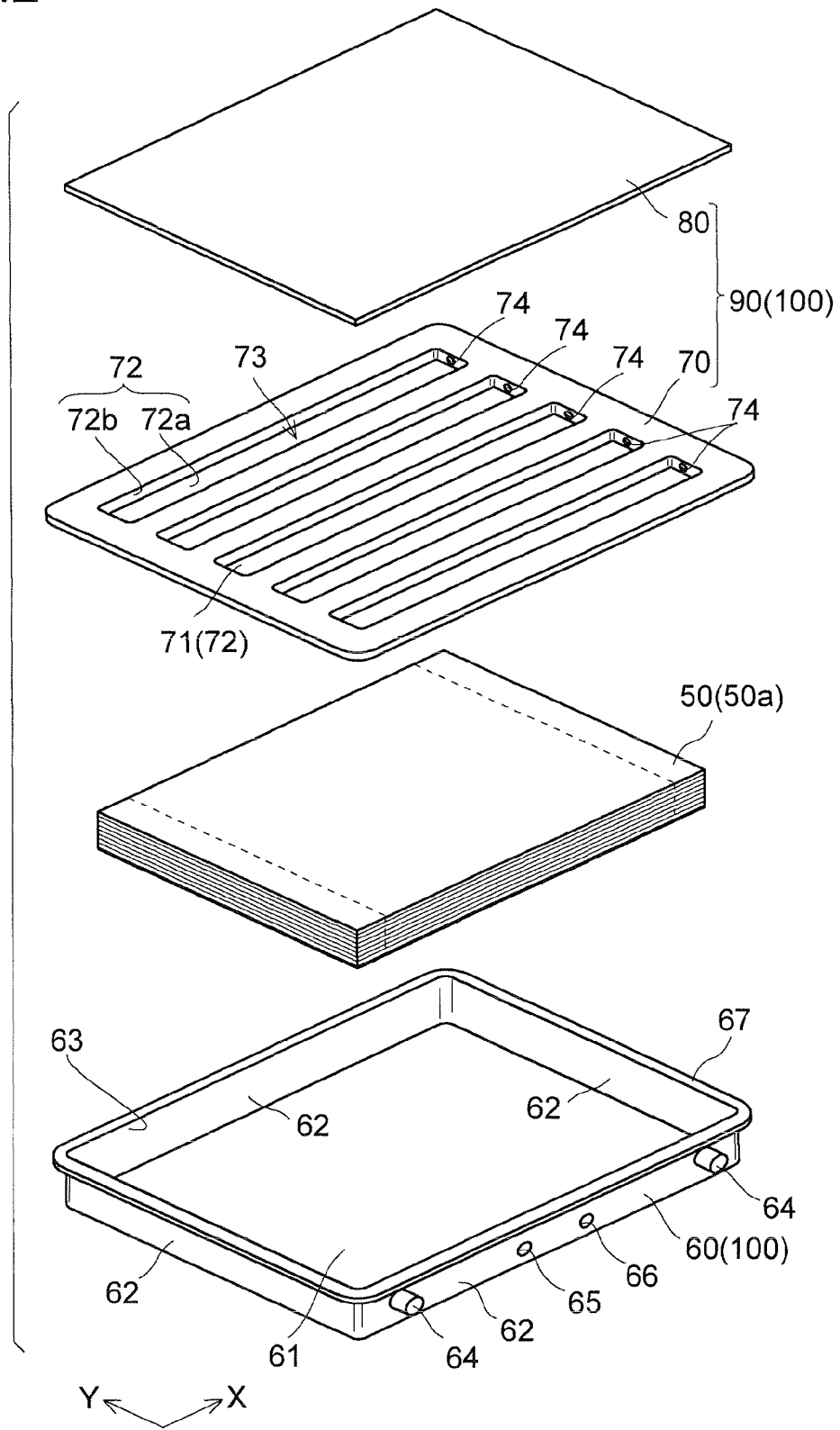
FIG. 2 is an exploded perspective view of the lithium-ion secondary battery according to Embodiment 1 of the invention.
Figure 3:
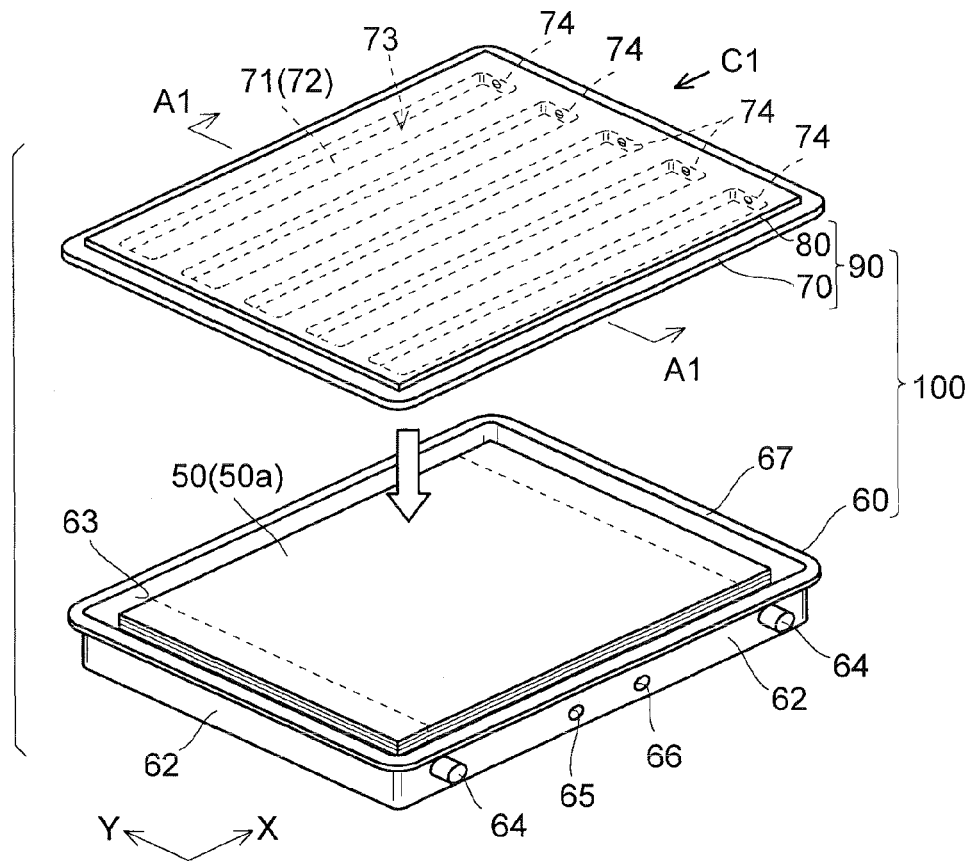
FIG. 3 is an exploded perspective view of the lithium-ion secondary battery according to Embodiment 1 of the invention.
Figure 4:
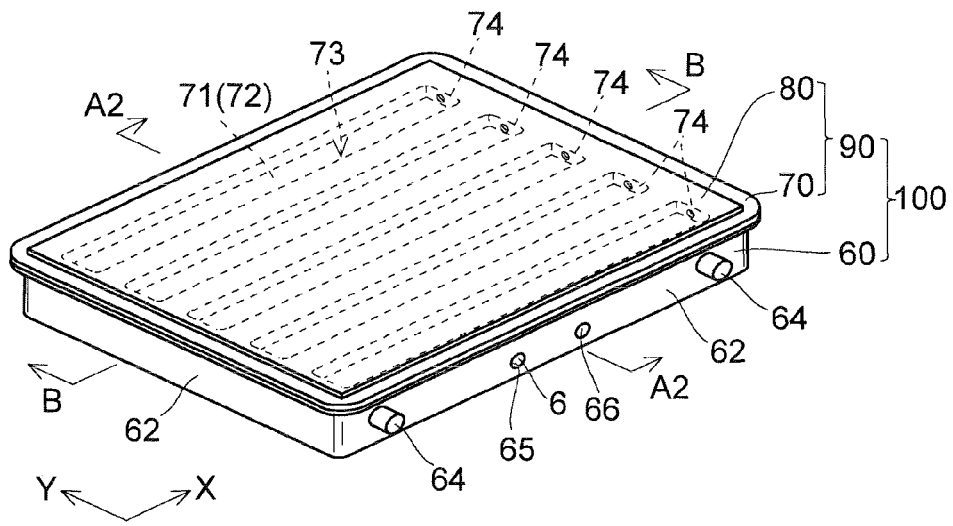
FIG. 4 is an overall perspective view of the lithium-ion secondary battery according to Embodiment 1 of the invention.
Figure 5:
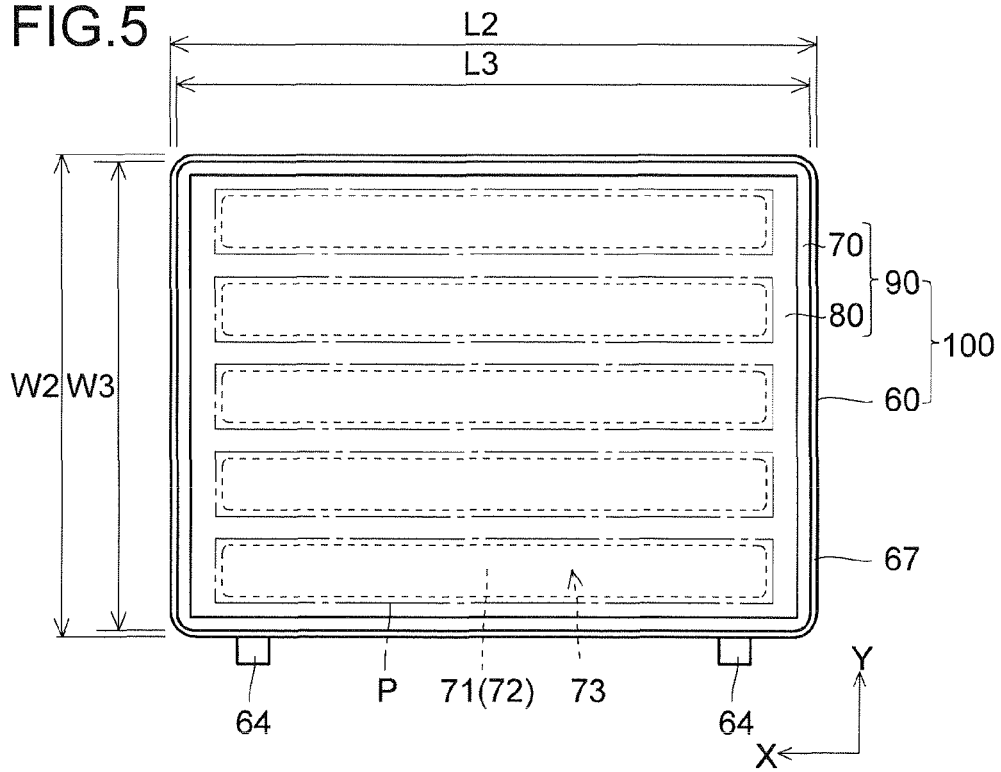
FIG. 5 is a plan view of the lithium-ion secondary battery according to Embodiment 1 of the invention.
Figure 6:
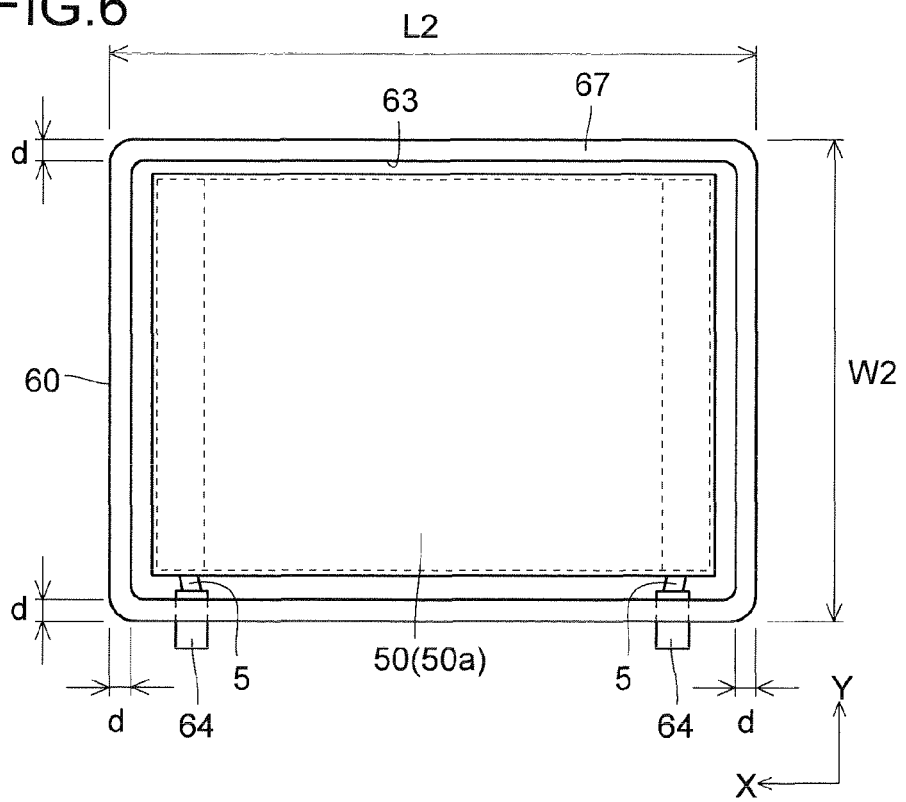
FIG. 6 is a plan view of the lithium-ion secondary battery according to Embodiment 1 of the invention (with a lid plate omitted)

FIGS. 1 to 3 are exploded perspective views of a lithium-ion secondary battery according to a first embodiment (Embodiment 1) of the invention. FIG. 4 is an overall perspective view of the lithium-ion secondary battery according to Embodiment 1 of the invention. FIGS. 5 and 6 are plan views of the lithium-ion secondary battery according to Embodiment 1 of the invention. FIGS. 7 to 27 are diagrams in illustration of the lithium-ion secondary battery according to Embodiment 1 of the invention. It should be noted that FIG. 6 shows the lithium-ion secondary battery without the lid plate which it ordinarily has, in order to show the inside of the battery. First, with reference to FIGS. 1 to 27, the lithium-ion secondary battery according to Embodiment 1 will be described.

As shown in FIGS. 1 to 4, the lithium-ion secondary battery according Embodiment 1 is a large secondary battery having a flat, rectangular shape (see FIG. 4), and includes an electrode assembly 50 (see FIGS. 1 and 2), which in turn includes a positive (cathode) electrode 10 (see FIG. 1) and a negative (anode) electrode 20 (see FIG. 1), and a metal package container 100, in which the electrode assembly 50 is sealed along with a non-aqueous electrolyte liquid.

Figure 7:
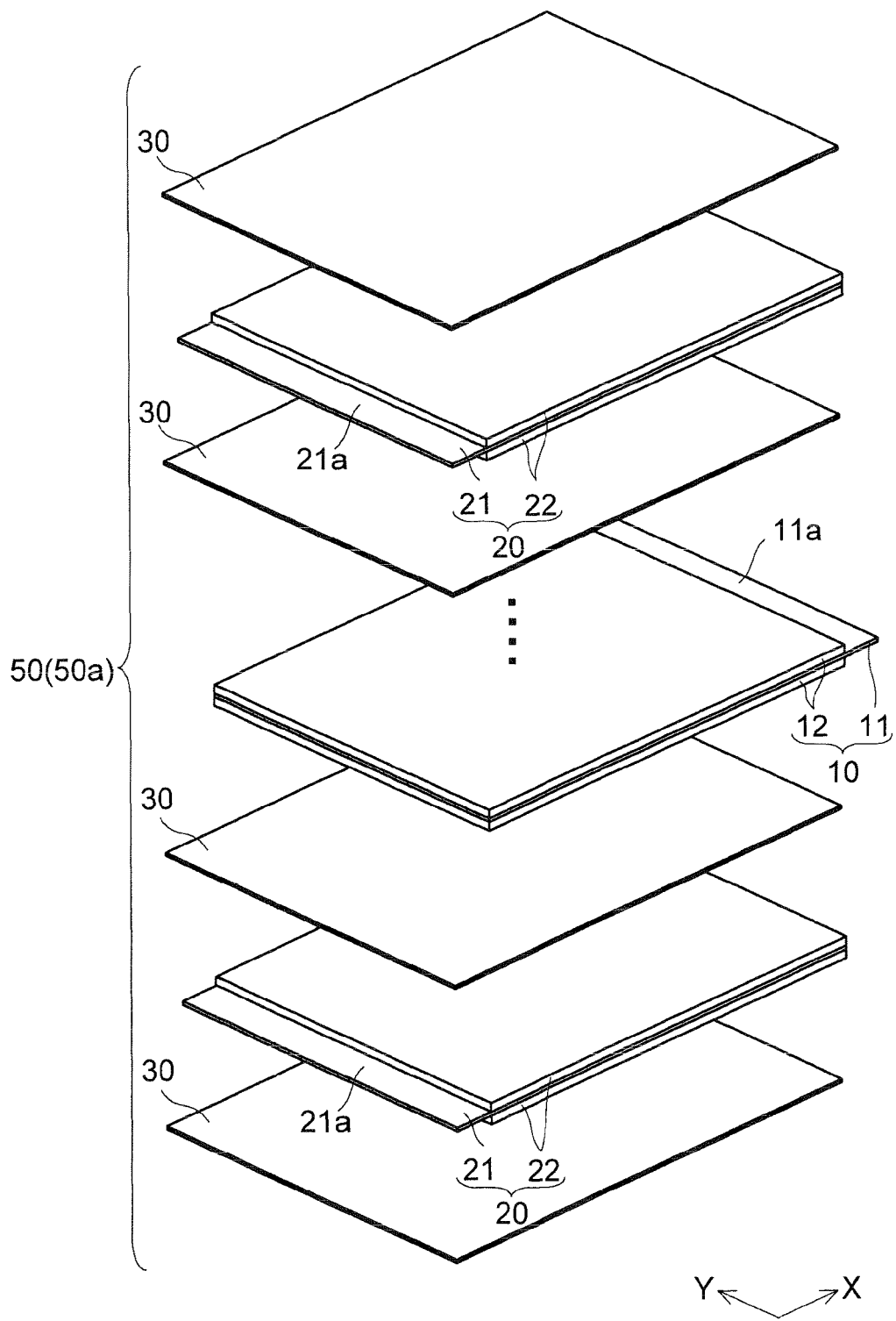
FIG. 7 is a perspective view showing the structure of an electrode assembly in the lithium-ion secondary battery according to Embodiment 1 of the invention.

As shown in FIGS. 1 and 7, the electrode assembly 50 further includes a separator 30 for suppressing short-circuiting between the positive and negative electrodes 10 and 20. The positive and negative electrodes 10 and 20 are arranged so as to face each other across the separator 30. The electrode assembly 50 includes a plurality of positive electrodes 10, a plurality of negative electrodes 20, and a plurality of separators 30. The positive electrodes 10, the separators 30, and the negative electrodes 20 are stacked sequentially to form a stacked structure (stacked member 50a). The positive and negative electrodes 10 and 20 are stacked alternately, one of each on one of the other. The electrode assembly 50 is so composed that, between every two adjacent negative electrodes 20, one positive electrode 10 is located.

Specifically, the electrode assembly 50 is composed of, for example, twenty-four (24) positive electrodes 10, twenty-five (25) negative electrodes 20, and forty-eight (48) separators 30, with the positive and negative electrodes 10 and 20 stacked alternately with the separators 30 interposed between them. Another separator 30 is arranged on the outermost sides of the electrode assembly 50 (on the outer sides of the outermost negative electrodes 20) for insulation from the package container 100.

Figure 8:
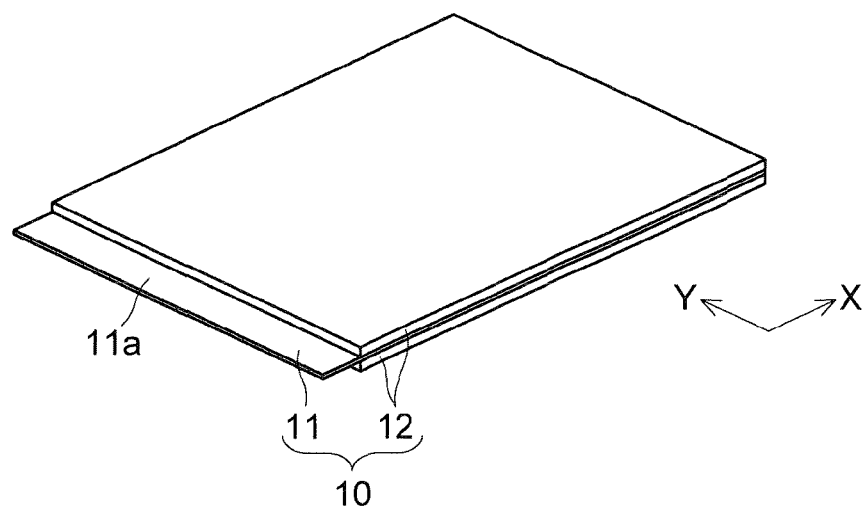
FIG. 8 is a perspective view showing the structure of a positive electrode in the lithium-ion secondary battery according to Embodiment 1 of the invention.
Figure 9:
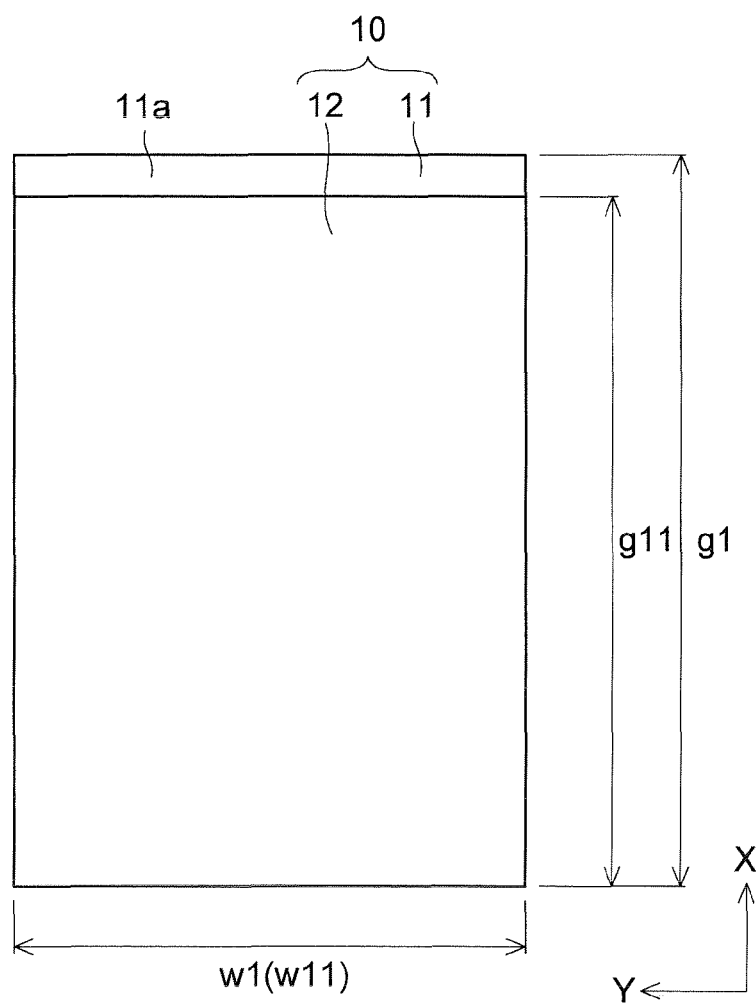
FIG. 9 is a plan view showing the structure of the positive electrode in the lithium-ion secondary battery according to Embodiment 1 of the invention.

As shown in FIGS. 8 and 9, each positive electrode 10 in the electrode assembly 50 is composed of a positive electrode charge collector 11 having a positive electrode active material layer 12 laid on each face.

The positive electrode charge collector 11 serves to collect electric charge from the positive electrode active material layer 12. The positive electrode charge collector 11 is formed of, for example, a foil of metal such as aluminum, titanium, stainless steel, nickel, or iron, or a foil of an alloy of any of these metals, and has a thickness of about 1 μm to about 500 μm (for example, about 20 μm). Preferably, the positive electrode charge collector 11 is formed of a foil of aluminum pr a foil of an alloy of aluminum, and is given a thickness of 20 μm or less.

The positive electrode charge collector 11 may be formed of, other than the materials mentioned above, metal such as aluminum or copper having its surface treated with carbon, nickel, titanium, silver, or the like for increased electrical conductivity and resistance to oxidation. These materials may have their surface oxidation-treated. Also usable are a copper-aluminum clad material, a stainless steel-aluminum clad material, or a plated material that is a combination of any of these metals. A charge collector may also be used that has foils of two or more metals bonded together. The positive electrode charge collector 11 may be other than foil-shaped; it may instead be film-shaped, sheet-shaped, or net-shaped; punched, or expanded; shaped like a lath member, a porous member, or a foamed member; or shaped like a member formed of clusters of fibers.

The positive electrode active material layer 12 is so formed as to contain a positive electrode active material that can occlude and release lithium ions. Examples of positive electrode active materials include oxides containing lithium; specifically, they include $LiCoO_2$, $LiFeO_2$, $LiMnO_2$, $LiMn_2O_4$, and any compound obtained by substituting part of the transition metal in any of these oxides with another metal element. Among these, preferable as the positive electrode active material are those which allow 80% or more of the lithium contained in the positive electrode to be used in the cell reaction under normal use. This makes it possible to enhance the safety of the secondary battery against accidents such as overcharging. Examples of such positive electrode active materials include compounds having a spinel structure, such as $LiMn_2O_4$; and compounds having an olivine structure represented by the formula $Li_xMPO_4$ (where M represents one or more elements selected from the group consisting of Co, Ni, Mn, and Fe). Among these, positive electrode active materials containing at least one of Mn and Fe are preferable from the viewpoint of cost. From the viewpoint of safety and charge voltage, it is preferable to use $LiFePO_4$. In $LiFePO_4$, all oxygen (O) atoms are bonded to phosphorus atoms by covalent bond, and thus oxygen is unlikely to be released on a rise in temperature; this makes $LiFePO_4$ excellent in safety.

Preferably, the positive electrode active material layer 12 is given a thickness of about 20 μm to about 2 mm, and further preferably from about 50 μm to about 1 mm.

The positive electrode active material layer 12 has at least to contain a positive electrode active material and there is no other particular restriction on its composition. For example, the positive electrode active material layer 12 may further include, in addition to a positive electrode active material, any other material such as a conductive agent (electrical conductivity enhancer), a thickening agent (viscosity modifier), and a binding agent (binder).

Any conductive agent may be used so long as it is an electron conducting material that does not adversely affect the performance of the positive electrode 10 in the battery. Examples include carbon materials such as carbon black, acetylene black, Ketjen black, graphite (natural and artificial), and carbon fiber; and conductive metal oxides. Among these, preferable as a conductive agent from the viewpoints of electron conduction and ease of application are carbon black and acetylene black.

Examples of thickening agents include polyethylene glycols, celluloses, polyacrylamides, poly-N-vinylamides, and poly-N-vinylpyrrolidones. Among these, preferable as a thickening agent are polyethylene glycols, and celluloses such as carboxymethyl cellulose (CMC), CMC being particularly preferable.

A binding agent serves to bind active material particles and conductive agent particles, and examples include fluorine polymers such as polyvinylidene fluoride (PVdF), polyvinyl pyridine, and polytetrafluoroethylene; polyolefin polymers such as polyethylene and polypropylene; and styrene-butadiene rubber.

Examples of solvents in which a positive electrode active material, a conductive agent, a binding agent, etc. are dispersed include organic solvents such as N-methyl-2-pyrrolidone, dimethylformamide, dimethylacetamide, methylethyl ketone, cyclohexanone, methyl acetate, methyl acrylate, diethyltriamine, N,N-dimethylaminopropylamine, ethylene oxide, and tetrahydrofuran.

The positive electrode 10 is formed, for example, in the following manner. A positive electrode active material, a conductive agent, a thickening agent, and a binding agent are blended, and a solvent is added to the blend to prepare a positive electrode composite agent in the form of paste; the paste is applied to the surface of the positive electrode charge collector 11 and is dried; as necessary, the product is compressed for increased electrode density.

As shown in FIG. 9, the positive electrode 10 has a rectangular shape as seen in a plan view. Specifically, in Embodiment 1, the positive electrode 10 has a Y-direction width w1 of, for example, about 140 mm, and has an X-direction length g1 of, for example, about 250 mm. The region over which the positive electrode active material layer 12 is applied (the formation region) has a Y-direction width w11 of, for example, about 140 mm, which is equal to the width w1 of the positive electrode 10, and has an X-direction length g11 of, for example, about 235 mm.

The positive electrode 10 has, at one end in the X direction, a charge collector-exposed portion 11a where the positive electrode active material layer 12 is not formed and the surface of the positive electrode charge collector 11 is exposed. To the charge collector-exposed portion 11a is electrically connected a charge collection lead 5 (described later; see FIG. 6) for extraction of electric current. The four edges of the positive electrode active material layer 12 align with the edges of the positive electrode 10 except one of the two edges running in the X direction (the edge at which the charge collector-exposed portion 11a is located).

Figure 10:
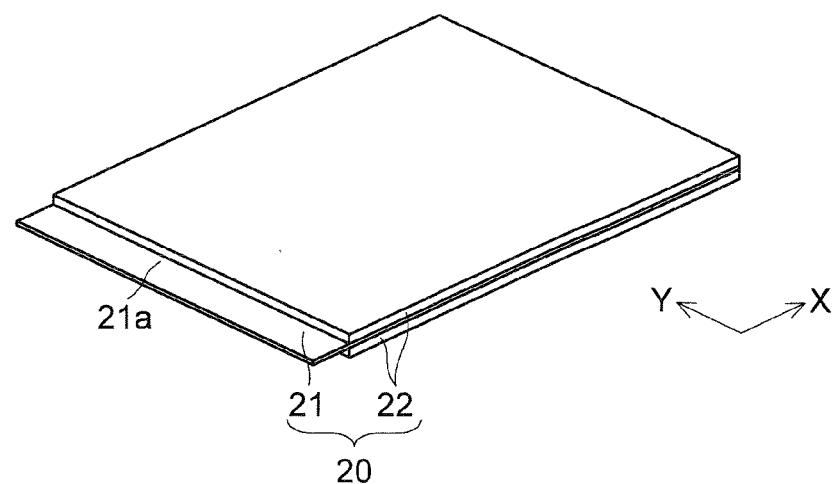
FIG. 10 is a perspective view showing the structure of a negative electrode in the lithium-ion secondary battery according to Embodiment 1 of the invention.
Figure 11:
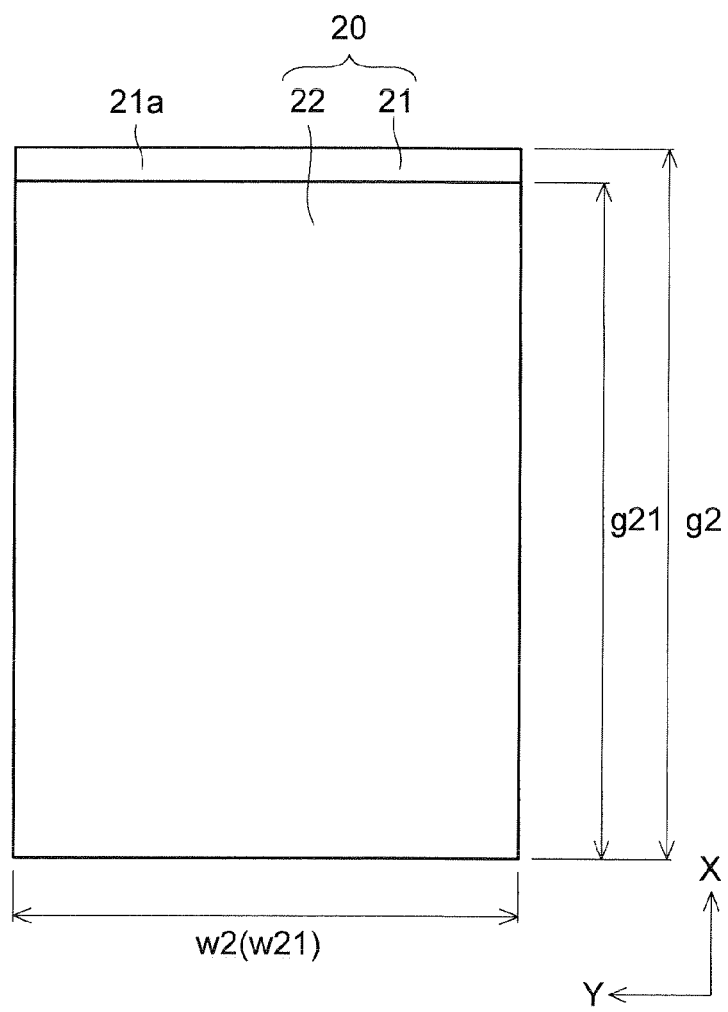
FIG. 11 is a plan view showing the structure of the negative electrode in the lithium-ion secondary battery according to Embodiment 1 of the invention.

As shown in FIGS. 10 and 11, each negative electrodes 20 in the electrode assembly 50 is composed of a negative electrode charge collector 21 coated with a negative electrode active material layer 22 on each face.

The negative electrode charge collector 21 serves to collect electric charge from the negative electrode active material layer 22. The negative electrode charge collector 21 is formed of, for example, a foil of metal such as copper, nickel, stainless steel, iron, or a plated nickel layer, or a foil of an alloy of any of these metals, and has a thickness of about 1 μm to about 100 μm (for example, about 16 μm). Preferably, the negative electrode charge collector 21 is formed of a foil of copper or stainless steel, and is given a thickness of 4 μm or more but 20 μm or less.

The negative electrode charge collector 21 may be other than foil-shaped; it may instead be film-shaped, sheet-shaped, or net-shaped; punched, or expanded; shaped like a lath member, a porous member, or a foamed member; or shaped like a member formed of clusters of fiber.

The negative electrode active material layer 22 is so formed as to contain a negative electrode active material that can occlude and release lithium ions. Examples of negative electrode active materials include substances containing lithium and substances that can occlude and release lithium. To build a high energy density battery, it is preferable to use a material of which the potentials at which lithium is occluded and released are close to the potentials at which metal lithium deposits and dissolves. Typical examples of such materials include natural and artificial graphite in the form of particles (that is, in the form of scales, lumps, fibers, whiskers, spheres, crushed particles, and the like). Also usable as a negative electrode active material is artificial graphite obtained by graphitizing mesocarbon microbeads, mesophase pitch powder, isotropic pitch powder, or the like. It is also possible to use graphite particles whose surface is coated with amorphous carbon. Also usable are lithium transition metal oxides, lithium transition metal nitrides, transition metal oxides, silicon oxides, and the like. Examples of lithium transition metal oxides include lithium titanates as exemplified by $Li_4Ti_5O_{12}$, whose use reduces degradation of the negative electrode 20 and thus helps prolong the life of the battery.

Preferably, the negative electrode active material layer 22 is given a thickness of about 20 μm to about 2 mm, and further preferably from about 50 μm to about 1 mm.

The negative electrode active material layer 22 has at least to contain a negative electrode active material and there is no other particular restriction on its composition. For example, the negative electrode active material layer 22 may further include, in addition to a negative electrode active material, any other material such as a conductive agent (electrical conductivity enhancer), a thickening agent (viscosity modifier), and a binding agent (binder). Usable as these other materials are the same as those for (usable in) the positive electrode active material layer 12.

The negative electrode 20 is formed, for example, in the following manner. A negative electrode active material, a conductive agent, a thickening agent, and a binding agent are blended, and a solvent is added to the blend to prepare a negative electrode composite agent in the form of paste; the paste is applied to the surface of the negative electrode charge collector 21 and is dried; as necessary, the product is compressed for increased electrode density.

As shown in FIG. 11, the negative electrode 20 has a rectangular shape as seen in a plan view, and is formed to have a larger planar area than the positive electrode 10 (see FIGS. 8 and 9). Specifically, in Embodiment 1, the negative electrode 20 has a Y-direction width w2 of, for example, about 142 mm, which is larger than the width w1 (see FIG. 9) of the positive electrode 10, and has an X-direction length g2 of, for example, about 251 mm, which is larger than the length g1 (see FIG. 9) of the positive electrode 10. The region over which the negative electrode active material layer 22 is applied (the formation region) has a Y-direction width w21 of, for example, about 142 mm, which is equal to the width w2 of the negative electrode 20, and has an X-direction length g21 of, for example, about 237 mm.

Like the positive electrode 10, the negative electrode 20 has, at one end in the X direction, a charge collector-exposed portion 21a where the negative electrode active material layer 22 is not formed and the surface of the negative electrode charge collector 21 is exposed. To the charge collector-exposed portion 21a is electrically connected a charge collection lead 5 (described later; see FIG. 6) for extraction of electric current. The four edges of the negative electrode active material layer 22 align with the edges of the negative electrode 20 except one of the two edges running in the X direction (the edge at which the charge collector-exposed portion 21a is located).

The separators 30 in the electrode assembly 50 are expected to provide sufficient mechanical strength and hold as much electrolyte liquid as possible. From this viewpoint, examples of preferable materials include microporous film and nonwoven fabric of materials such as polyethylene, polypropylene, and ethylene-propylene copolymer with a thickness of 10 μm to 50 μm and with a porosity (void percentage) of 30% to 70%.

Other examples of the material for the separators 30 include microporous film and the like formed of high polymers such as polyvinylidene fluoride, polyvinylidene chloride, polyacrylnitrile, polyacrylamide, polytetrafluoroethylene, polysulfone, polyethersulfone, polycarbonate, polyamide, polyimide, polyether (polyethylene oxide, polypropylene oxide, cellulose (carboxymethyl cellulose, hydroxypropyl cellulose), poly(meth)acrylic acid, and poly(meth)acrylic acid esters. A multilayer film may be used that has two or more such microporous films laid together.

Preferably, each separator 30 is given a thickness of 5 μm to 100 μm, and further preferably 10 μm to 30 μm. Preferably, the separator 30 is given a porosity of 30% to 90%, and further preferably 40% to 80%. With the thickness of the separator 30 less than 5 μm, it has insufficient mechanical strength, causing internal short-circuiting of the battery. With the thickness of the separator 30 more than 100 μm, the distance between the positive and negative electrodes is so great that the battery has a high internal resistance. With a porosity less than 30%, the amount of non-aqueous electrolyte liquid contained is so small that the battery has a high internal resistance. With a porosity more than 90%, the positive and negative electrodes 10 and 20 make physical contact with each other, causing internal short-circuiting of the battery.

Figure 12:
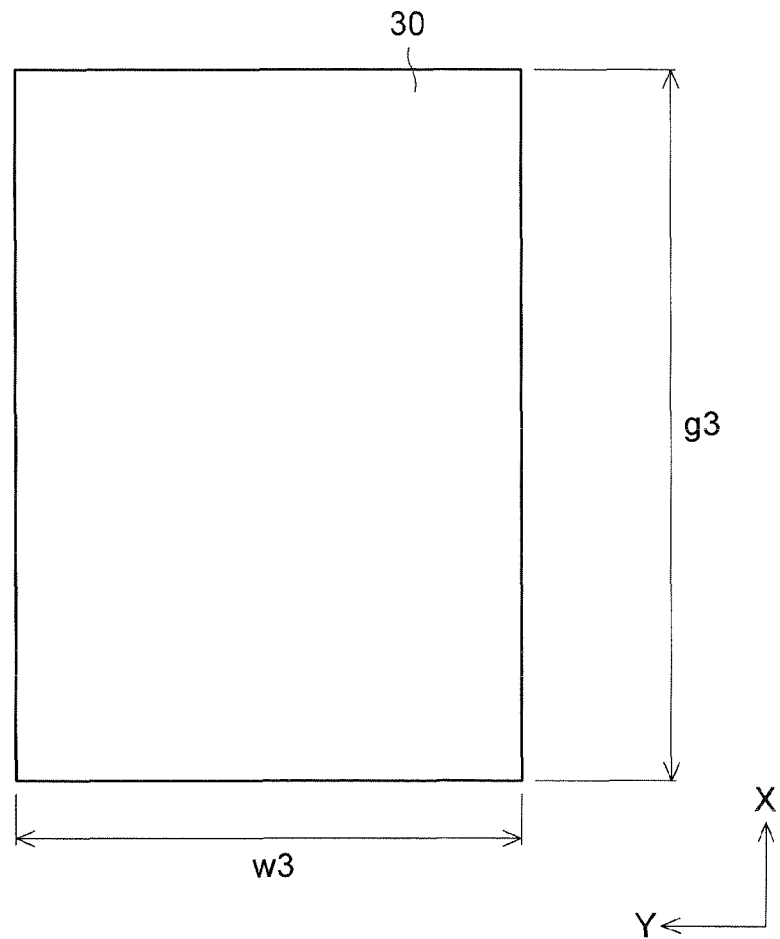
FIG. 12 is a plan view of a separator in the lithium-ion secondary battery according to Embodiment 1 of the invention.

The separator 30 is so shaped as to be larger than the region over which the positive electrode active material layer 12 is applied (the formation region) and larger than the region over which the positive electrode active material layer 22 is applied (the formation region). Specifically, as shown in FIG. 12, the separator 30 is formed to have a rectangular shape, and has a Y-direction width w3 of, for example, about 145 mm and an X-direction length g3 of, for example, about 240 mm.

As shown in FIGS. 1 and 7, the positive and negative electrodes 10 and 20 are arranged so that the charge collector-exposed portion 11a of the positive electrodes 10 and the charge collector-exposed portion 21a of the negative electrodes 20 are located at opposite sides, and are stacked with the separators 30 interposed between the positive and negative electrodes. In Embodiment 1, the formation region of the positive electrode active material layer 12 (the positive electrode active material region) is covered by the formation region of the negative electrode active material layer 22 (the negative electrode active material region), and this helps widen the tolerance range for stacking errors.

There is no particular restriction on the non-aqueous electrolyte liquid sealed inside the package container 100 along with the electrode assembly 50. Examples of usable solvents include esters such as ethylene carbonate (EC), propylene carbonate, butylene carbonate, diethyl carbonate (DEC), dimethyl carbonate, methyl ethyl carbonate, and gamma-butyrolactone; ethers such as tetrahydrofuran, 2-methyltetrahydrofuran, dioxane, dioxolane, diethylether, dimethoxymethane, diethoxyethane, and methoxyethoxyethane; and polar solvents such as dimethyl sulfoxide, sulfolane, methyl sulfolane, acetonitrile, methyl formate, and methyl acetate. Any of these solvents may be used singly or as a mixed solvent of two or more of them.

The non-aqueous electrolyte liquid may contain an electrolyte supporting salt. Examples of electrolyte supporting salts include lithium salts such as $LiClO_4$, $LiBF_4$ (lithium tetrafluoroborate), $LiPF_6$ (lithium hexafluorophosphate), $LiCF_3SO_3$ (lithium trifluoromethanesulfonate), LiF (lithium fluoride), LiCl (lithium chloride), LiBr (lithium bromide), LiI (lithium iodide), and $LiAlCl_4$ (lithium tetrachloroaluminate). These may be used singly or as a mixture of two or more of them.

There is no particular restriction on the concentration of an electrolyte supporting salt, a preferable concentration being from 0.5 mol/L (mol per liter) to 2.5 mol/L, and further preferably from 1.0 mol/L to 2.2 mol/L. With the concentration of an electrolyte supporting salt less than 0.5 mol/L, the concentration of charge carriers in the non-aqueous electrolyte liquid may be so low that the non-aqueous electrolyte liquid has a high resistance. With the concentration of an electrolyte supporting salt more than 2.5 mol/L, the degree of dissociation of the salt itself may be so low that the concentration of carriers in the non-aqueous electrolyte liquid is kept from rising.

As shown in FIGS. 4 to 6, the package container 100, in which the electrode assembly 50 is sealed, is a large, flat, rectangular container, and is composed of a package can 60 in which the electrode assembly 50 etc. are housed and a lid plate (opening sealing plate) 90 which seals the opening of the package can 60. To the package can 60 having the electrode assembly 50 housed in it, the lid plate 90 is fitted by laser welding. The package can 60 is an example of a "housing container" according to the invention, and the lid plate 90 is an example of an "lid member" according to the invention.

Figure 13:
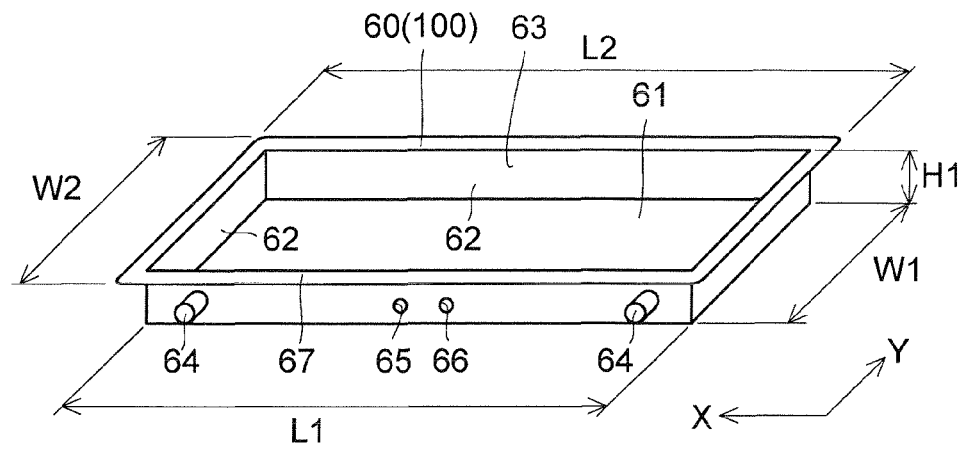
FIG. 13 is a perspective view of a package container in the lithium-ion secondary battery according to Embodiment 1 of the invention.

The package can 60 is formed, for example, by subjecting a metal plate to deep drawing, and has a bottom face 61 and a side wall 62. Moreover, as shown in FIGS. 6 and 13, the package can 60 has, at one end (on the side opposite from the bottom face 61), an opening 63 through which to house the electrode assembly 50 (see FIG. 6). The package can 60 is formed as a box-shaped can, and its face with the largest area serves as the bottom face 61.

Moreover, the package can 60 is so sized that the electrode assembly 50 can be housed in it with its electrode faces facing the bottom face 61. Specifically, the package can 60 is formed to have a substantially rectangular shape as seen in a plan view. The package can 60 has, in its shorter-side direction, a length W1 (its length W1 in the Y direction in FIG. 13) of, for example, about 150 mm and, in its longer-side direction, a length L1 (its length L1 in the X direction in FIG. 13) of, for example, about 300 mm. The package can 60 has a height H1 (see FIG. 13) of, for example, about 40 mm (the depth being about 39 mm).

As shown in FIGS. 5, 6, and 13, the package can 60 has two electrode terminals 64 (positive and negative terminals) formed in a side wall 62 at one side in the Y direction (at one longer side). Of the electrode terminals 64, one is arranged toward one end of the side wall 62 in the X direction and the other is arranged toward the other end of the side wall 62 in the X direction. Moreover, in the side wall 62 on which the electrode terminals 64 are formed, a filling hole 65 through which to inject the non-aqueous electrolyte liquid is formed. The filling hole 65 is formed to have, for example, a diameter of 2 mm. Near the filling hole 65, a safety valve 66 for liberating the internal pressure of the battery is formed.

Furthermore, around the rim of the opening 63 of the package can 60, a flange 67 is provided, and to this flange 67, the lid plate 90 is fixed by welding. The flange 67 is given a width d (see FIG. 6) of, for example, about 5 mm. Thus, with the flange 67 included, the package can 60 has, in the shorter-side direction (Y direction), a length W2 of, for example, about 160 mm and, in the longer-side direction (X direction), a length L2 of, for example, about 310 mm.

Here, in Embodiment 1, as shown in FIGS. 1 to 3, the lid plate 90 is composed of a first plate member 70 which is fixed to the package can 60 and a second plate member 80 which is fixed to the first plate member 70. The first and second plate members 70 and 80 are each formed of a metal plate, and these two plate members are fixed together so as to face each other to form the lid plate 90.

Figure 14:
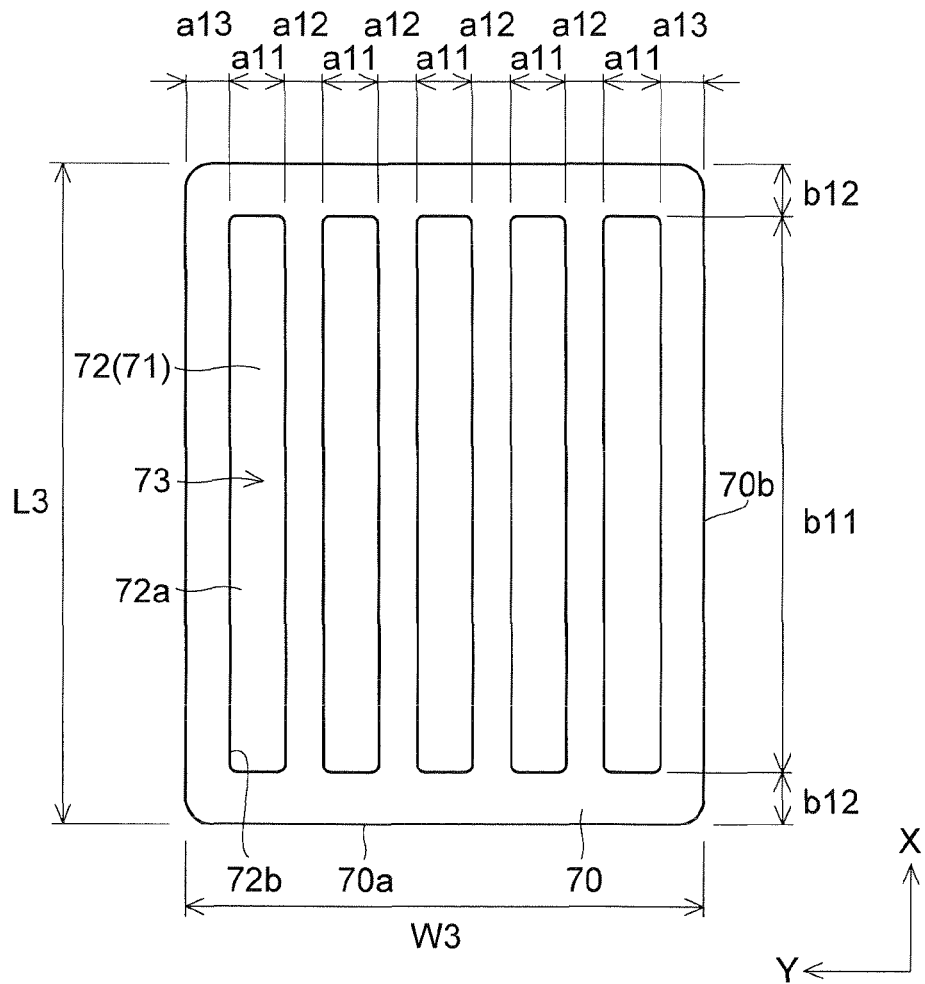
FIG. 14 is a plan view of a first plate member of a lid plate in the lithium-ion secondary battery according to Embodiment 1 of the invention (as seen from the (depressed-portion) side opposite from the projecting side of elevated portions)

The first plate member 70 in the lid plate 90 is so sized as to be able to close the opening 63 of the package can 60. Specifically, as shown in FIG. 14, the first plate member 70 is formed to have a substantially rectangular shape with shorter sides 70a and longer sides 70b. The first plate member 70 is given, in the shorter-side direction, a length W3 (its Y-direction length W3) of, for example, about 158 mm and in the longer-side direction, a length L3 (its X-direction length L3) of, for example, about 308 mm.

In Embodiment 1, as shown in FIG. 5, the first plate member 70 is so formed that its shorter- and longer-side-direction lengths W3 and L3 are smaller than the shorter- and longer-side-direction lengths W2 and L2, respectively, of the package can 60 including the flange 67.

Figure 15:
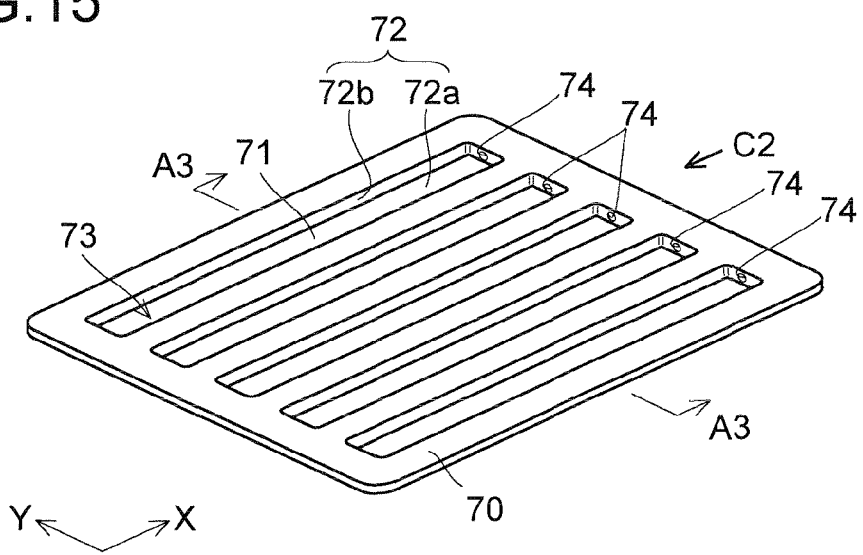
FIG. 15 is a perspective view of the first plate member of the lid plate in the lithium-ion secondary battery according to Embodiment 1 of the invention (as seen from the (depressed-portion) side opposite from the projecting side of the elevated portions)
Figure 16:
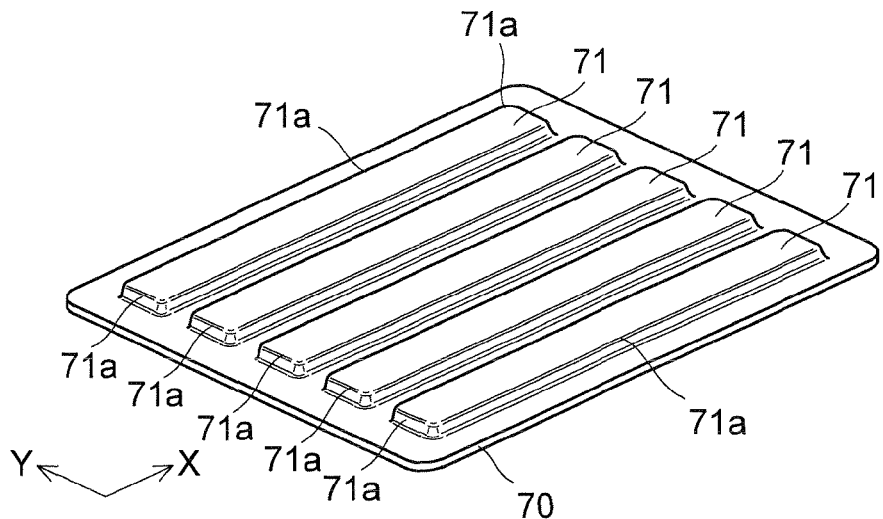
FIG. 16 is a perspective view of the first plate member of the lid plate in the lithium-ion secondary battery according to Embodiment 1 of the invention (as seen from the projecting side of the elevated portions)
Figure 17:
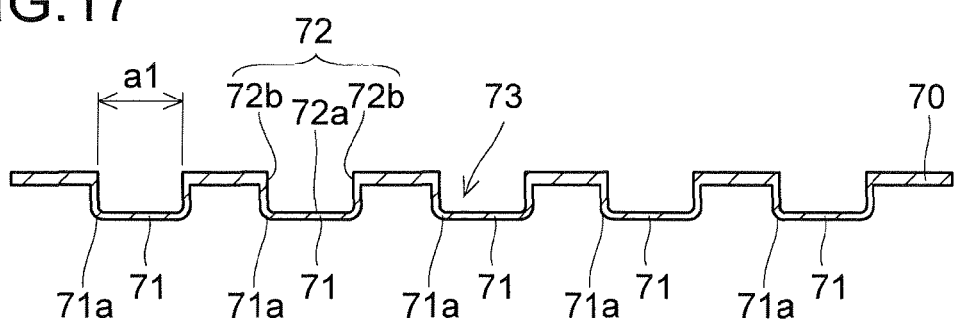
FIG. 17 is a sectional view of the first plate member of the lid plate in the lithium-ion secondary battery according to Embodiment 1 of the invention (as cut on a plane along line A3-A3 in FIG. 15)

Moreover, in Embodiment 1, as shown in FIGS. 3, 15 and 16, the first plate member 70 has a plurality of elevated portions 71 that project toward the electrode assembly 50. These elevated portions 71 are formed integrally with the first plate member 70 by pressing of a metal plate. As shown in FIGS. 15 and 17, each elevated portion 71 has, on its side (face) opposite from the projecting side (the side facing the electrode assembly 50), a depressed portion 72 having a bottom surface 72a and side surfaces 72b. Each such depressed portion 72 serves as a cavity portion 73 for storing non-aqueous electrolyte liquid LQ (see FIGS. 22 and 24) for refilling. The refill non-aqueous electrolyte liquid LQ stored in the cavity portion 73 is, preferably, of the same kind as the non-aqueous electrolyte liquid sealed inside the package can 60 along with the electrode assembly 50.

As shown in FIG. 14, the first plate member 70 has five such elevated portions 71 (depressed portions 72) formed on it, each elevated portion 71 extending in the longer-side direction (X direction). The five elevated portions 71 run parallel to one another. Specifically, each elevated portion 71 is so formed that the depressed portion 72 on the side opposite from its projecting side has a width a11 (shorter-side-direction width a11) of about 18 mm and a length b11 (longer-side-direction length b11) of about 200 mm. Moreover, the elevated portions 71 are, as measured on the side where they form the depressed portions 72, arranged at equal intervals a12 of, for example, about 120 mm in the shorter-side direction (Y direction) that, on the opposite side, the depressed portions 72 lie. Thus, the elevated portions 71 (the depressed portions 72) are formed so as to have, when the first plate member 70 is seen from the side opposite from the projecting side, the shape of grooves. Furthermore, the distance b12 from the shorter sides 70a of the first plate member 70 to the depressed portions 72 (elevated portions 71) is, for example, about 54 mm, and the distance a13 from the longer sides 70b to the depressed portions 72 (elevated portions 71) is, for example, about 10 mm.

Moreover, each elevated portion 71 is so formed that the depressed portion 72 formed on the side (face) opposite from its projecting side has a depth of, for example, about 5 mm. In each elevated portion 71, preferably, the depressed portion 72 formed on the side (face) opposite from its projecting side (the side facing the electrode assembly 50) is formed with an opening width a1 (the width a1 of each cavity portion 73, corresponding to the width a11 of each depressed portion 72; see FIG. 17) of 5 mm or more.

Figure 18:
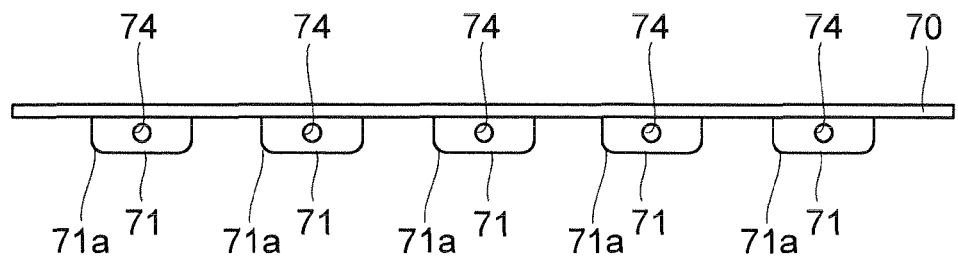
FIG. 18 is a side view of the first plate member of the lid plate in the lithium-ion secondary battery according to Embodiment 1 of the invention (with the first plate member in FIG. 15 seen from direction C2)
Figure 24:
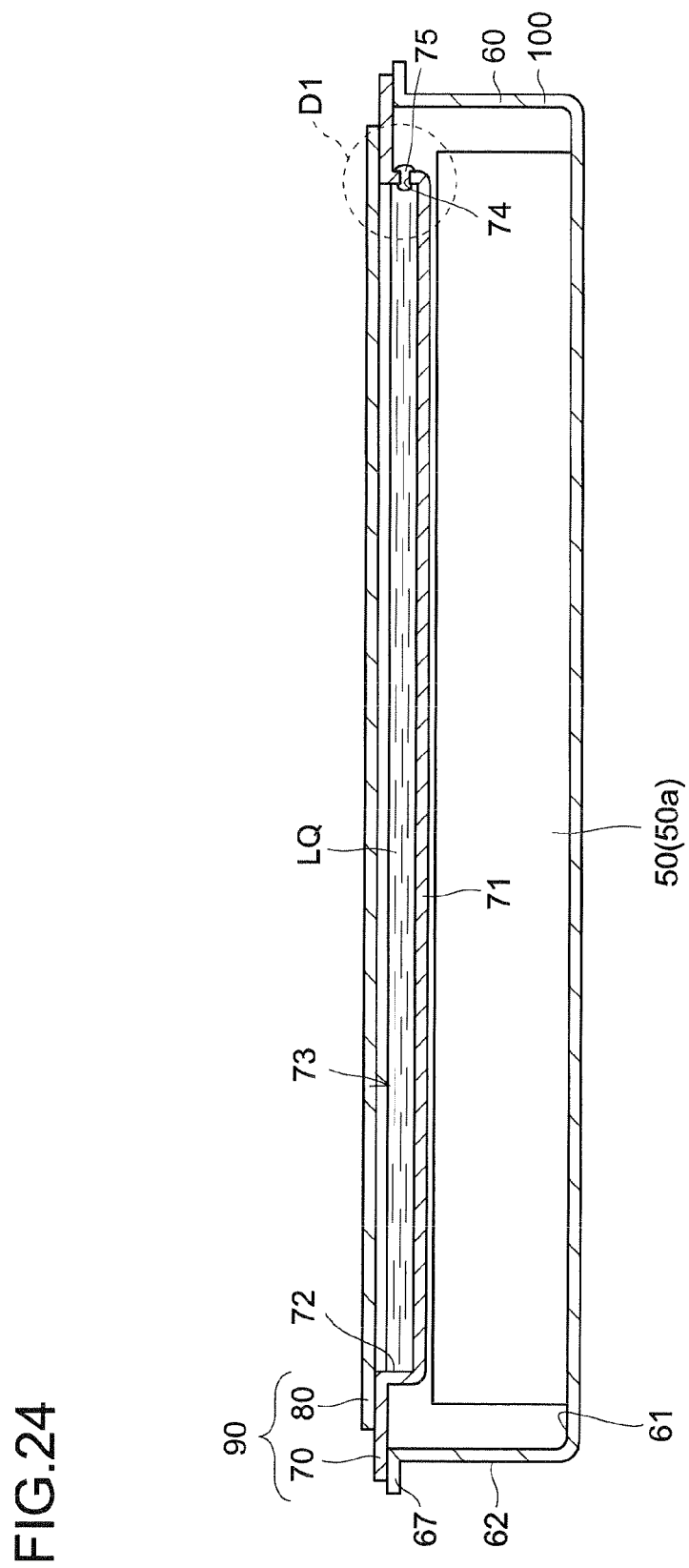
FIG. 24 is a sectional view of the lithium-ion secondary battery according to Embodiment 1 of the invention (as cut on a plane along line B-B in FIG. 4)

Moreover, in Embodiment 1, as shown in FIGS. 15 and 18, in a side surface 72b of each depressed portion 72 (elevated portion 71), a hole (opening) 74 is formed through which to feed the refill non-aqueous electrolyte liquid LQ (see FIG. 22) stored in the cavity portion 73 toward the electrode assembly 50. The hole 74 is provided in the side surface 72b of the depressed portion 72 at one end in the longer-side direction, and is formed as a through hole with a diameter of 2 mm. Moreover, the hole 74 is formed so as to be located inside the package container 100 (see FIG. 1). Thus, as shown in FIG. 24, when the lid plate 90 is fixed to the package can 60, the hole 74 (leaking portion, seeping portion) is prevented from making contact with the electrode assembly 50 housed inside the package can 60.

Preferably, the hole 74 is formed at a position near the bottom surface 72a of the depressed portion 72. There is no particular restriction on the shape of the hole 74. It is, however, preferable that the hole 74 be formed to have an opening area less than 3 cm$^2$. If the hole 74 has an opening area of 3 cm$^2$ or more, when it is stopped with a sealing member 75 (described later), forming the sealing member 75 requires a large amount of resin material, and also diminished sealing strength tends to result.

Figure 19:
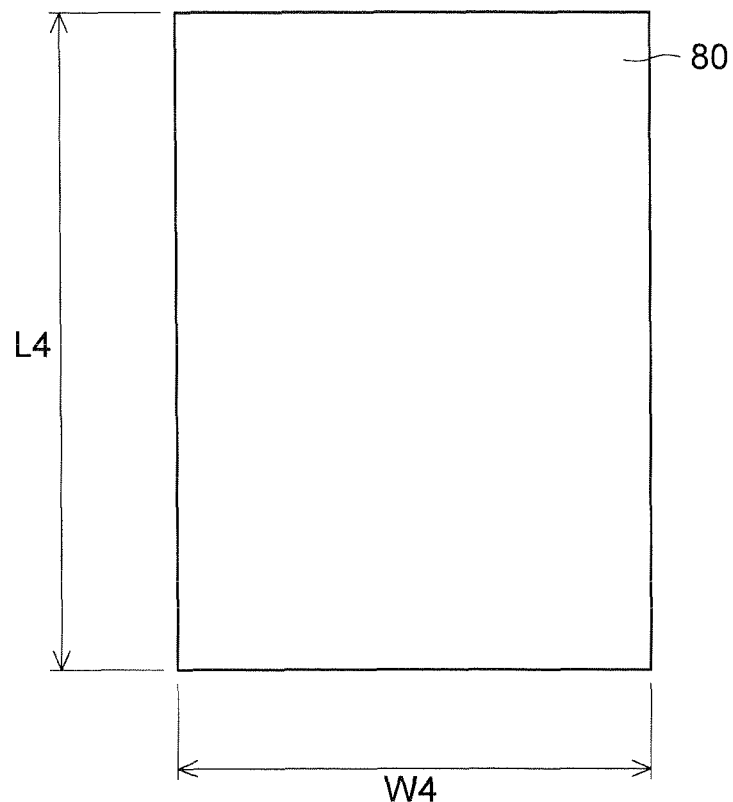
FIG. 19 is a plan view of a second plate member of the lid plate in the lithium-ion secondary battery according to Embodiment 1 of the invention.

As shown in FIGS. 1 and 19, the second plate member 80 in the lid plate 90 is formed to have a substantially rectangular shape as seen in a plan view, and is so sized as to be able to close the openings of the depressed portions 72 of the first plate member 70. Specifically, the second plate member 80 is given, in the X direction, a length L4 of, for example, about 306 mm and, in the Y direction, a length W4 of, for example, about 156 mm.

Figure 20:
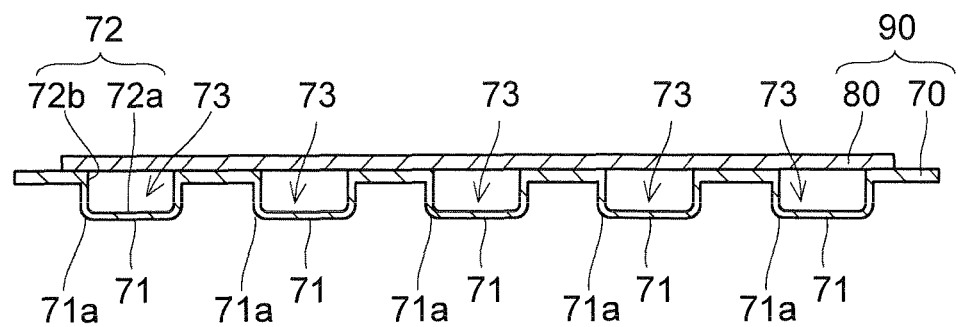
FIG. 20 is a sectional view of the lid plate in the lithium-ion secondary battery according to Embodiment 1 of the invention (with no refill non-aqueous electrolyte liquid stored)
Figure 21:
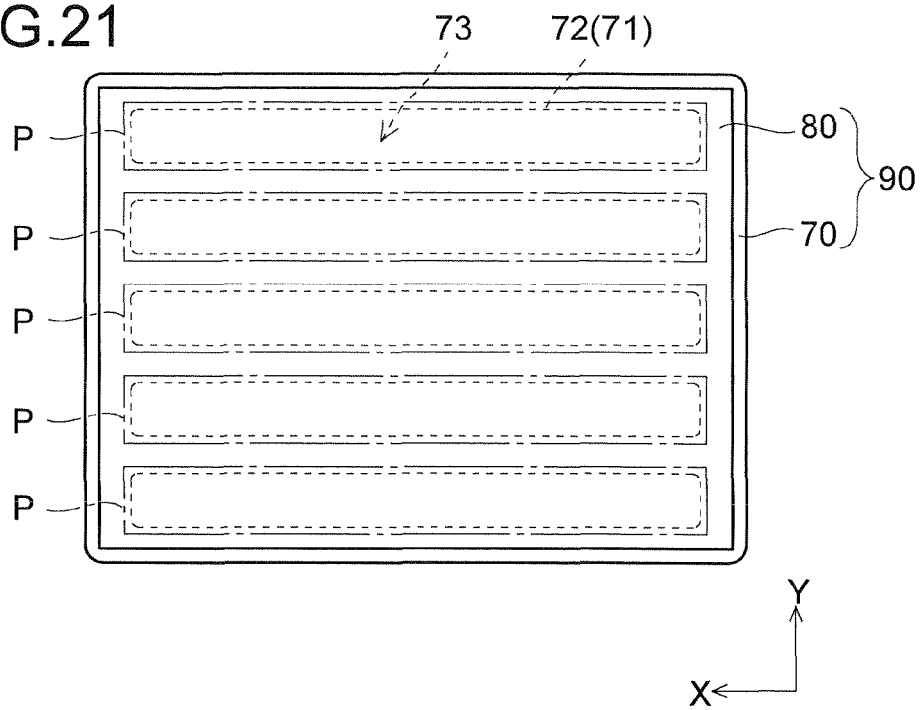
FIG. 21 is a plan view of the lid plate in the lithium-ion secondary battery according to Embodiment 1 of the invention.

Moreover, as shown in FIGS. 20 and 21, the second plate member 80 is fixed to the face of the first plate member 70 opposite from the projecting side of the elevated portion 71, in such a way as to close the openings of the depressed portions 72. Specifically, the second plate member 80 is laid over the first plate member 70 so as to close the openings of the depressed portions 72, and the circumference of the second plate member 80 is fillet-welded by laser pulse welding. In addition, the second plate member 80 is lap-welded at its parts surrounding the depressed portions 72 (the parts indicated by dash-and-dot lines P in FIGS. 5 and 21). Thus, the openings of the depressed portions 72 of the first plate member 70 are air-tightly closed by the second plate member 80.

Figure 26:
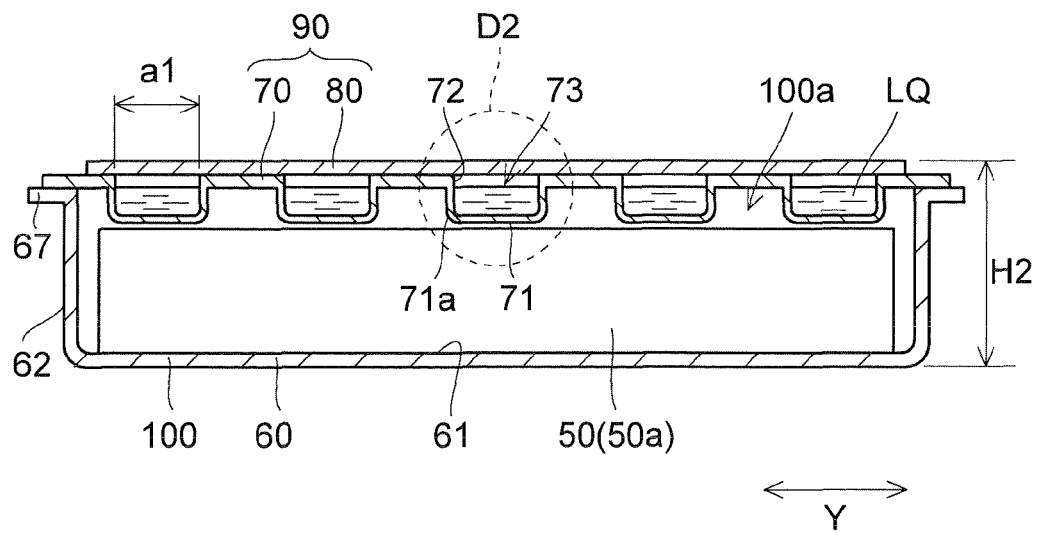
FIG. 26 is a sectional view of the lithium-ion secondary battery according to Embodiment 1 of the invention (as cut on a plane along line A2-A2 in FIG. 4)
Figure 27:
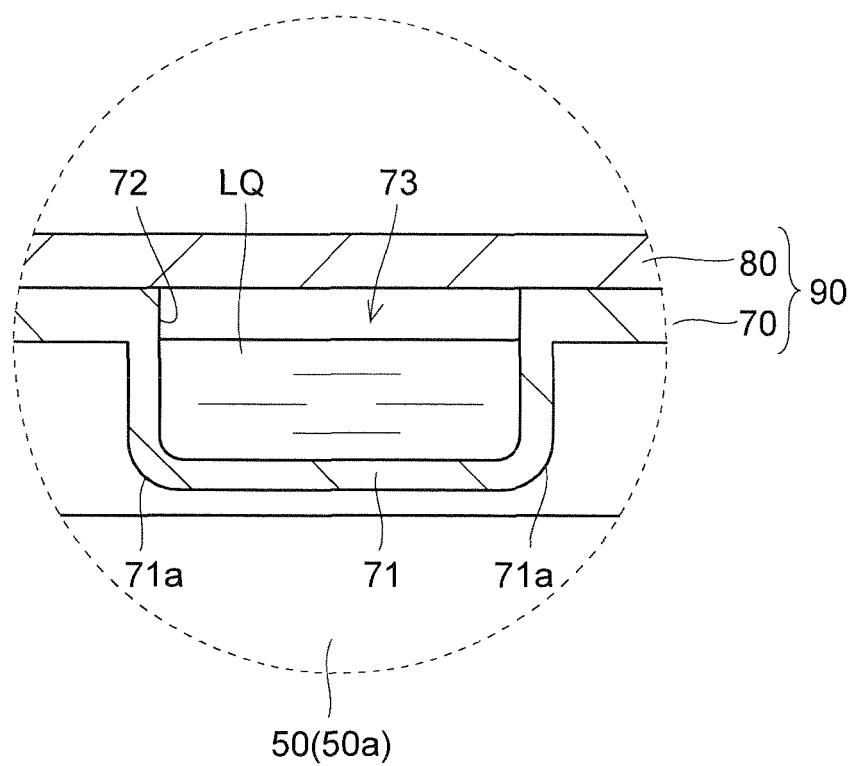
FIG. 27 is a sectional view showing part D2 in FIG. 26 enlarged.

Moreover, in Embodiment 1, as shown in FIGS. 20, 26, and 27, the elevated portions 71 of the lid plate 90 have corners 71a (the corners 71a on their projecting side) rounded.

The package can 60 and the lid plate 90 are formed of, for example, a metal plate of iron, stainless steel, aluminum, or the like, or a steel plate of nickel-plated iron, or the like. Iron is inexpensive, and is preferable from the viewpoint of cost; however, to secure reliability for a long period of time, it is further preferable to use a metal plate of stainless steel, aluminum, or the like, or a steel plate of nickel-plated iron, or the like. The metal plate is given a thickness of, for example, about 0.4 mm to about 1.2 mm (for example, about 1.0 mm).

The first and second plate members 70 and 80 may be formed of metal plates of an equal thickness, or of metal plates of different thicknesses.

Figure 22:
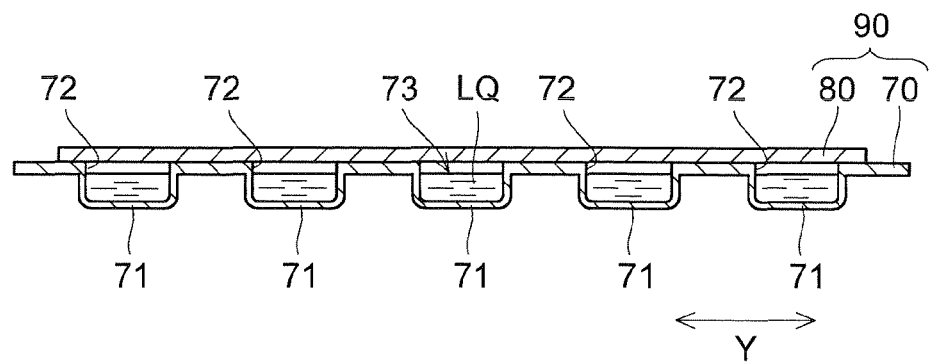
FIG. 22 is a sectional view of the lid plate in the lithium-ion secondary battery according to Embodiment 1 of the invention (with refill non-aqueous electrolyte liquid stored)
Figure 23:
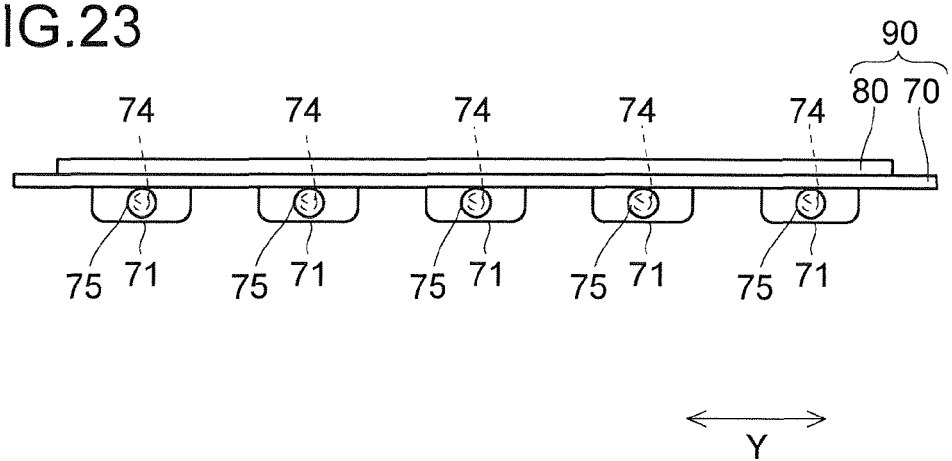
FIG. 23 is a side view of the lid plate in the lithium-ion secondary battery according to Embodiment 1 of the invention (with the lid plate in FIG. 3 seen from direction C1)
Figure 25:
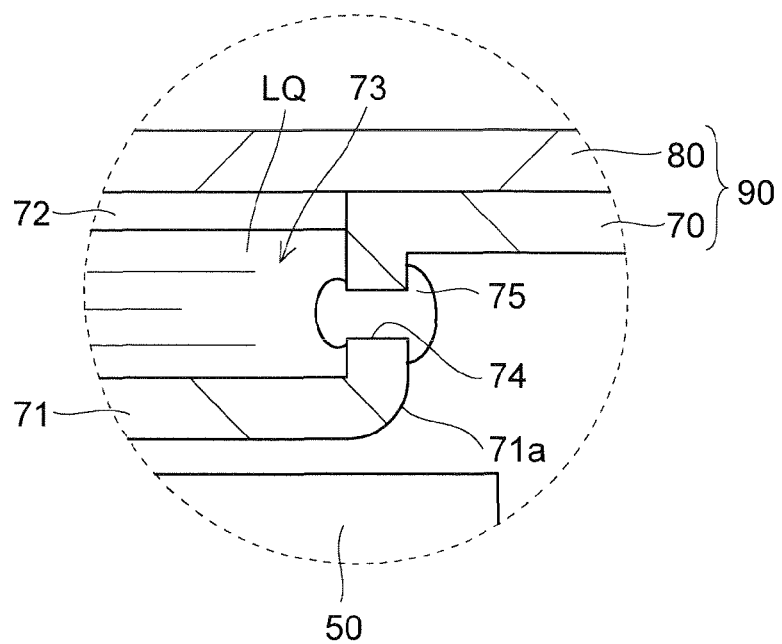
FIG. 25 is a sectional view showing part D1 in FIG. 24 enlarged.

As shown in FIG. 22, each cavity portion 73 of the lid plate 90 is filled with refill non-aqueous electrolyte liquid LQ through the hole 74 and, as shown in FIGS. 23 to 25, the hole 74 in each elevated portion 71 is stopped with a sealing member 75. The sealing member 75 is formed of a resin material that becomes imbued (swells) with a non-aqueous electrolyte liquid and that, at the lapse of a predetermined time, lets the refill non-aqueous electrolyte liquid LQ in the cavity portion 73 leak toward the electrode assembly 50. Thus, the hole 74 and the sealing member 75 together form a leaking portion (seeping portion) that lets the refill non-aqueous electrolyte liquid LQ leak (seep) out toward the electrode assembly 50.

Preferable as the resin material of which the sealing member 75 is formed is any material resistant to organic electrolyte liquids, examples including SBR (styrene-butadiene rubber), EPDM (ethylene propylene diene monomer), butyl rubber, silicone rubber, and rubber containing fluorine resin. When exposed to a non-aqueous electrolyte liquid, these resins deteriorate to let the refill non-aqueous electrolyte liquid LQ leak out toward the electrode assembly 50.

It is generally known that a resin is a synthetic high polymer, which usually deteriorates with time. Among the many factors that contribute to deterioration of a high polymer, particular attention is given to the control of its resistance to chemicals in the embodiment under discussion. Presumed causes for deterioration include oxygen in the atmosphere, moisture, ultraviolet radiation, and heat. In cases where a resin is used for the sealing member 75, since this is accommodated inside the metal package container 100, the effects of oxygen in the atmosphere, moisture, and ultraviolet are small. As for heat, so long as a resin that is stable within the use temperature range of common lithium-ion secondary batteries is taken into consideration, its resistance (i.e., poor resistance) to chemicals contributes more to deterioration. Known patterns of leakage of a liquid chemical resulting from deterioration of a common resin (adhesive) are: interface leakage in which leakage occurs through the interface between the base material and the adhesive; permeation leakage in which the liquid chemical permeates through the high polymer contained in the adhesive; destruction leakage in which the bonds in the high polymer are broken to create physical gaps. In this embodiment, deterioration of a resin exposed to an electrolyte liquid is exploited to let the electrolyte liquid leak; specifically, the electrolyte liquid leaks as a result of one of the above-mentioned phenomena, namely interface leakage, permeation leakage, and destruction leakage, occurring alone or two or more of them occurring in combination. The time it takes for the refill non-aqueous electrolyte liquid LQ to start to leak toward the electrode assembly 50 (the leaking time) depends on the combination of the type of the electrolyte liquid (for examples, its dielectric constant, SP value (solubility parameter), etc.) and the dielectric constant and SP value of the resin; accordingly, the type of the electrolyte liquid, the material, amount, and surface area of the resin, etc. are determined with consideration given to the product life of the lithium-ion secondary battery in such a way as to prolong the product life.

The sealing member 75 may be formed of any other resin material than those mentioned above. In selecting a resin material, it is preferable to conduct experiments to select one that has no adverse effects on battery performance. It is preferable, for example, to evaluate battery performance by use of a non-aqueous electrolyte liquid having a resin material immersed in it. Conducting such experiments enables one to select a resin material that has no adverse effects on battery performance. It is also preferable to conduct experiments for the purpose of controlling the leaking time of a non-aqueous electrolyte liquid. For example, preferably, with reference to JIS K 6858 ("Testing Methods for Resistance of Adhesives to Chemical Substances") and JIS K 7114 ("Testing Methods for Evaluation of Effects of Immersion of Plastics in Liquid Chemicals"), the variation in weight and the rate of shape change that a resin material exhibits when immersed in a non-aqueous electrolyte liquid are previously measured, and the shape of the hole 74 of the elevated portion 71 and the amount of resin used to form the sealing member 75 are determined. Then, preferably, based on the results of these experiments, charge-discharge characteristics and cycle characteristics are compared between a construction provided with refill non-aqueous electrolyte liquid and one provided with no refill non-aqueous electrolyte liquid, and the type and amount of resin material for the sealing member 75 are determined. The time it takes for the refill non-aqueous electrolyte liquid LQ in the cavity portion 73 to start to leak can be adjusted to suit the use environment and the battery specifications. It is known that common resin materials (sealing resins) leak by contact leakage or permeation leakage, and the leakage depends on the adhesion strength between the sealing resin and the bonded member and the affinity with the substance lying in contact with the sealing resin.

Moreover, as shown in FIG. 3, the electrode assembly 50 is housed inside the package can 60 with the positive electrodes 10 (see FIG. 1) and the negative electrodes 20 (see FIG. 1) facing the bottom face 61 of the package can 60. With the electrode assembly 50 so housed, the charge collector-exposed portion 11a (see FIGS. 8 and 9) of the positive electrodes 10 and the charge collector-exposed portion 21a (see FIGS. 10 and 11) of the negative electrode 20 are electrically connected, each via a charge collection lead 5 (see FIG. 6), to the electrode terminals 64, respectively, on the package can 60. The charge collection leads 5s may be formed of the same material as, or a different material from, the charge collectors.

As shown in FIGS. 24 and 26, the lid plate 90 having the cavity portions 73 in the elevated portions 71 filled with the refill non-aqueous electrolyte liquid LQ seals the opening 63 of the package can 60. Specifically, the lid plate 90 is arranged with the elevated portions 71 facing the electrode assembly 50, and the circumference of the first plate member 70 is fillet-welded on the flange 67 of the package can 60 by laser pulse welding. When sealed with the lid plate 90, the package container 100 has a height H2 (see FIG. 26) of, for example, about 42 mm.

After the opening 63 of the package can 60 is closed with the lid plate 90, the non-aqueous electrolyte liquid is injected through the filling hole 65, for example, under reduced pressure. Then a metal ball 6 (see FIG. 4) with approximately the same diameter as the filling hole 65 is placed in the filling hole 65, and the filling hole 65 is stopped by electric resistance welding, laser welding, or the like.

In the lithium-ion secondary battery of Embodiment 1 constructed as described above, refill non-aqueous electrolyte liquid LQ is stored in the cavity portions 73 in the lid plate 90, and as time passes, through the holes 74 (leaking portion) stopped with the sealing members 75, the refill non-aqueous electrolyte liquid LQ is fed toward the electrode assembly 50. That is, the sealing member 75 becomes imbued with the refill non-aqueous electrolyte liquid LQ, and at the lapse of a predetermined time, the refill non-aqueous electrolyte liquid LQ leaks, and is thereby fed, toward the electrode assembly 50. Here, it is preferable that the holes 74 (leaking portion) be located over (right above) an edge part of the electrode assembly 50 so that the refill non-aqueous electrolyte liquid LQ drips to the edge part of the electrode assembly 50.

In the lithium-ion secondary battery according to Embodiment 1, by providing the sealing plate 90 with the elevated portion 71 as described above, it is possible, with the elevated portion 71, to increase the rigidity of the lid plate 90. This makes it possible to suppress the inconvenience of the lid plate 90 developing strain due to welding heat when the lid plate 90 and the package can 60 are welded together. Moreover, with this construction, even when the lid plate is faulted of a thin metal plate, it is possible to suppress lowering in rigidity. Thus, by forming the lid plate with a thin metal plate, it is possible to make the lid plate lightweight.

In larger secondary batteries, the welding distances are longer, and this makes the lid plate 90 more likely to develop strain during welding. On the other hand, forming the elevated portion 71 on the lid plate 90 as described above makes it possible to suppress the lid plate 90 developing strain. Thus, even in larger secondary battery, the lid plate 90 and the package can 60 can be welded together easily. This makes it possible to make secondary batteries larger easily, and thus to obtain large-capacity lithium-ion secondary batteries easily. Moreover, by suppressing stress in the lid plate 90, it is possible to fix together the lid plate 90 and the package can 60 firmly, and thus to improve reliability and safety.

Moreover, in Embodiment 1, by forming a plurality of elevated portions 71 on the first plate member 70 of the lid plate 90, and forming each elevated portion 71 so that it extends in the longer-side direction, it is possible to further suppress the lid plate 90 developing strain due to welding heat during the welding of longer-side parts where the welding distances are long. Thus, it is possible to fix the lid plate 90 and the package can 60 together easily and securely, and it is thus possible to increase the pressure resistance of the package container 100. This makes it possible to easily fit the lid plate 90 with such sealing strength that the pressure resistance at the sealed part is higher than the activation pressure of the safety valve 66. Thus, even when the internal pressure of the battery rises, the package container 100 does not break open before the safety valve 66 is activated. Consequently, by liberating the internal pressure of the battery through the safety valve 66, it is possible to prevent risks such as the rupture of the battery.

Moreover, in Embodiment 1, by forming the elevated portion 71 so that it projects toward the electrode assembly 50 and that it has the cavity portion 73 on the opposite side from the electrode assembly 50 (on the opposite side from the projecting side), it is possible to store refill non-aqueous electrolyte liquid LQ in the cavity portion 73. And, by forming a hole 74 (leaking portion) in the elevated portion 71, it is possible to feed the refill non-aqueous electrolyte liquid LQ stored in the cavity portion 73 toward the electrode assembly 50 through the hole 74 (leaking portion). This makes it possible to feed fresh refill non-aqueous electrolyte liquid LQ to the electrode assembly 50; thus, even when the discharge capacity has diminished through charge-discharge cycles, by feeding the refill non-aqueous electrolyte liquid LQ, it is possible to improve charge-discharge cycle characteristics.

Here, when non-aqueous electrolyte liquid is refilled through the filling hole 65 or the like, the refilling needs to be performed in a low-humidity environment, and thus requires equipment such as a humidity-controlled glove box. It is difficult, however, to bring a large lithium-ion secondary battery into equipment such as a glove box, and thus larger batteries are inconvenient to maintain as for refilling.

In Embodiment 1, however, by adopting the construction described above, it is possible to feed fresh non-aqueous electrolyte liquid to the electrode assembly 50 without its being brought into equipment such as a glove box. This makes it possible to make the battery maintenance-free and prolong its life by a simple method. That is, simply by grasping the relationship of the leakage of non-aqueous electrolyte liquid with respect to the sealing member 75 (resin material), it is possible to prolong the battery life on a maintenance-free basis. Thus, it is possible to obtain, on a maintenance-free basis, a large secondary battery using a flat, rectangular can that can be used for a long period of time.

Moreover, in Embodiment 1, by sealing the hole 74 in the elevated portion 71 with the sealing member 75 that can leak the refill non-aqueous electrolyte liquid LQ in the cavity portion 73 toward the electrode assembly 50, it is possible to feed the refill non-aqueous electrolyte liquid LQ stored in the cavity portion 73 toward the electrode assembly 50 easily. This makes it possible to improve charge-discharge cycle characteristics easily. Moreover, by feeding the refill non-aqueous electrolyte liquid LQ stored in the cavity portion 73 toward the electrode assembly 50, it is possible to suppress drying out of the non-aqueous electrolyte liquid, and thus to easily suppress deterioration in battery performance due to drying out of electrolyte liquid.

Moreover, in Embodiment 1, by forming the sealing member 75 out of a resin material that becomes imbued with a non-aqueous electrolyte liquid and that, at the lapse of a predetermined time, lets the refill non-aqueous electrolyte liquid LQ in the cavity portion 73 leak toward the electrode assembly 50, it is possible to feed the refill non-aqueous electrolyte liquid LQ stored in the cavity portion 73 toward the electrode assembly 50 easily.

Preferably, the timing with which the refill non-aqueous electrolyte liquid LQ is fed is determined by previously measuring how the battery capacity tends to drop and designing the hole 74 and the sealing member 75 (appropriately determining the size of the hole 74 and the material of the sealing member 75) in such a way that the refill non-aqueous electrolyte liquid LQ spontaneously seeps (leaks) out with the timing with which refilling is desired.

Moreover, in Embodiment 1, by forming a plurality of elevated portions 71 on the lid plate 90 (first plate member 70), and forming in each of those elevated portions 71 a hole 74 through which to feed the refill non-aqueous electrolyte liquid LQ, it is possible to store refill non-aqueous electrolyte liquid LQ in each of the cavity portions 73 provided as a result of the elevated portions 71 being formed. In addition, it is possible to feed the refill non-aqueous electrolyte liquid LQ stored in each cavity portion 73 through the hole 74 provided in it toward the electrode assembly 50. Thus, it is possible to increase the amount of refill non-aqueous electrolyte liquid LQ that can be stored in the cavity portion 73, and thus to feed the refill non-aqueous electrolyte liquid LQ toward the electrode assembly 50 for a ling period. This makes it possible to more easily improve charge-discharge cycle characteristics and prolong the life of the battery. Moreover, by forming a plurality of elevated portions 71 on the lid plate 90 (first plate member 70), it is possible to further increase the rigidity of the lid plate 90.

Moreover, in Embodiment 1, by forming the elevated portion 71 so that it has the shape of a groove as seen from the side opposite from the electrode assembly 50, it is possible to store refill non-aqueous electrolyte liquid LQ inside the groove, and also to increase the rigidity of the lid plate 90 (package container 100) easily.

Moreover, in Embodiment 1, by forming the hole 74 (leaking portion) in the elevated portion 71 at a position where it does not make contact with the electrode assembly 50, it is possible to suppress the inconvenience of the electrode assembly 50 being damaged due to the hole 74 (leaking portion) making contact with it. This makes it possible to suppress occurrence of internal short-circuiting due to damage to the electrode assembly 50. Consequently, it is possible to suppress lowering in charge-discharge cycle characteristics and in reliability resulting from occurrence of internal short-circuiting. If internal short-circuiting occurs during assembly of batteries, reduced yields may result. Thus, by suppressing occurrence of internal short-circuiting, it is also possible to achieve an effect of improving yields.

Moreover, in Embodiment 1, by rounding corners 71*a* of the elevated portion 71, it is possible to effectively suppress damage to the electrode assembly 50 resulting from the elevated portion 71 making contact with it. This makes it possible to suppress occurrence of internal short-circuiting effectively.

Moreover, in Embodiment 1 described above, by giving the depressed portion 72 an opening width a1 (giving the cavity portion 73 a width a1) of 5 mm or more, it is possible to make it easier to suppress damage to the electrode assembly 50 resulting from the elevated portion 71 making contact with it. Moreover, with this construction, it is possible to suppress the inconvenience of the cavity portion 73 having too small a volume due to its having too small a width a1. This makes it possible to suppress the inconvenience of difficulty in restoring the charge capacity due to the amount of non-aqueous electrolyte liquid LQ stored in the cavity portion 73 being too small.

Furthermore, in Embodiment 1, by using the face of the package can 60 with the largest area as the bottom face 61, and providing on the side opposite from the bottom face 61 the opening 63 through which to house the electrode assembly 50, it is possible to house large-area electrodes (the electrode assembly 50) inside the container easily. This makes it possible to fabricate a large-capacity secondary battery easily. Moreover, by structuring the package can 60 as described above, it is possible to cope with even larger-area electrodes by a little deep drawing. This makes it possible to improve the flexibility in the choice of the material for the package can 60, and to fabricate the package can without the use of a plurality of expensive dies.

The lithium-ion secondary battery of Embodiment 1 constructed as described above can be used suitably as a stationary electric power storage battery which is expected to have a long life. It can also be used suitably as a vehicle-mounted storage battery for hybrid electric vehicles (HEVs), electric vehicles (EVs), and the like. The lithium-ion secondary battery according to Embodiment 1 is suitable as a large-capacity storage battery with a per-cell capacity of 10 Ah or more which is difficult to bring into equipment such as a glove box.

Modified Example of Embodiment 1

Figure 28:
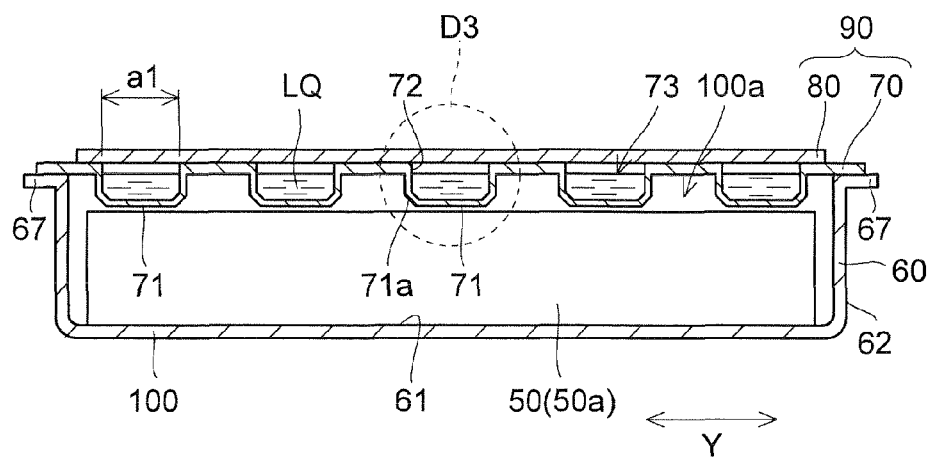
FIG. 28 is a sectional view of a lithium-ion secondary battery according to a modified example of Embodiment 1.
Figure 29:
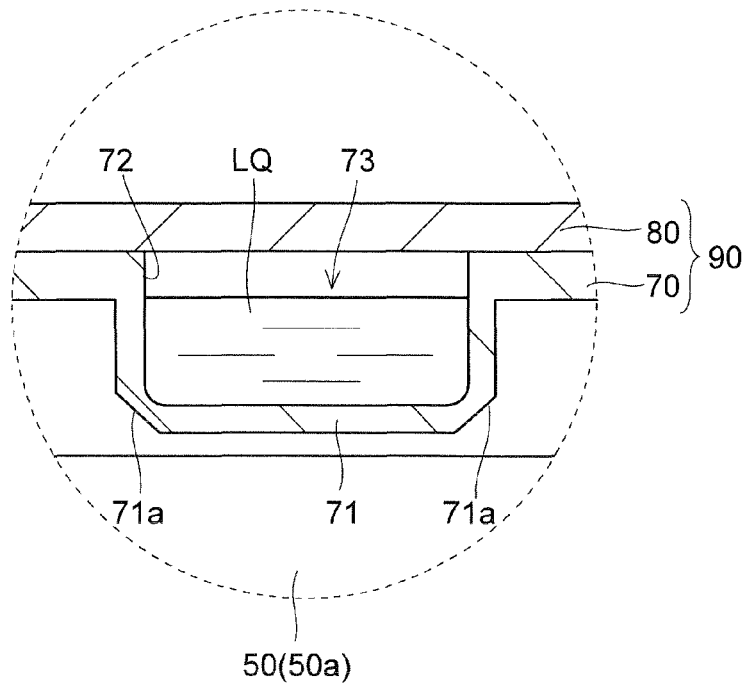
FIG. 29 is a sectional view showing part D3 in FIG. 28 enlarged.

FIG. 28 is a sectional view of a lithium-ion secondary battery according to a modified example of Embodiment 1. FIG. 29 is a sectional view which is an enlarged view of part D3 in FIG. 28. Next, with reference to FIGS. 28 and 29, the lithium-ion secondary battery according to the modified example of Embodiment 1 will be described.

In this modified example of Embodiment 1, as shown in FIGS. 28 and 29, the elevated portions 71 of the lid plate 90 have corners 71*a* (the corners 71*a* on their projecting side) chamfered. That is, in the modified example of Embodiment 1, the corners 71*a* of the elevated portions 71 (the corners 71*a* on their projecting side) are chamfered. This makes it possible to effectively suppress damage to the electrode assembly 50 resulting from the elevated portions 71 making contact with it. Thus, with this construction, it is possible to effectively suppress occurrence of internal short-circuiting due to damage to the electrode assembly 50. Consequently, it is possible to suppress lowering in charge-discharge cycle characteristics and in reliability resulting from occurrence of internal short-circuiting. The chamfering of the corners 71*a* can be achieved by grinding with a grinder or by milling with an end mill.

In other respects, the construction according to the modified example of Embodiment 1 is similar to that of Embodiment 1 described previously; so are the benefits of the modified example of Embodiment 1.

Embodiment 2

Figure 30:
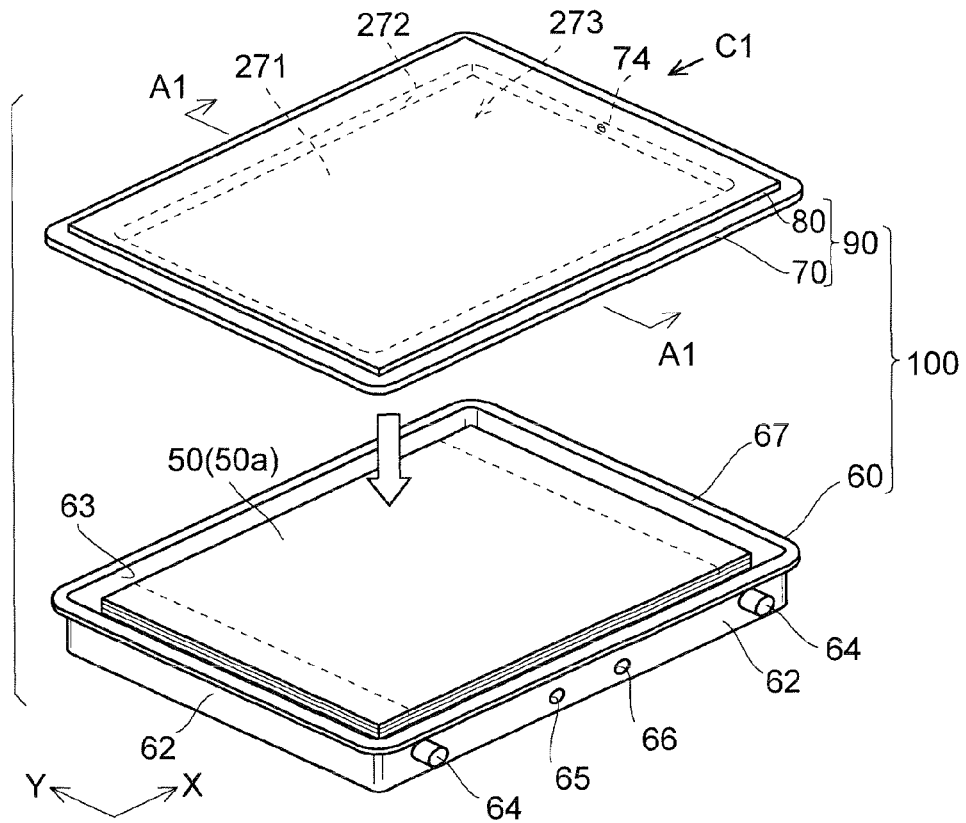
FIG. 30 is an exploded perspective view of a lithium-ion secondary battery according to Embodiment 2 of the invention.
Figure 31:
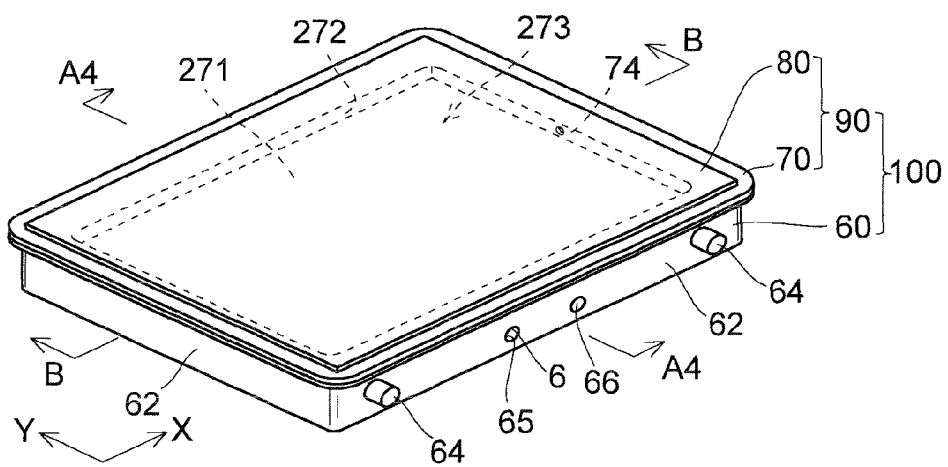
FIG. 31 is an overall perspective view of the lithium-ion secondary battery according to Embodiment 2 of the invention.
Figure 32:
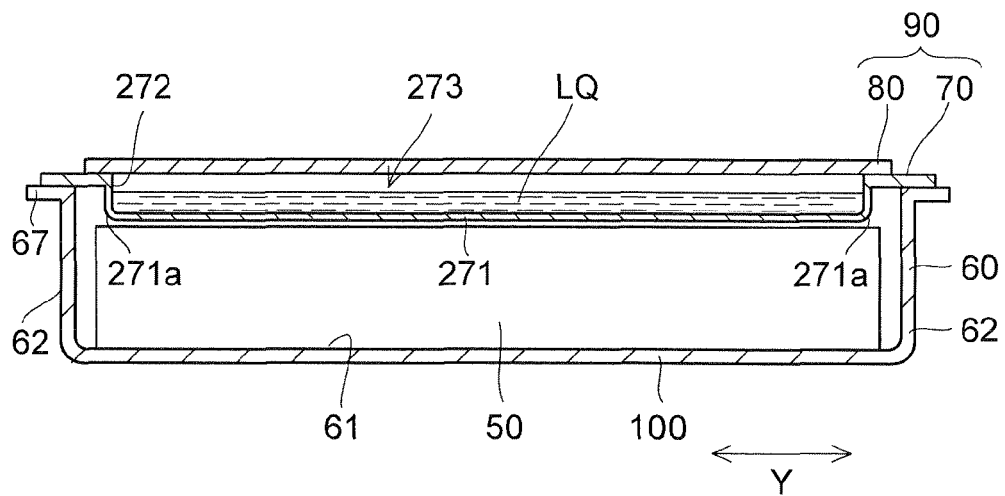
FIG. 32 is a sectional view of the lithium-ion secondary battery according to Embodiment 2 of the invention (as cut on a plane along line A4-A4 in FIG. 31)
Figure 33:
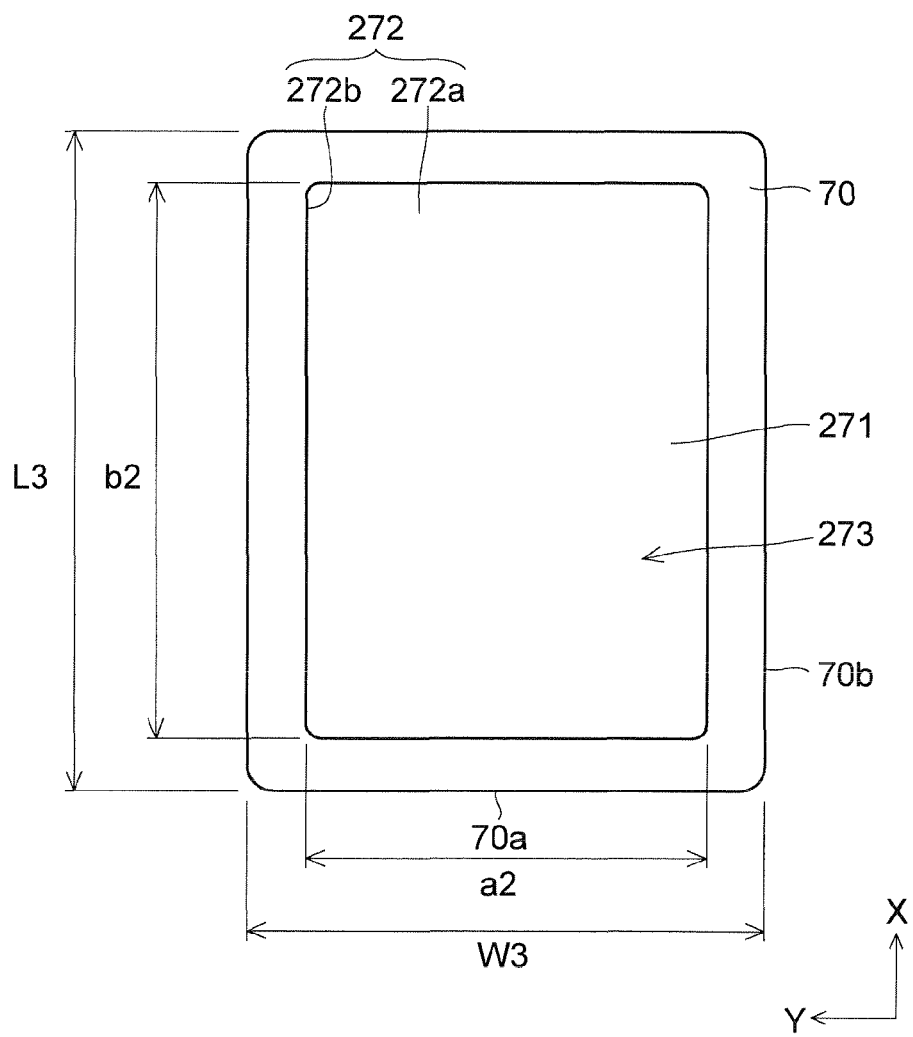
FIG. 33 is a plan view of a first plate member of a lid plate in the lithium-ion secondary battery according to Embodiment 2 of the invention (as seen from the (depressed-portion) side opposite from the projecting side of an elevated portion)
Figure 34:
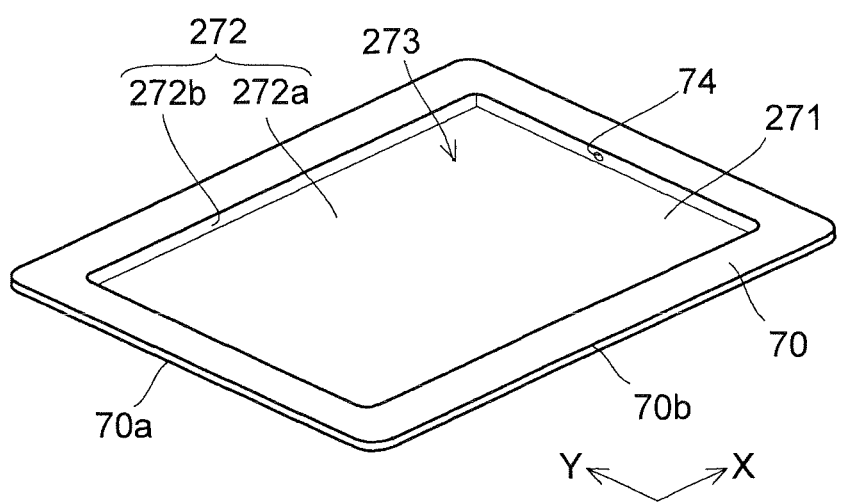
FIG. 34 is a perspective view of the first plate member of the lid plate in the lithium-ion secondary battery according to Embodiment 2 of the invention.

FIG. 30 is an exploded perspective view of a lithium-ion secondary battery according to a second embodiment (Embodiment 2) of the invention. FIG. 31 is an overall perspective view of the lithium-ion secondary battery according to Embodiment 2 of the invention. FIGS. 32 to 34 are diagrams in illustration of the lithium-ion secondary battery according to Embodiment 2 of the invention. FIG. 32 is a sectional view along line A4-A4 in FIG. 31. Next, with reference to FIGS. 30 to 34, the lithium-ion secondary battery according to Embodiment 2 of the invention will be described. Among different diagrams, the same components are identified by the same reference signs, and no overlapping description will be repeated.

In the lithium-ion secondary battery according to Embodiment 2, as compared with the construction of Embodiment 1 described previously, formed on the lid plate 90 is, as shown in FIGS. 30 to 32, an elevated portion 271 that is shaped differently than in Embodiment 1 described previously. Specifically, the lid plate 90 is composed of a first plate member 70 and a second plate member 80 as in Embodiment 1, but here, on this first plate member 70, one elevated portion 271 having a comparatively large area is formed. As shown in FIGS. 32 to 34, the elevated portion 271 projects toward the electrode assembly 50, and has, on its side (face) opposite from the projecting side (the side facing the electrode assembly 50), a cavity portion 273 (depressed portion 272) for storing refill non-aqueous electrolyte liquid LQ. As in Embodiment 1 described previously, the depressed portion 272 has a bottom surface 272*a* and side surfaces 272*b*.

Moreover, as shown in FIG. 33, the elevated portion 271 of the lid plate 90 (first plate member 70) is given a substantially rectangular shape as seen in a plan view. Moreover, the elevated portion 271 is so formed as to have, as measured on the side where it forms the depressed portion 272, a length b2 of, for example, about 200 mm in the longer-side direction (X direction) and a width a2 of, for example, about 130 mm in the shorter-side direction (Y direction). Furthermore, the elevated portion 271 is so formed that the depressed portion 272 formed on the side (face) opposite from the projecting side has a depth of, for example, about 5 mm as in Embodiment 1 described previously.

In other respects, the construction of Embodiment 2 is similar to that of Embodiment 1 described previously. The benefits of Embodiment 2 are similar to those of Embodiment 1 described previously.

The elevated portion 271 of the lid plate 90 (first plate member 70) may have corners 271*a* (the corners 271*a* on its projecting side) (see FIG. 32) rounded as in Embodiment 1 described previously, or chamfered as in the modified example of Embodiment 1 described previously.

Embodiment 3

Figure 35:
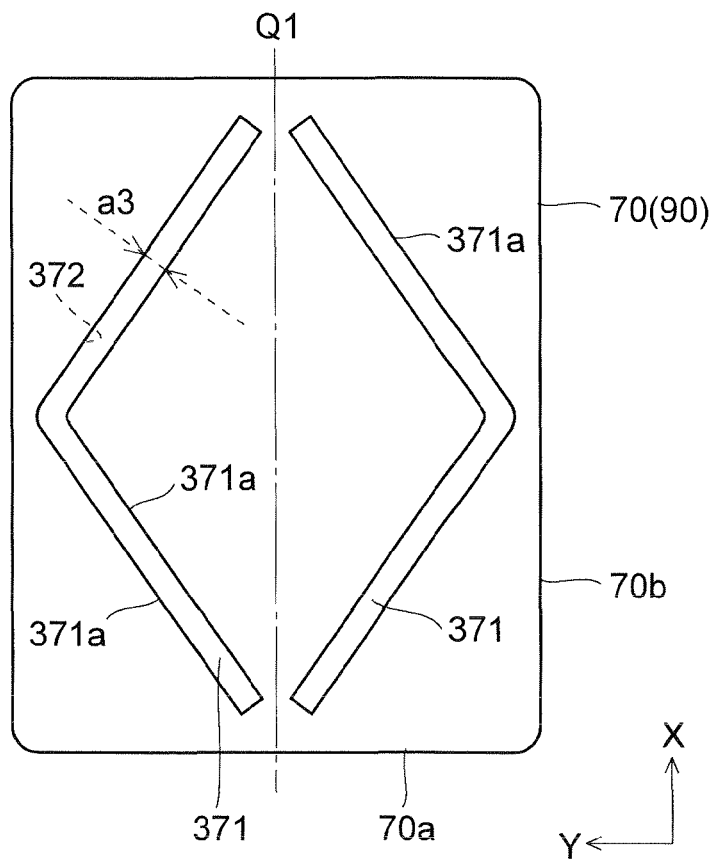
FIG. 35 is a plan view of a first plate member of a lid plate in a lithium-ion secondary battery according to Embodiment 3 of the invention.
Figure 36:
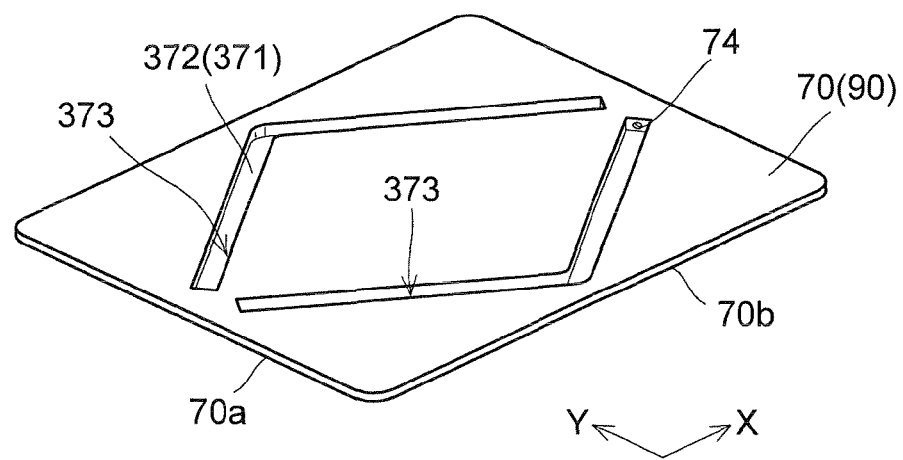
FIG. 36 is a perspective view of the first plate member of the lid plate in the lithium-ion secondary battery according to Embodiment 3 of the invention.

FIG. 35 is a plan view of a first plate member in a lid plate of a lithium-ion secondary battery according to a third embodiment (Embodiment 3) of the invention. FIG. 36 is a perspective view of the first plate member in the lid plate of the lithium-ion secondary battery according to Embodiment 3 of the invention. FIG. 35 is a plan view of the first plate member as seen from the bottom side (the side at which elevated portions project), and FIG. 36 is a perspective view of the first plate member as seen from the top side (the side opposite from the side at which the elevated portions project). Next, with reference to FIGS. 24, 35, and 36, the lithium-ion secondary battery according to Embodiment 3 of the invention will be described. In Embodiment 3, the construction is similar to that in Embodiment 1 described previously except for the elevated portions on the lid plate, and therefore no overlapping description will be repeated.

In Embodiment 3, as shown in FIGS. 35 and 36, the first plate member 70 of the lid plate 90 has two elevated portions 371 formed on it. These two elevated portions 371 are so formed as to extend in directions crossing the longer-side direction (X direction), and are bent on the way to describe a V shape. Moreover, the two elevated portions 371 are so located as to be, for example, symmetric about the dash-and-dot line Q1 drawn parallel to the longer sides 70b (for example, the center line in the shorter-side direction (Y direction). Thus, as a whole, the elevated portions 371 are arranged in a substantially rhombic shape. The elevated portions 371 are so arranged that the diagonal lines of the substantially rhombic shape are parallel to the longer sides 70b and the shorter sides 70a respectively.

Moreover, as shown in FIG. 36, as a result of the elevated portions 371 being formed, on the side (face) of the first plate member 70 opposite from the projecting side, depressed portions 372 are formed. These depressed portions 372 serve as cavity portions 373 for storing refill non-aqueous electrolyte liquid LQ (see FIG. 24). Moreover, the first plate member 70 is so formed that, when it is seen from its side opposite from the projecting side, the depressed portions 372 have the shape of grooves. As shown in FIG. 35, the depressed portions 372 are given an opening width a3 (the cavity portions 373 are given a width a3) of, for example, about 8 mm.

In other respects, the structure of the lid plate 90 in Embodiment 3 is similar to that in Embodiment 1 described previously. The benefits of Embodiment 3 are similar to those of Embodiment 1 described previously.

The elevated portions 371 of the lid plate 90 (first plate member 70) may have corners 371a (the corners 371a on their projecting side) rounded as in Embodiment 1 described previously, or chamfered as in the modified example of Embodiment 1 described previously.

Embodiment 4

Figure 37:
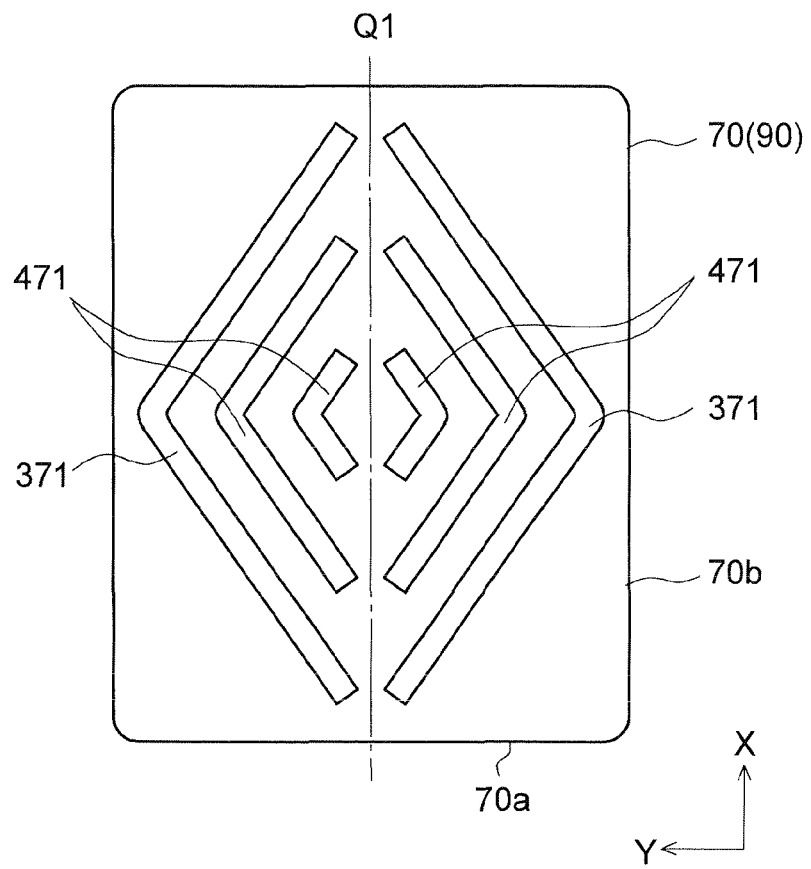
FIG. 37 is a plan view of a first plate member of a lid plate in a lithium-ion secondary battery according to Embodiment 4 of the invention.
Figure 38:
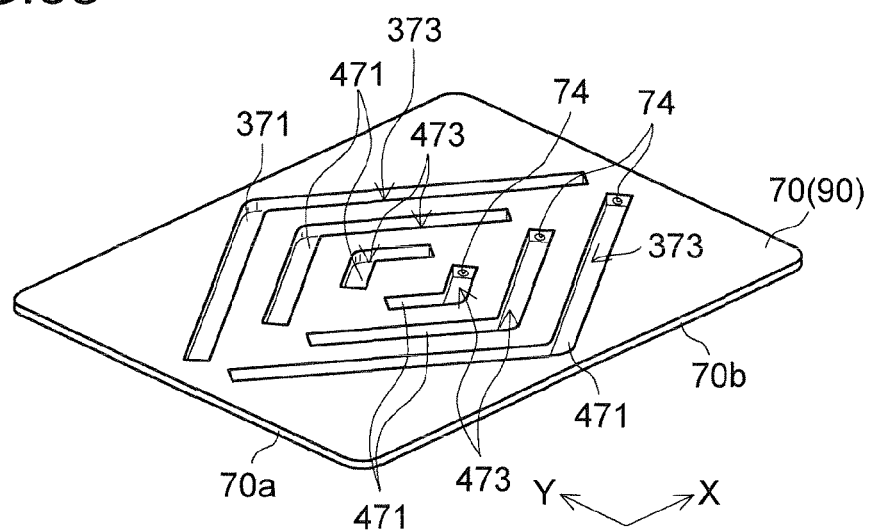
FIG. 38 is a perspective view of the first plate member of the lid plate in the lithium-ion secondary battery according to Embodiment 4 of the invention.

FIG. 37 is a plan view of a first plate member in a lid plate of a lithium-ion secondary battery according to a fourth embodiment (Embodiment 4) of the invention. FIG. 38 is a perspective view of the first plate member in the lid plate of the lithium-ion secondary battery according to Embodiment 4 of the invention. FIG. 37 is a plan view of the first plate member as seen from the bottom side (the side at which elevated portions project), and FIG. 38 is a perspective view of the first plate member as seen from the top side (the side opposite from the side at which the elevated portions project). Next, with reference to FIGS. 24, 37, and 38, the lithium-ion secondary battery according to Embodiment 4 of the invention will be described. In Embodiment 4, the construction is similar to that in Embodiment 1 described previously except for the elevated portions on the lid plate, and therefore no overlapping description will be repeated.

In Embodiment 4, as shown in FIGS. 37 and 38, in addition to the construction of Embodiment 3 described previously, further elevated portions 471 are formed that have geometrically similar shapes to that of the elevated portions 371. That is, in Embodiment 4, as compared with Embodiment 3 described previously, the first plate member 70 has more elevated portions (elevated portions 371 and 471) formed on it. In Embodiment 4, by increasing the number of elevated portions formed on the lid plate 90 (first plate member 70) in this way, it is possible to further increase the rigidity of the lid plate 90. In addition, it is possible to store the refill non-aqueous electrolyte liquid LQ (see 24) in each of the cavity portions 373 and 473 formed as a result of the elevated portions 371 and 471 being formed. Thus, it is possible to further improve charge-discharge cycle characteristics than with the construction of Embodiment 3.

In the geometrically similarly shaped elevated portions 471, the cavity portions 473 are given the same width and depth as the elevated portions 371.

In other respects, the structure of the lid plate 90 in Embodiment 4 is similar to that in Embodiments 1 and 3 described previously. The benefits of Embodiment 4 are similar to those of Embodiments 1 and 3 described previously.

Embodiment 5

Figure 39:
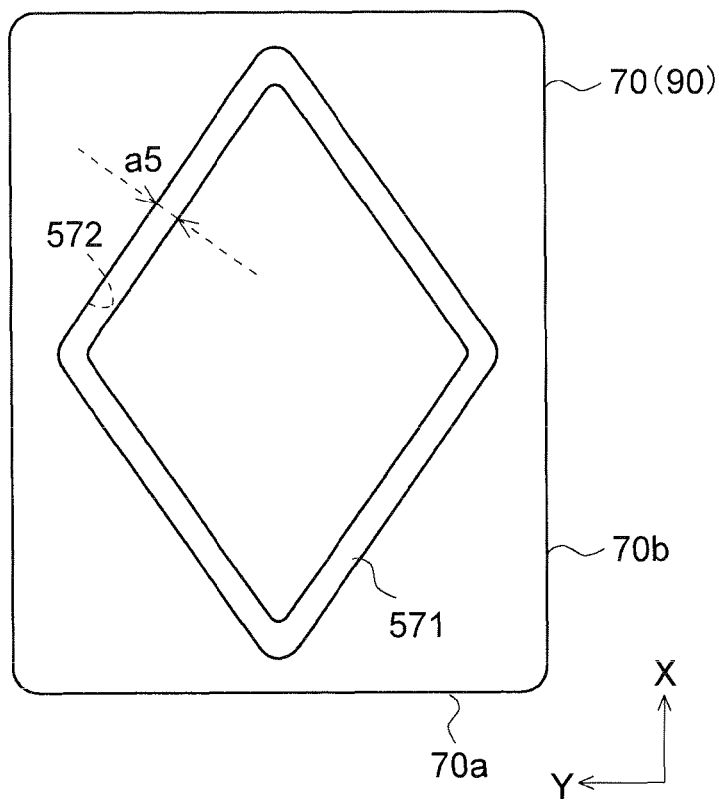
FIG. 39 is a plan view of a first plate member of a lid plate in a lithium-ion secondary battery according to Embodiment 5 of the invention.
Figure 40:
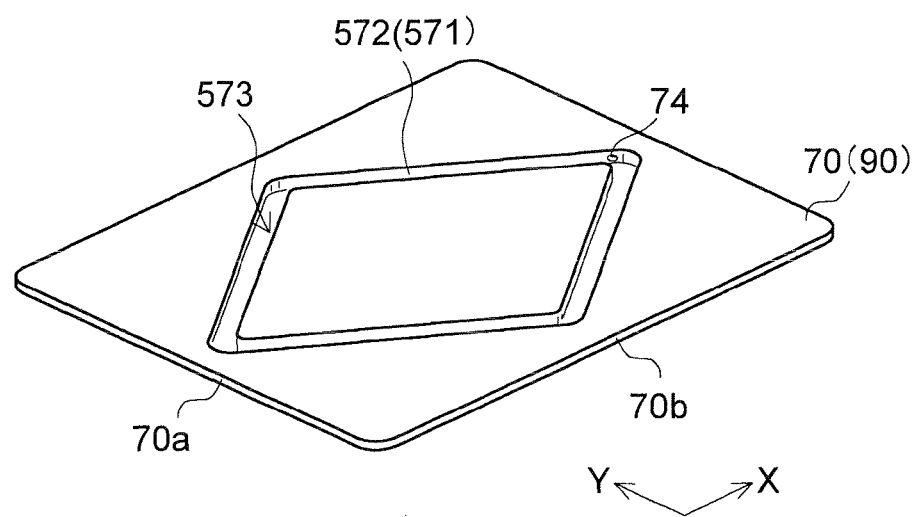
FIG. 40 is a perspective view of the first plate member of the lid plate in the lithium-ion secondary battery according to Embodiment 5 of the invention.

FIG. 39 is a plan view of a first plate member in a lid plate of a lithium-ion secondary battery according to a fifth embodiment (Embodiment 5) of the invention. FIG. 40 is a perspective view of the first plate member in the lid plate of the lithium-ion secondary battery according to Embodiment 5 of the invention. FIG. 39 is a plan view of the first plate member as seen from the bottom side (the side at which elevated portions project), and FIG. 40 is a perspective view of the first plate member as seen from the top side (the side opposite from the side at which the elevated portions project). Next, with reference to FIGS. 24, 39, and 40, the lithium-ion secondary battery according to Embodiment 5 of the invention will be described. In Embodiment 5, the construction is similar to that in Embodiment 1 described previously except for the elevated portion on the lid plate, and therefore no overlapping description will be repeated.

In Embodiment 5, as shown in FIGS. 39 and 40, the first plate member 70 of the lid plate 90 has one elevated portion 571 formed on it. This elevated portion 571 is so formed that its different segments extend in directions crossing the longer-side direction (X direction), and is given a continuous (annular), substantially rhombic shape. The elevated portion 571 is so arranged that the diagonal lines of the substantially rhombic shape are parallel to the longer sides 70b and the shorter sides 70a respectively.

Moreover, as shown in FIG. 40, as a result of the elevated portion 571 being formed, on the side (face) of the first plate member 70 opposite from the projecting side, a depressed portion 572 is formed. This depressed portion 572 serves as a cavity portion 573 for storing refill non-aqueous electrolyte liquid LQ (see FIG. 24). Moreover, the depressed portion 572 is formed so as to have, when the first plate member 70 is seen from the side opposite from the projecting side, the shape of a groove. As shown in FIG. 39, the depressed portion 572 is given an opening with a5 (the cavity portion 573 is given a width a5) of, for example, about 8 mm.

In other respects, the structure of the lid plate 90 in Embodiment 5 is similar to that in Embodiment described previously. The benefits of Embodiment 5 are similar to those of Embodiment 1 described previously.

Embodiment 6

Figure 41:
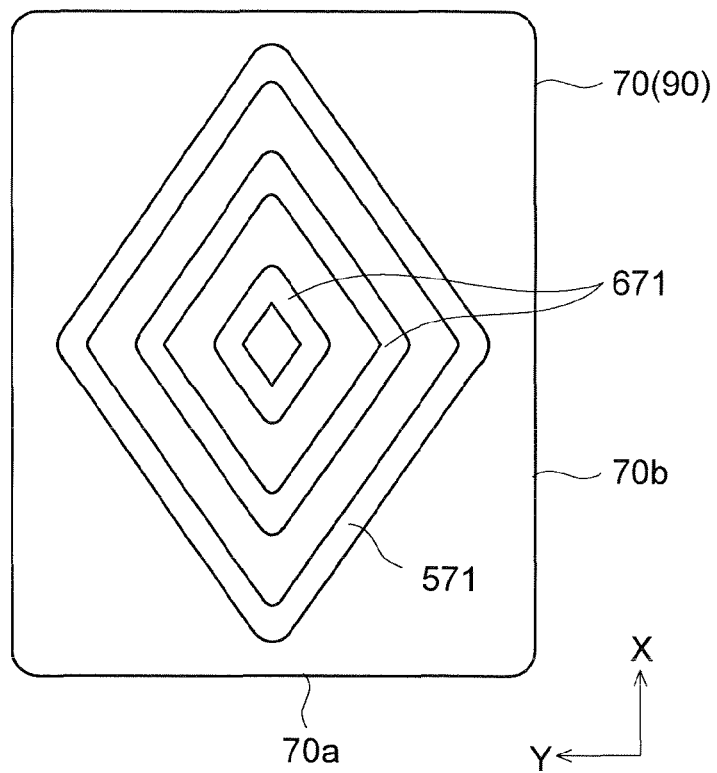
FIG. 41 is a plan view of a first plate member of a lid plate in a lithium-ion secondary battery according to Embodiment 6 of the invention.
Figure 42:
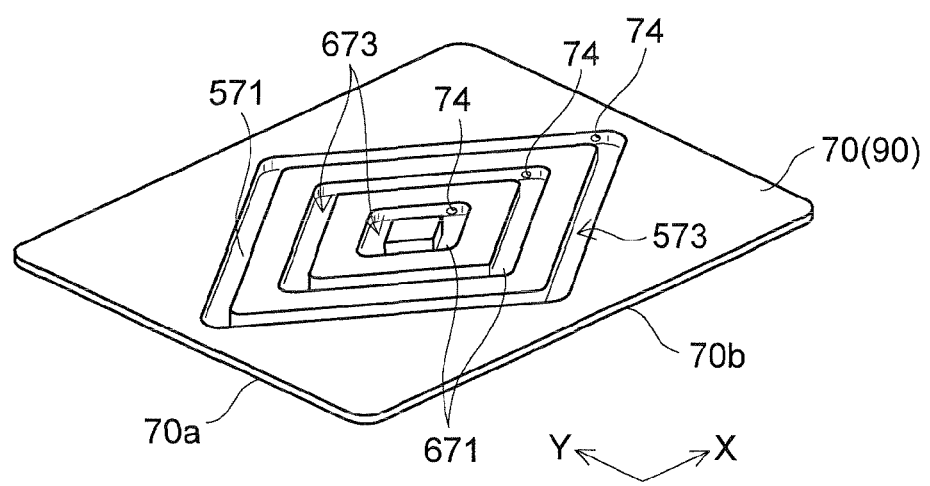
FIG. 42 is a perspective view of the first plate member of the lid plate in the lithium-ion secondary battery according to Embodiment 6 of the invention.

FIG. 41 is a plan view of a first plate member in a lid plate of a lithium-ion secondary battery according to a sixth embodiment (Embodiment 6) of the invention. FIG. 42 is a perspective view of the first plate member in the lid plate of the lithium-ion secondary battery according to Embodiment 6 of the invention. FIG. 41 is a plan view of the first plate member as seen from the bottom side (the side at which elevated portions project), and FIG. 42 is a perspective view of the first plate member as seen from the top side (the side opposite from the side at which the elevated portions project). Next, with reference to FIGS. 24, 41, and 42, the lithium-ion secondary battery according to Embodiment 6 of the invention will be described. In Embodiment 6, the construction is similar to that in Embodiment 1 described previously except for the elevated portions on the lid plate, and therefore no overlapping description will be repeated.

In Embodiment 6, as show in FIGS. 41 and 42, in addition to the construction of Embodiment 5 described previously, further elevated portions 671 are formed that have geometrically similar shapes to that of the elevated portion 571. That is, in Embodiment 6, as compared with Embodiment 5 described previously, the first plate member 70 has more elevated portions (elevated portions 571 and 671) formed on it. In Embodiment 6, by increasing the number of elevated portions formed on the lid plate 90 (first plate member 70) in this way, it is possible to further increase the rigidity of the lid plate 90. In addition, it is possible to store refill non-aqueous electrolyte liquid LQ (see FIG. 24) in each of the cavity portions 573 and 673 provided as a result of the elevated portions 571 and 671 being formed. Thus, it is possible to further improve charge-discharge cycle characteristics than with the construction of Embodiment 5.

In the geometrically similarly shaped elevated portions 671, the cavity portions 673 are given the same width and depth as the elevated portions 571.

In other respects, the structure of the lid plate 90 in Embodiment 6 is similar to that in Embodiments 1 and 5 described previously. The benefits of Embodiment 6 are similar to those of Embodiments 1 and 5 described previously.

Embodiment 7

Figure 43:
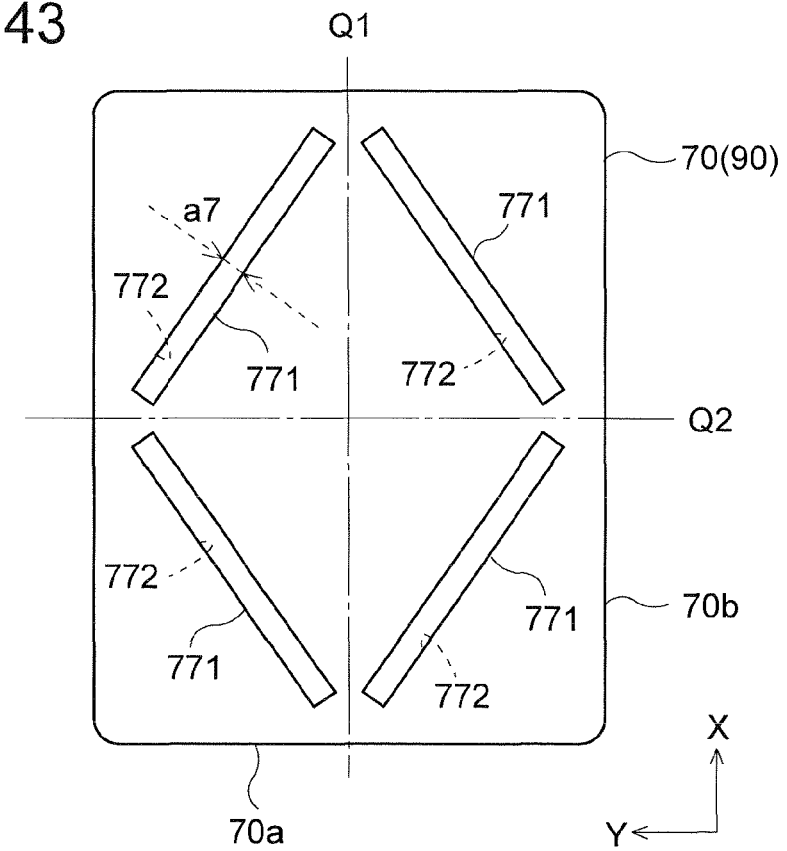
FIG. 43 is a plan view of a first plate member of a lid plate in a lithium-ion secondary battery according to Embodiment 7 of the invention.
Figure 44:
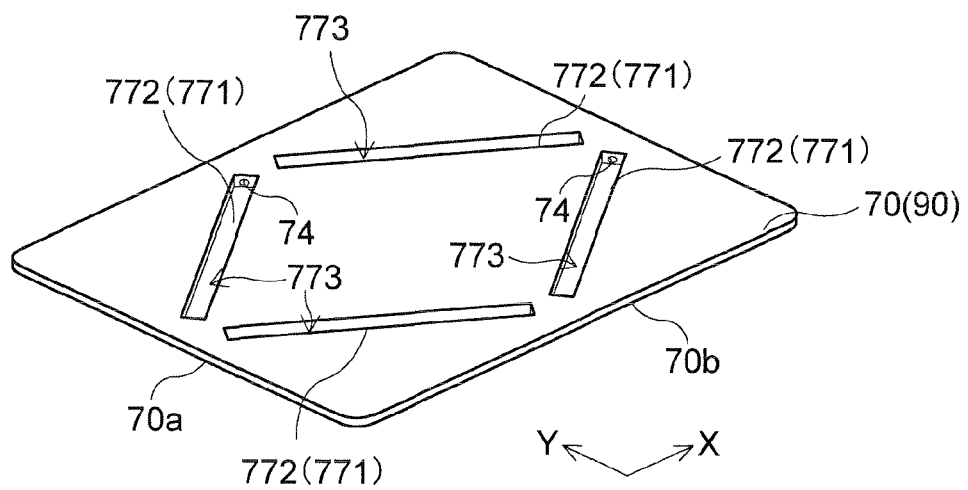
FIG. 44 is a perspective view of the first plate member of the lid plate in the lithium-ion secondary battery according to Embodiment 7 of the invention.

FIG. 43 is a plan view of a first plate member in a lid plate of a lithium-ion secondary battery according to a seventh embodiment (Embodiment 7) of the invention. FIG. 44 is a perspective view of the first plate member in the lid plate of the lithium-ion secondary battery according to Embodiment 7 of the invention. FIG. 43 is a plan view of the first plate member as seen from the bottom side (the side at which elevated portions project), and FIG. 44 is a perspective view of the first plate member as seen from the top side (the side opposite from the side at which the elevated portions project). Next, with reference to FIGS. 24, 43, and 44, the lithium-ion secondary battery according to Embodiment 7 of the invention will be described. In Embodiment 7, the construction is similar to that in Embodiment 1 described previously except for the elevated portions on the lid plate, and therefore no overlapping description will be repeated.

In Embodiment 7, as shown in FIGS. 43 and 44, the first plate member 70 of the lid plate 90 has four elevated portions 771 formed on it. These four elevated portions 771 are so formed as to extend in directions crossing the longer-side direction (X direction), and is so formed as to describe a substantially rhombic shape as a whole. The four elevated portions 771 are so located as to be, for example, symmetric about the dash-and-dot line Q1 drawn parallel to the longer sides 70b (for example, the center line in the shorter-side direction (Y direction)) and symmetric about the dash-and-dot line Q2 drawn parallel to the shorter sides 70a (for example, the center line in the longer-side direction (X direction)).

Moreover, as a result of the elevated portions 771 being formed, on the side (face) of the first plate member 70 opposite from the projecting side, depressed portions 772 are formed. These depressed portions 772 serve as cavity portions 773 for storing refill non-aqueous electrolyte liquid LQ (see FIG. 24). The depressed portions 772 are so formed as to have, when the first plate member 70 is seen from its side opposite from the projecting side, the shape of grooves. As shown in FIG. 43, the depressed portions 772 are given an opening with a7 (the cavity portions 773 are given a width a7) of, for example, about 8 mm.

In other respects, the structure of the lid plate 90 in Embodiment 7 is similar to that in Embodiment 1 described previously. The benefits of Embodiment 7 are similar to those of Embodiment 1 described previously.

Embodiment 8

Figure 45:
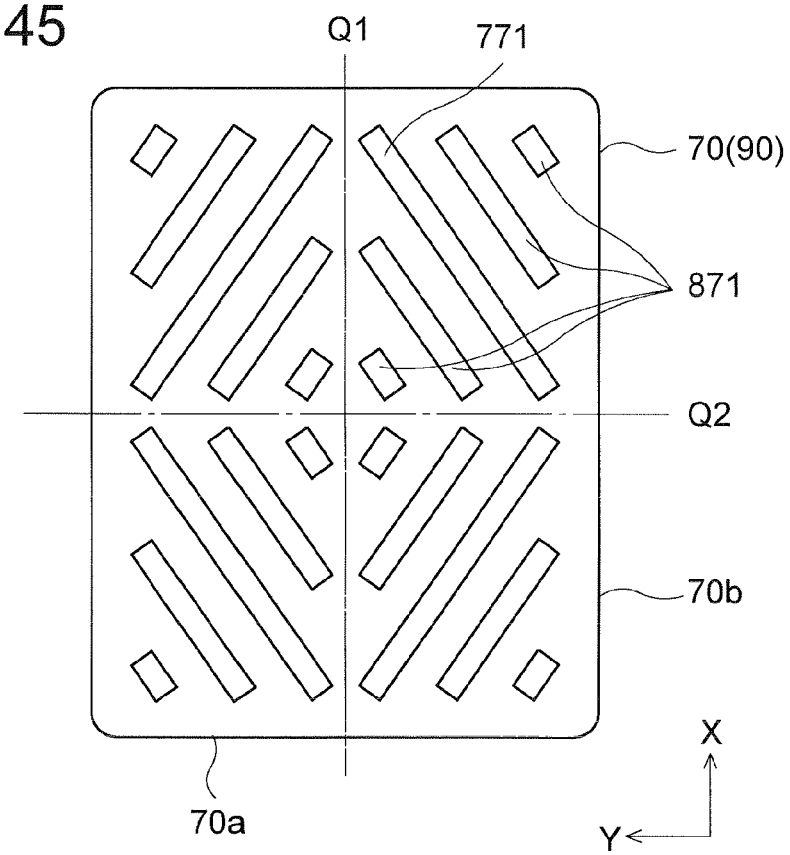
FIG. 45 is a plan view of a first plate member of a lid plate in a lithium-ion secondary battery according to Embodiment 8 of the invention.
Figure 46:
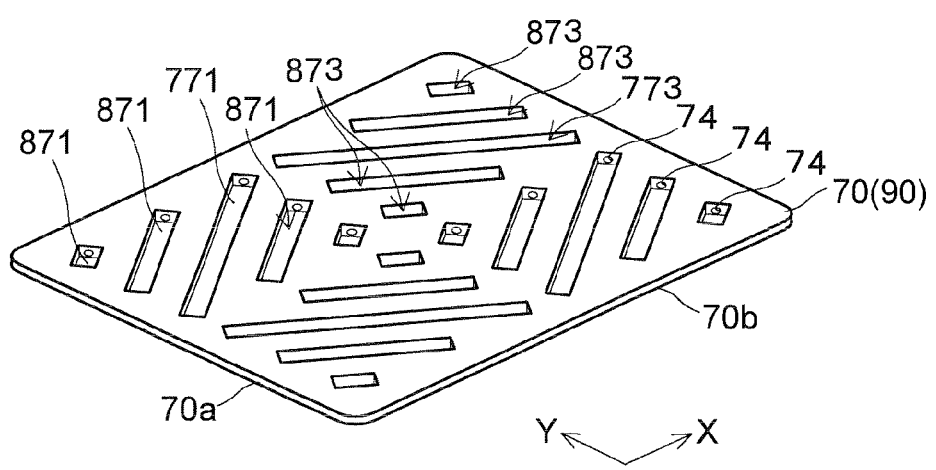
FIG. 46 is a perspective view of the first plate member of the lid plate in the lithium-ion secondary battery according to Embodiment 8 of the invention.

FIG. 45 is a plan view of a first plate member in a lid plate of a lithium-ion secondary battery according to an eighth embodiment (Embodiment 8) of the invention. FIG. 46 is a perspective view of the first plate member in the lid plate of the lithium-ion secondary battery according to Embodiment 8 of the invention. FIG. 45 is a plan view of the first plate member as seen from the bottom side (the side at which elevated portions project), and FIG. 46 is a perspective view of the first plate member as seen from the top side (the side opposite from the side at which the elevated portions project). Next, with reference to FIGS. 24, 45, and 46, the lithium-ion secondary battery according to Embodiment 8 of the invention will be described. In Embodiment 8, the construction is similar to that in Embodiment 1 described previously except for the elevated portions on the lid plate, and therefore no overlapping description will be repeated.

In Embodiment 8, as shown in FIGS. 45 and 46, in addition to the construction of Embodiment 7 described previously, further elevated portions 871 are formed that have geometrically similar shapes to that of the elevated portions 771. That is, in Embodiment 8, as compared with Embodiment 7 described previously, the first plate member 70 has more elevated portions (elevated portions 771 and 871) formed on it. In Embodiment 8, by increasing the number of elevated portions formed on the lid plate 90 (first plate member 70) in this way, it is possible to further increase the rigidity of the lid plate 90. In addition, it is possible to store refill non-aqueous electrolyte liquid LQ (see FIG. 24) in each of the cavity portions 773 and 873 provided as a result of the elevated portions 771 and 871 being formed. Thus, it is possible to further improve charge-discharge cycle characteristics than with the construction of Embodiment 7.

In the geometrically similarly shaped elevated portions 871, the cavity portions 873 are given the same width and depth as the elevated portions 771.

In other respects, the structure of the lid plate 90 in Embodiment 8 is similar to that in Embodiments 1 and 7 described previously. The benefits of Embodiment 8 are similar to those of Embodiments 1 and 7 described previously.

Embodiment 9

Figure 47:
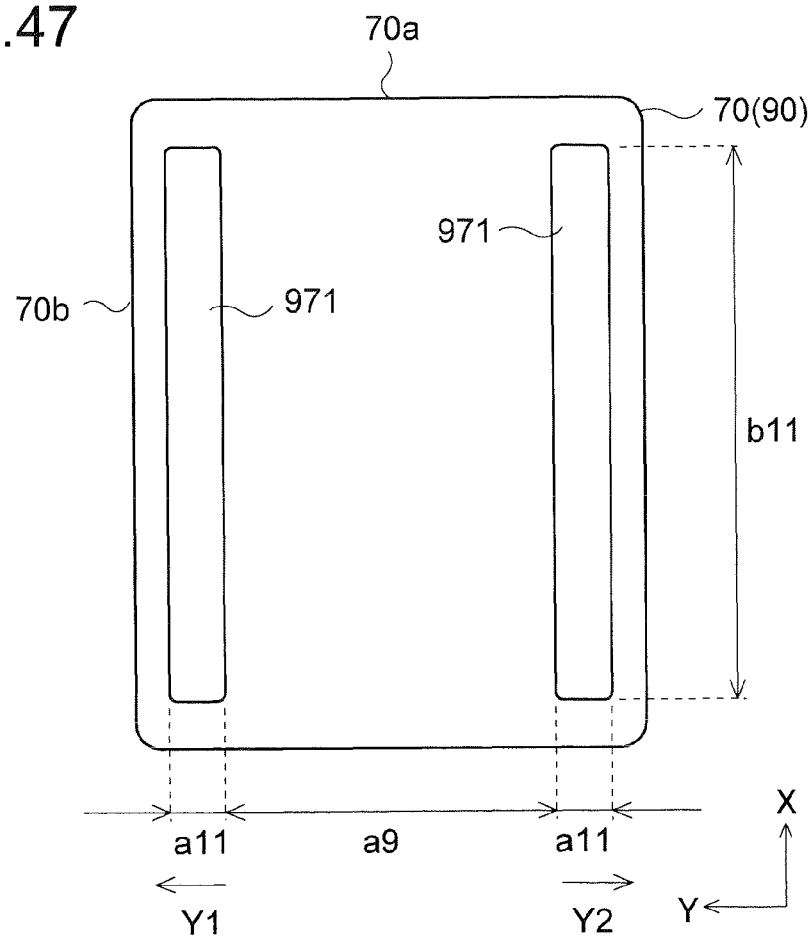
FIG. 47 is a plan view of a first plate member of a lid plate in a lithium-ion secondary battery according to Embodiment 9 of the invention.
Figure 48:
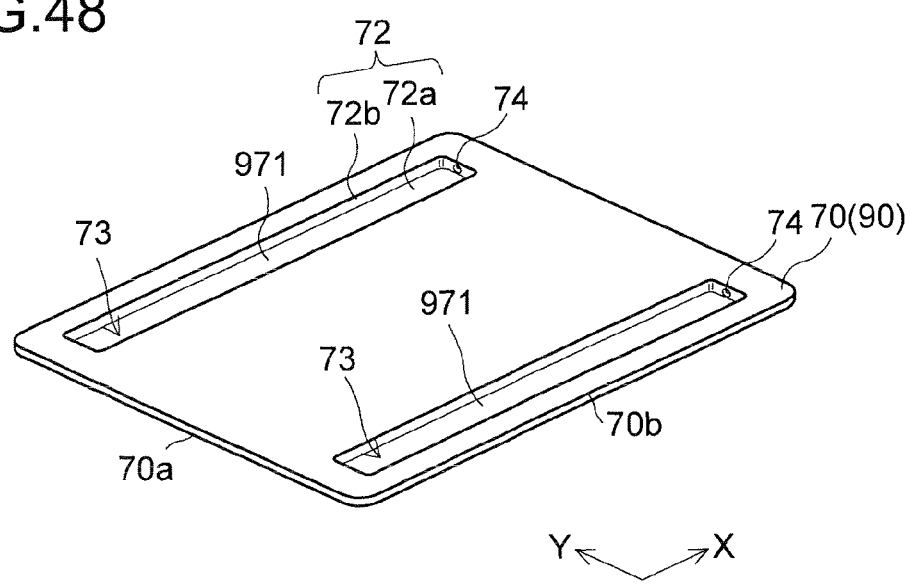
FIG. 48 is a perspective view of the first plate member of the lid plate in the lithium-ion secondary battery according to Embodiment 9 of the invention.

FIG. 47 is a plan view of a first plate member in a lid plate of a lithium-ion secondary battery according to a ninth embodiment (Embodiment 9) of the invention. FIG. 48 is a perspective view of the first plate member in the lid plate of the lithium-ion secondary battery according to Embodiment 9 of the invention. FIG. 47 is a plan view of the first plate member as seen from the bottom side (the side at which elevated portions project), and FIG. 48 is a perspective view of the first plate member as seen from the top side (the side opposite from the side at which the elevated portions project). Next, with reference to FIGS. 14, 47, and 48, the lithium-ion secondary battery according to Embodiment 9 of the invention will be described. In Embodiment 9, the construction is similar to that in Embodiment 1 described previously except for the elevated portions on the lid plate, and therefore no overlapping description will be repeated.

In Embodiment 9, as shown in FIGS. 47 and 48, the first plate member 70 of the lid plate 90 has two elevated portions 971 formed on it that extend in the longer-side direction (X direction). These two elevated portions 971 have a shape similar to that of the elevated portions 71 (see FIG. 14) in Embodiment 1 described previously, and are arranged parallel to each other. Of the two elevated portions 971, one is arranged at one end (Y1 end) in the shorter-side direction (Y direction) and the other is arranged at the other end (Y2 end) in the shorter-side direction (Y direction). The elevated portions 971 are disposed at a distance a9 of, for example, about 102 mm from each other.

In other respects, the structure of the lid plate 90 in Embodiment 9 is similar to that in Embodiment 1 described previously. The benefits of Embodiment 9 are similar to those of Embodiment 1 described previously.

Embodiment 10

Figure 49:
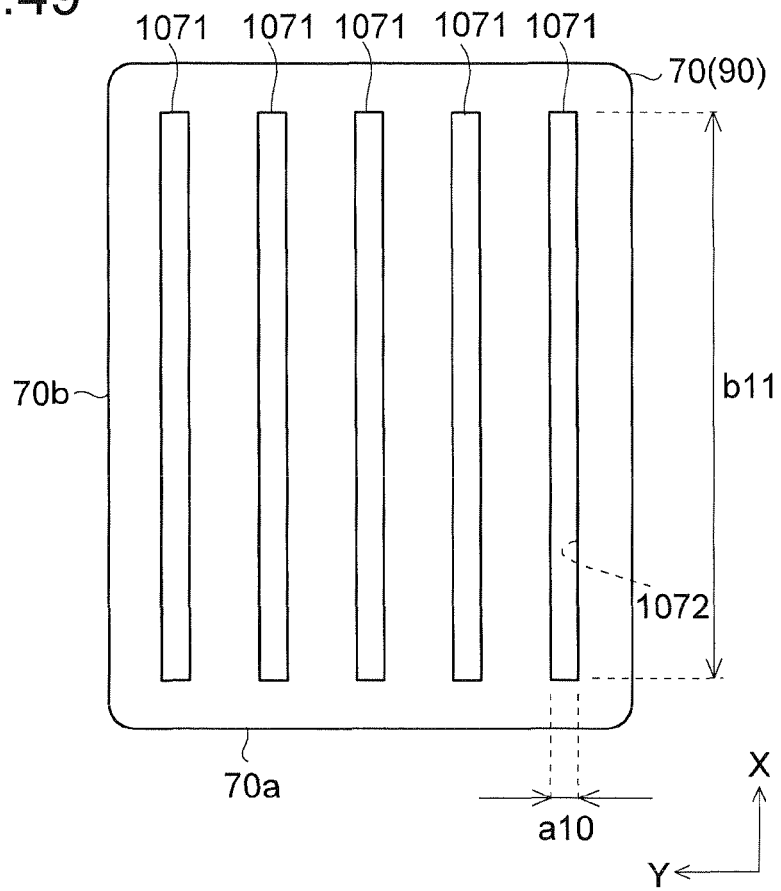
FIG. 49 is a plan view of a first plate member of a lid plate in a lithium-ion secondary battery according to Embodiment 10 of the invention.
Figure 50:
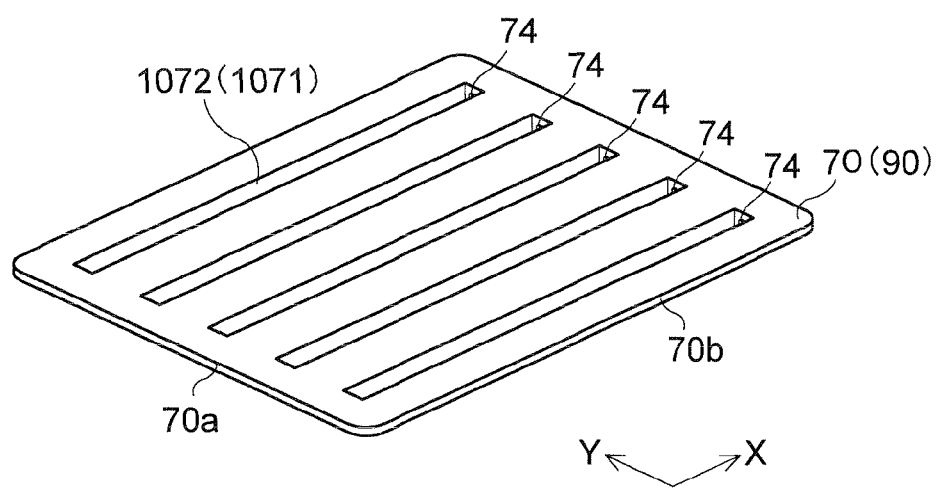
FIG. 50 is a perspective view of the first plate member of the lid plate in the lithium-ion secondary battery according to Embodiment 10 of the invention.

FIG. 49 is a plan view of a first plate member in a lid plate of a lithium-ion secondary battery according to a tenth embodiment (Embodiment 10) of the invention. FIG. 50 is a perspective view of the first plate member in the lid plate of the lithium-ion secondary battery according to Embodiment 10 of the invention. FIG. 49 is a plan view of the first plate member as seen from the bottom side (the side at which elevated portions project), and FIG. 50 is a perspective view of the first plate member as seen from the top side (the side opposite from the side at which the elevated portions project). Next, with reference to FIGS. 14, 49, and 50, the lithium-ion secondary battery according to Embodiment 10 of the invention will be described. In Embodiment 10, the construction is similar to that in Embodiment 1 described previously except for the elevated portions on the lid plate, and therefore no overlapping description will be repeated.

In Embodiment 10, as shown in FIGS. 49 and 50, the first plate member 70 of the lid plate 90 has five elevated portions 1071 formed on it that extend in the longer-side direction (X direction). These five elevated portions 1071 are so formed that the depressed portions have a width (the elevated portions have a width) smaller than that of the elevated portions 71 (see FIG. 14) in Embodiment 1 described previously. Specifically, in the elevated portions 1071, the depressed portions 1072 are given a width a10 of, for example, about 6 mm.

In other respects, the structure of the lid plate 90 in Embodiment 10 is similar to that in Embodiment 1 described previously. The benefits of Embodiment 10 are similar to those of Embodiment 1 described previously.

Embodiment 11

Figure 51:
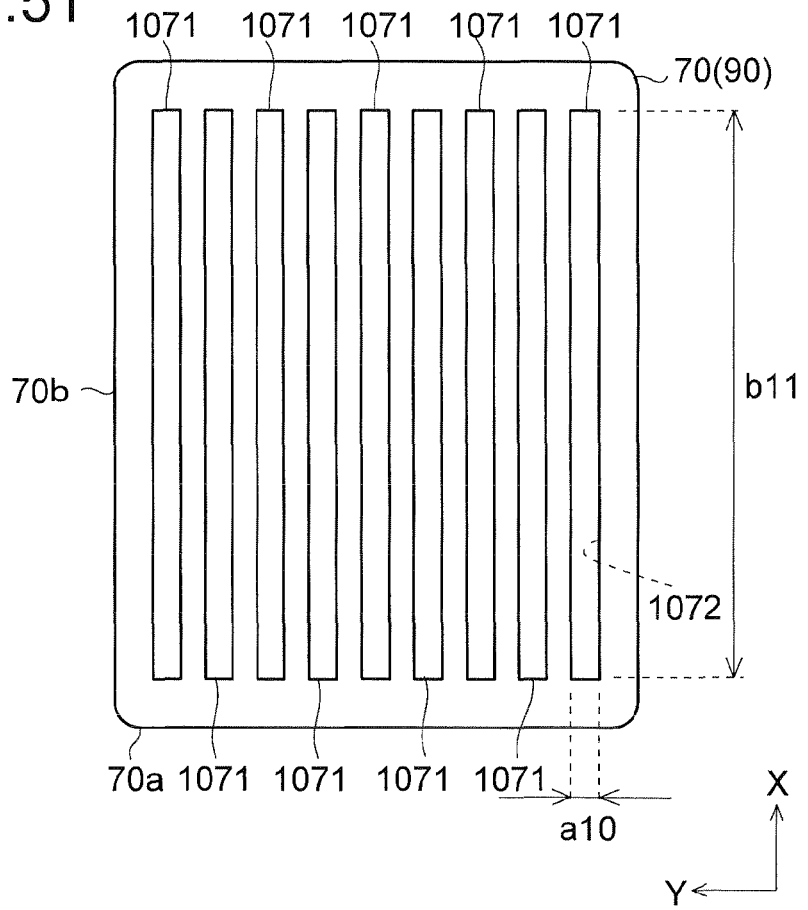
FIG. 51 is a plan view of a first plate member of a lid plate in a lithium-ion secondary battery according to Embodiment 11 of the invention.
Figure 52:
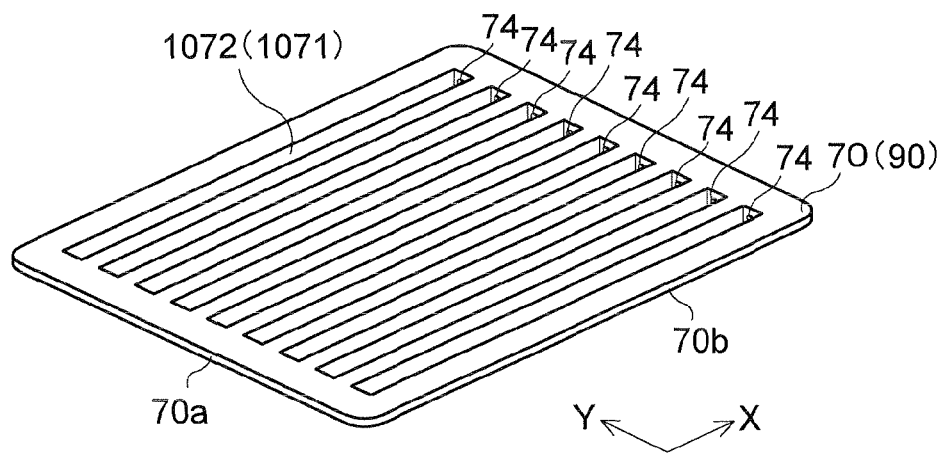
FIG. 52 is a perspective view of the first plate member of the lid plate in the lithium-ion secondary battery according to Embodiment 11 of the invention.

FIG. 51 is a plan view of a first plate member in a lid plate of a lithium-ion secondary battery according to an eleventh embodiment (Embodiment 11) of the invention. FIG. 52 is a perspective view of the first plate member in the lid plate of the lithium-ion secondary battery according to Embodiment 11 of the invention. FIG. 51 is a plan view of the first plate member as seen from the bottom side (the side at which elevated portions project), and FIG. 52 is a perspective view of the first plate member as seen from the top side (the side opposite from the side at which the elevated portions project). Next, with reference to FIGS. 51 and 52, the lithium-ion secondary battery according to Embodiment 11 of the invention will be described. In Embodiment 11, the construction is similar to that in Embodiment 1 described previously except for the elevated portions on the lid plate, and therefore no overlapping description will be repeated.

In Embodiment 11, as shown in FIGS. 51 and 52, in addition to the construction of Embodiment 10 described previously, further similar elevated portions 1071 are formed between adjacent elevated portions 1071. Thus, in Embodiment 11, nine elevated portions 1071 are formed so as to extend in the longer-side direction (X direction). The nine elevated portions 1071 are arranged at equal intervals in the shorter-side direction (Y direction).

In other respects, the structure of the lid plate 90 in Embodiment 11 is similar to that in Embodiments 1 and 10 described previously. The benefits of Embodiment 11 are similar to those of Embodiment 1 described previously.

Embodiment 12

Figure 53:
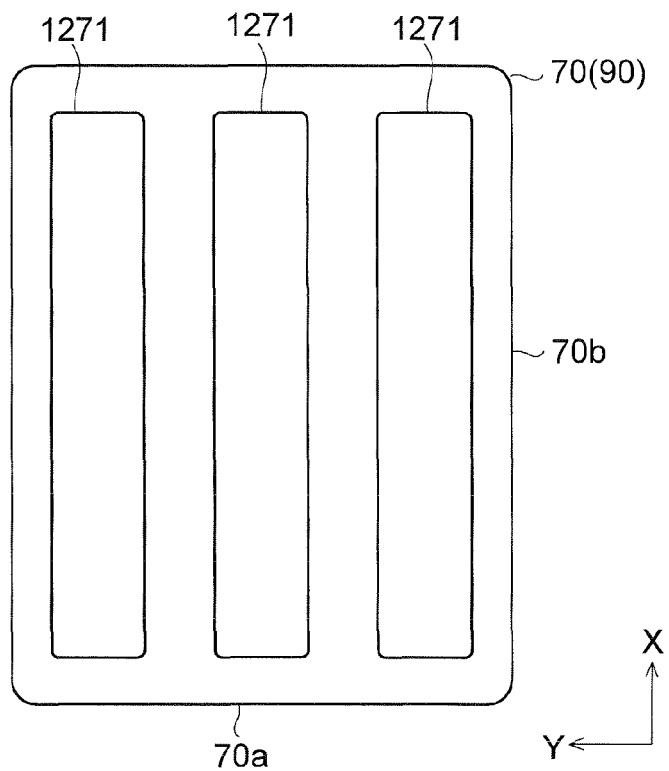
FIG. 53 is a plan view of a first plate member of a lid plate in a lithium-ion secondary battery according to Embodiment 12 of the invention.
Figure 54:
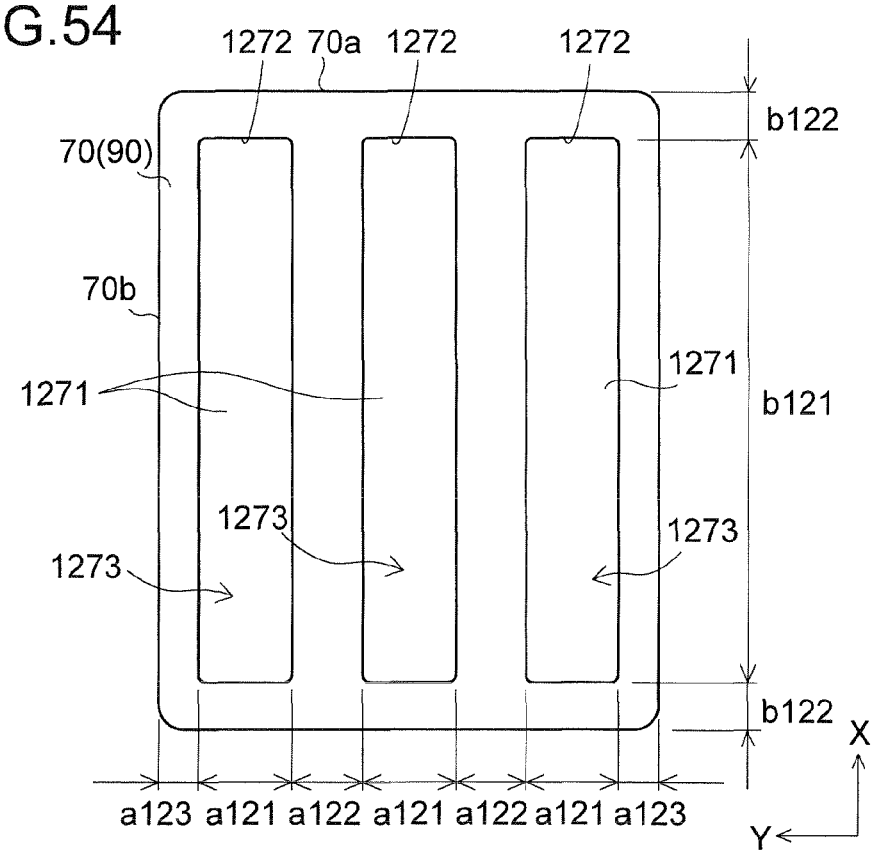
FIG. 54 is a plan view of the first plate member of the lid plate in the lithium-ion secondary battery according to Embodiment 12 of the invention.
Figure 55:
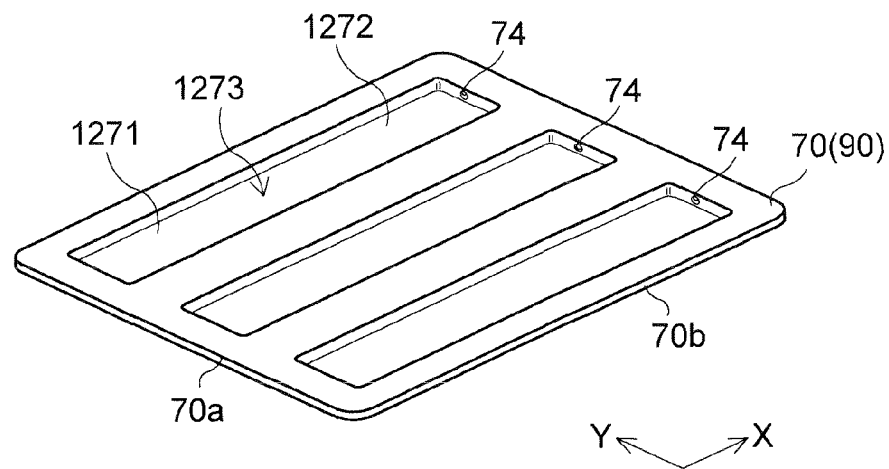
FIG. 55 is a perspective view of the first plate member of the lid plate in the lithium-ion secondary battery according to Embodiment 12 of the invention.

FIGS. 53 and 54 are plan views of a first plate member in a lid plate of a lithium-ion secondary battery according to a twelfth embodiment (Embodiment 12) of the invention. FIG. 55 is a perspective view of the first plate member in the lid plate of the lithium-ion secondary battery according to Embodiment 12 of the invention. FIG. 53 is a plan view of the first plate member as seen from the bottom side (the side at which elevated portions project), and FIGS. 54 and 55 are a plan view and a perspective view, respectively, of the first plate member as seen from the top side (the side opposite from the side at which the elevated portions project). Next, with reference to FIGS. 53 to 55, the lithium-ion secondary battery according to Embodiment 12 of the invention will be described. In Embodiment 12, the construction is similar to that in Embodiment 1 described previously except for the elevated portions on the lid plate, and therefore no overlapping description will be repeated.

In Embodiment 12, as shown in FIGS. 53 to 55, the first plate member 70 of the lid plate 90 has three elevated portions 1271 formed on it that extend in the longer-side direction (X direction), parallel to one another. As shown in FIG. 54, these three elevated portions 1271 are so formed that, on its side opposite from the projecting side, depressed portions 1272 each have a width a121 of about 30 mm; these have, in the longer-side direction (X direction), a length b121 of, for example, about 200 mm as in Embodiment 1 described previously.

Moreover, the elevated portions 1271 are so formed that the depressed portions 1272 are arranged at equal intervals of, for example, about 24 mm in the shorter-side direction (Y direction). Thus, the elevated portions 1271 (depressed portions 1272) are so formed as to have, when the first plate member 70 is seen from its side opposite from the projecting side, the shape of grooves. Furthermore, the distance b122 from the shorter sides 70a of the first plate member 70 to the depressed portions 1272 is, for example, about 10 mm, and the distance a123 from the longer sides 70b of the first plate member 70 to the depressed portions 1272 is, for example, about 10 mm.

Moreover, the elevated portions 1271 are so formed that the depressed portions 1272 formed on the side (face) opposite from its projecting side have a depth of, for example, about 5 mm.

In other respects, the structure of the lid plate 90 in Embodiment 12 is similar to that in Embodiment 1 described previously. The benefits of Embodiment 12 are similar to those of Embodiment 1 described previously.

Next, a description will be given of experiments conducted to verify the effects of the embodiments described above.

In these experiments, to verify the effect of improving the rigidity of the lid plate brought about by the formation of the elevated portion, pressure resistance tests were done with respect to the package container. In addition, to verify the effect of improving battery characteristics, charge-discharge cycle tests were done as well.

For pressure resistance tests, package containers with neither an electrode assembly nor non-aqueous electrolyte liquid sealed in them were fabricated, and they were exposed to internal pressure with gaseous nitrogen. Package containers with a lid plate (first plate member) having an elevated portion formed on it were taken as practical examples, and package containers with a lid plate (first plate member) having no elevated portion formed on it were taken as a comparative example. The practical and comparative examples were fabricated so that they were the same except whether the lid plate (first plate member) has an elevated portion or not.

In both the practical and comparative examples, the package can was formed so as to have a shorter-side-direction length of 150 mm, a longer-side direction length of 30 mm, and a depth of 40 mm. The flange of the package can had a width of 5 mm. The lid plate was formed by bonding together the first and second plate members by laser pulse welding. The first plate member of the lid plate was formed so as to have a longer-side direction length of 308 mm and a shorter-side direction length of 158 mm; the second plate member of the lid plate was formed so as to have a longer-side direction length of 306 mm and a shorter-side direction length of 156 mm. The package can and the lid plate (the first and second plate members) were formed of a plate of stainless steel (JIS SUS 304) with a thickness of about 1.0 mm.

In the practical examples, the package container was prepared in five types with differently shaped elevated portions on the depressed portion, and the resulting different practical examples are referred to as Practical Examples 1 to 5 respectively.

PRACTICAL EXAMPLE 1

Figure 56:
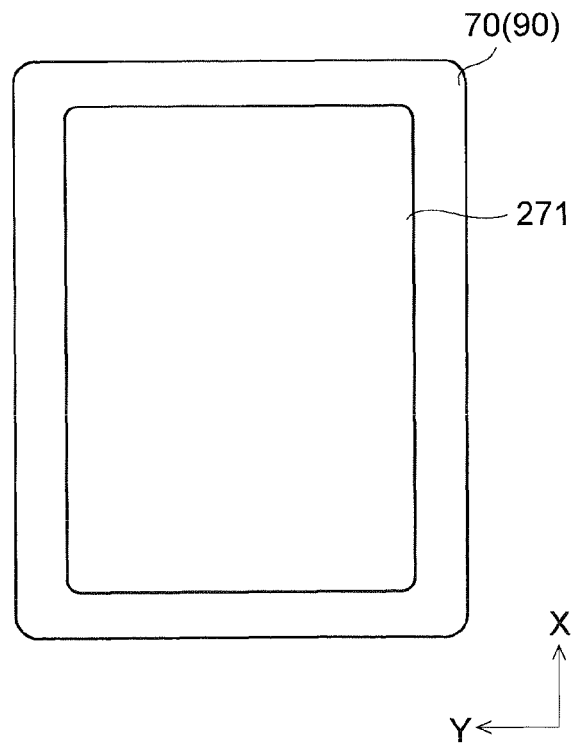
FIG. 56 is a plan view of a lid plate (first plate member) in Practical Example 1.

In Practical Example 1, as shown in FIG. 56, an elevated portion 271 like the one in Embodiment 2 described previously was formed on the lid plate 90 (first plate member 70).

PRACTICAL EXAMPLE 2

Figure 57:
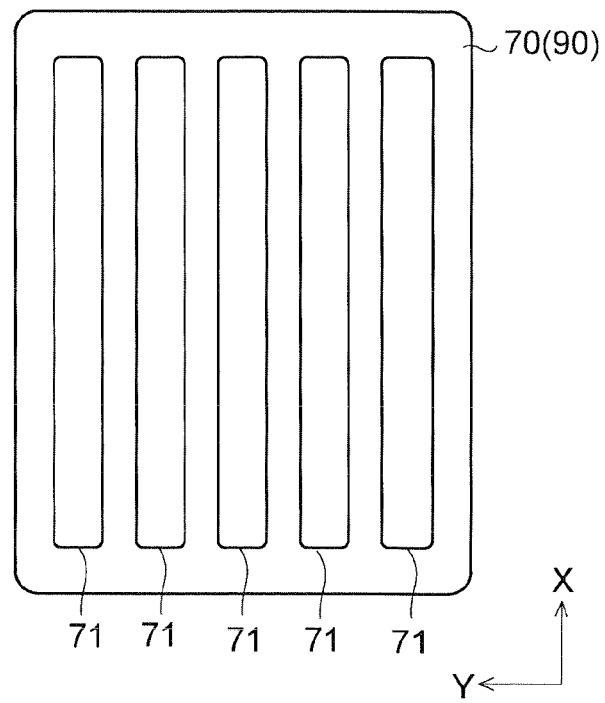
FIG. 57 is a plan view of a lid plate (first plate member) in Practical Example 2.

In Practical Example 2, as shown in FIG. 57, elevated portions 71 like those in Embodiment 1 described previously were formed on the lid plate 90 (first plate member 70).

PRACTICAL EXAMPLE 3

Figure 58:
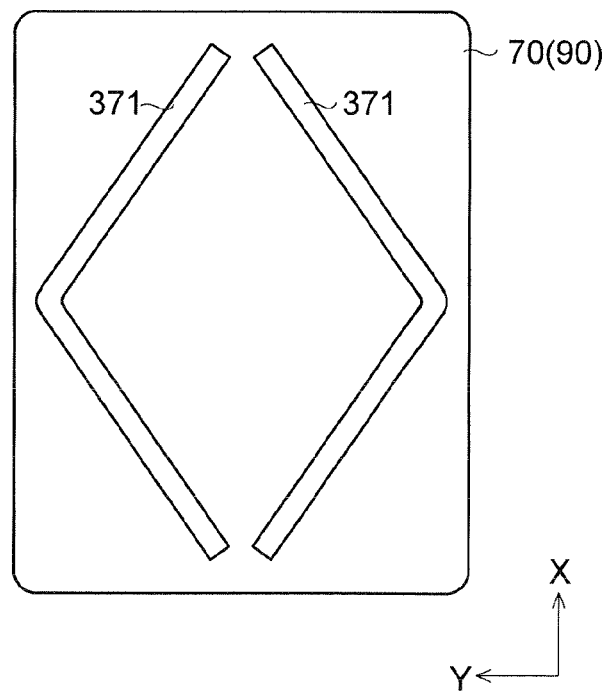
FIG. 58 is a plan view of a lid plate (first plate member) in Practical Example 3.

In Practical Example 3, as shown in FIG. 58, elevated portions 371 like those in Embodiment 3 described previously were formed on the lid plate 90 (first plate member 70).

PRACTICAL EXAMPLE 4

Figure 59:
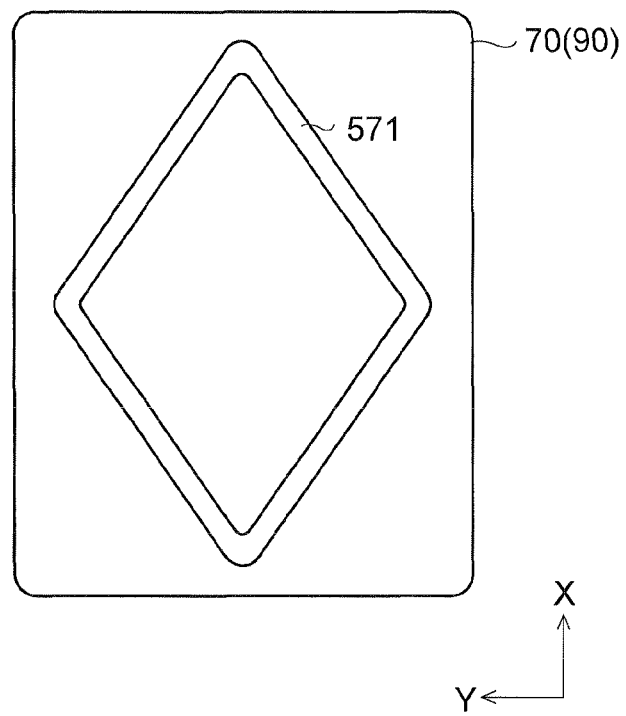
FIG. 59 is a plan view of a lid plate (first plate member) in Practical Example 4.

In Practical Example 4, as shown in FIG. 59, elevated portions 571 like those in Embodiment 5 described previously were formed on the lid plate 90 (first plate member 70).

PRACTICAL EXAMPLE 5

Figure 60:
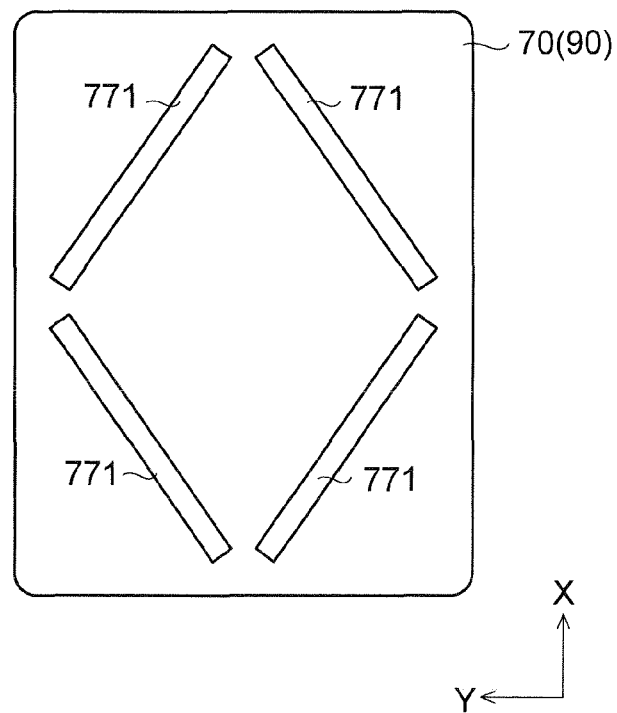
FIG. 60 is a plan view of a lid plate (first plate member) in Practical Example 5.

In Practical Example 5, as shown in FIG. 60, elevated portions 771 like those in Embodiment 7 described previously were formed on the lid plate 90 (first plate member 70).

COMPARATIVE EXAMPLE

Figure 61:
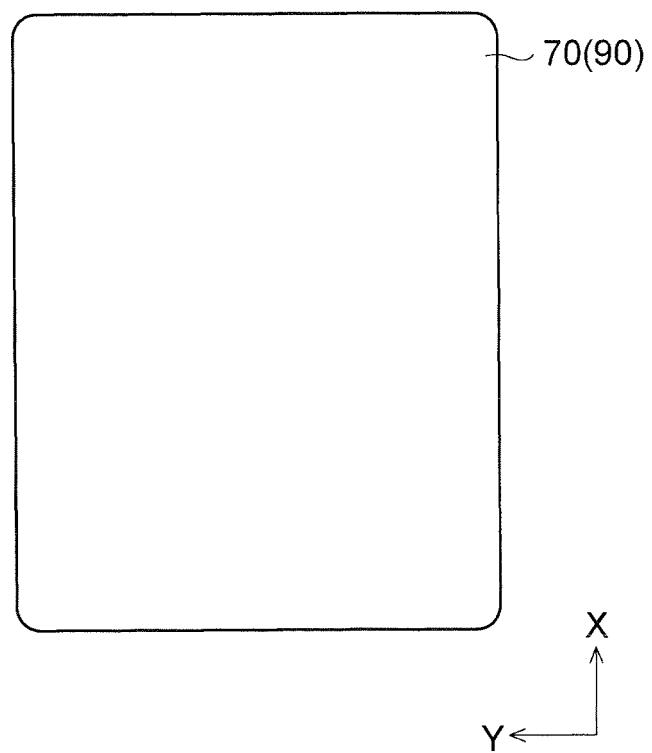
FIG. 61 is a plan view of a lid plate (first plate member) in Comparative Example.

In Comparative Example, as shown in FIG. 61, the lid plate 90 (first plate member 70) had no elevated portion formed on it. Also in Comparative Example, as in Practical Examples 1 to 5, the lid plate was formed by bonding together a first and a second plate member.

Moreover, in the package can, the electrode terminal parts (the positive and negative terminal parts) and the safety valve part were laser-sealed so that no leakage occurred through those parts. Then the lid plate was welded to the package can by laser pulse welding, and in this way the lid plates of Practical Examples 1 to 5 and Comparative Example were fabricated. In Practical Examples 1 to 5 and Comparative Example, the lid plate was fabricated by filet-welding together the first and second plate members. The conditions for welding together the package can and the lid plate and for welding together the first and second plate members were all the same in Practical Examples 1 to 5 and Comparative Example. A difference was that, in the practical examples (Practical Examples 2 to 5), the first and second plate members were welded together not only by fillet welding but also by lap welding. Another difference was that, in the practical examples (Practical Examples 1 to 5), a hole was formed in the elevated portion(s) (with no sealing stopper).

In this way, five each of the package containers of Practical Examples 1 to 5 and Comparative Example were fabricated, and were subjected to pressure resistance tests. Specifically, they were pressurized with gaseous nitrogen introduced into them through the filling hole for filling the non-aqueous electrolyte liquid, and the pressure at which the gaseous nitrogen leaked through the welded part between the package can and the lid plate was measured. The pressure at that time was taken as the destruction pressure. The results are shown in Table 1.

TABLE 1

|  | Destruction Pressure |
| --- | --- |
| Practical Example 1 | 6.2 kg/cm$^2$ |
| Practical Example 2 | 8.4 kg/cm$^2$ |
| Practical Example 3 | 7.7 kg/cm$^2$ |
| Practical Example 4 | 7.5 kg/cm$^2$ |
| Practical Example 5 | 7.1 kg/cm$^2$ |
| Comparative Example | 5.6 kg/cm$^2$ |

As shown in Table 1 above, Practical Examples 1 to 5, in which the lid plate (first plate member) had an elevated portion formed on it, exhibited destruction pressures higher than Comparative Example, in which no elevated portion was formed. Specifically, whereas Comparative Example exhibited a destruction pressure of 5.6 kg/cm$^2$, Practical Examples 1 to 5 exhibited destruction pressures of 6.2 kg/cm$^2$, 8.4 kg/cm$^2$, 7.7 kg/cm$^2$, 7.5 kg/cm$^2$, and 7.1 kg/cm$^2$ respectively. That is, Practical Examples 1 to 5 exhibited about 10% to 50% higher destruction pressures than Comparative Example.

The above results indicate that the lid plate was welded more appropriately in Practical Examples 1 to 5 than in Comparative Example, resulting in suppressed strain in the former. This shows that, by forming an elevated portion on the lid plate, it is possible to improve the rigidity of the lid plate.

Among Practical Examples 1 to 5, Practical Example 2, in which a plurality of elevated portions were formed so as to extend in the longer-side direction, exhibited the highest destruction pressure, and Practical Example 1, in which a single elevated portion with a comparatively large area was formed, exhibited the lowest destruction pressure. Practical Examples 3 to 5, in which elevated portions were formed in a rhombic shape (so as to extend in directions crossing the longer-side direction), exhibited approximately the same destruction pressures. These results are considered to stem from differences in the number, arrangement, etc. of the elevated portions. Moreover, the results in Table 1 are considered to suggest that, from the viewpoint of increasing the rigidity of the lid plate, it is better to form elevated portions so that they extend in the longer-side direction or in directions crossing the longer-side direction, than to form a single elevated portion with a comparatively large area.

The destruction pressure has only to be higher than the working pressure of the safety valve. With consideration given to unpredictable situations as in case the safety valve does not work, however, it is preferable to use a package container with a higher destruction pressure.

Next, the charge-discharge cycle tests will be described.

In the charge-discharge cycle tests, by use of package containers similar to those subjected to the pressure resistance tests described above (the package containers of Practical Examples 1 to 5 and Comparative Example), lithium-ion secondary batteries of Practical Examples 1 to 5 and Comparative Example were fabricated. Here, however, the package cans used were provided with electrode terminals and a safety valve. The lithium-ion secondary batteries fabricated were subjected to characteristics evaluation. How the electrode assembly was fabricated, the non-aqueous electrolyte liquid was prepared, and the secondary battery was assembled was as follows.

Processes Common to Practical Examples 1 to 5 and Comparative Example

Fabrication of the Positive Electrodes 90 parts by weight of $LiFePO_4$ as an active material, 5 parts by weight of acetylene black as a conductive agent, and 5 parts by weight of polyvinylidene fluoride as a binding agent were blended, and then an adequate amount of N-methyl-2-pyrrolidone was added to and dispersed in the blend; in this way, a positive electrode composite agent slurry was prepared. Next, the positive electrode composite agent slurry was applied evenly to both sides of a charge collector (positive electrode charge collector) of aluminum with a thickness of 20 μm, and was then dried; thereafter, the product was compressed on a roll press so as to have a thickness of 200 μm. Lastly, the product was cut to the desired size; in this way, a positive electrode (positive electrode plate) for Practical Examples 1 to 5 and Comparative Example was fabricated. The size of the region over which the positive electrode active material layer was applied was 140 mm vertically by 235 mm horizontally, the size of the positive electrode (positive electrode charge collector) was 140 mm vertically by 250 mm horizontally.

Fabrication of the Negative Electrode 90 parts by weight of natural graphite (natural graphite occurring in China) and 10 parts by weight of polyvinylidene fluoride were blended, and then an adequate amount of N-methyl-2-pyrrolidone was added to and dispersed in the blend; in this way, a negative electrode composite agent slurry was prepared. Next, the negative electrode composite agent slurry was applied evenly to both sides of a charge collector (negative electrode charge collector) of copper with a thickness of 16 μm, and was then dried; thereafter, the product was compressed on a roll press so as to have a thickness of 200 μm. Lastly, the product was cut to the desired size; in this way, a negative electrode (negative electrode plate) for Practical Examples 1 to 5 and Comparative Example was fabricated. The size of the region over which the negative electrode active material layer was applied was 142 mm vertically by 237 mm horizontally, the size of the negative electrode (negative electrode charge collector) was 142 mm vertically by 251 mm horizontally.

Preparation of the Non-aqueous Electrolyte Liquid: 1 mol/L of $LiPF_6$ was dissolved in a mixture liquid of ethylene carbonate (EC) and diethyl carbonate (DEC) mixed in a ratio of 30:70 by volume; in this way, a non-aqueous electrolyte liquid was prepared.

PRACTICAL EXAMPLES 1 TO 5

Assembly of the Secondary Battery

Positive electrode plates and negative electrode plates were stacked with separators interposed between them in the order a positive electrode, a separator, a negative electrode, a separator, and so forth, and in this way, an electrode assembly (stacked structure) was formed. Here, so that positive electrode plates might be located outside negative electrode plates, 24 positive electrode plates and 25 negative electrode plates were used. Moreover, 48 separators were used so that negative electrode plates might be located at the outermost sides of the electrode assembly (stacked structure). With negative electrode plates thus located at the outermost sides, the entire electrode assembly is enveloped in another separator for insulation from the package container.

The separators were formed of microporous film of polyethylene with a thickness of 25 μm. The size of the separators was 145 mm vertically by 240 mm horizontally so as to be larger than the size over which the positive and negative active material layers were applied.

Next, the second plate member was fillet-welded to the first plate member by laser pulse welding, and was lap-welded around each elevated portion (depressed portion); thereafter, refill non-aqueous electrolyte liquid was injected through the hole in the elevated portion. Used as the refill non-aqueous electrolyte liquid was the same as that described above: 1 mol/L of $LiPF_6$ dissolved in a mixture liquid (solvent) of ethylene carbonate (EC) and diethyl carbonate (DEC) mixed in a ratio of 30:70 by volume. Each cavity portion (the cavity portion on the opposite side from the protruding side of each elevated portion) was filled with 10 ml (milliliters) of the non-aqueous electrolyte liquid. In samples where the lid plate has a plurality of elevated portions formed on it, each of those elevated portions was filled with 10 ml of the non-aqueous electrolyte liquid. Thereafter, the hole through which the refill non-aqueous electrolyte liquid was injected was sealed by application thereto, followed by drying, of 0.5 g of a resin material as a sealing material (ThreeBond 1171, a sealing agent for lithium-ion batteries, manufactured by ThreeBond Co., Ltd.).

The electrode assembly (stacked structure) was housed in the package can, the lid plate was placed on top, and the lid plate was fillet-welded by laser pulse welding. Thereafter, through a filling hole with a diameter of 2 mm which had previously been formed in the lid plate, about 200 ml of the non-aqueous electrolyte liquid was injected under reduced pressure. After the injection, a metal ball with approximately the same diameter as the filling hole is placed in the filling hole, and was welded by electric resistance welding to stop the filling hole. In this way, five each of the batteries of Practical Examples 1 to 5 were fabricated.

COMPARATIVE EXAMPLE

Assembly of the Secondary Battery

The lithium-ion secondary battery of Comparative Example was assembled in a similar manner as described above except that no refill non-aqueous electrolyte liquid was injected. Like Practical Examples 1 to 5, five of the lithium-ion secondary battery of Comparative Example were fabricated.

The lithium-ion secondary batteries of Practical Examples 1 to 5 and Comparative Example thus fabricated all had a nominal voltage of 3.2 V and an internal resistance of 3 mΩ. They had a discharge capacity of 50 Ah when charged for 6 hours at a constant current and voltage of 10 A and 3.8V at an ambient temperature of 25° C. and discharged at 10 A down to 2.25 V.

The lithium-ion secondary batteries of Practical Examples 1 to 5 had refill non-aqueous electrolyte liquid stored in the cavity portion(s) so that fresh non-aqueous electrolyte liquid would be fed to the electrode assembly, and were in this respect different from that of Comparative Example, in which no such refill non-aqueous electrolyte liquid was stored and thus fresh non-aqueous electrolyte liquid would not be fed to the electrode assembly.

The lithium-ion secondary batteries of Practical Examples 1 to 5 and Comparative Example were subjected to cycle tests under the charge-discharge conditions noted above at an ambient temperature of 40° C., and the discharge capacity on cycle 1500 was compared with the discharge capacity on cycle 1 (thereby to determine the discharge capacity retention rate). The results are shown in Table 2. In Table 2, each discharge capacity retention rate is the average of the five batteries of the same example subjected to the cycle tests.

TABLE 2

|  | Discharge Capacity Retention Rate (Cycle 1500/Cycle 1) |
| --- | --- |
| Practical Example 1 | 87% |
| Practical Example 2 | 94% |
| Practical Example 3 | 90% |
| Practical Example 4 | 88% |
| Practical Example 5 | 92% |
| Comparative Example | 69% |

As shown in Table 2, it was verified that, as compared with Comparative Example, Practical Examples 1 to 5 exhibited improved discharge capacity retention rates. Specifically, Practical Examples 1 to 5 all exhibited high discharge capacity retention rates of 85% or more on cycle 1500. Practical Examples 1 and 4 exhibited slightly lower discharge capacity retention rates than Practical Examples 2, 3, and 5, but still exhibited discharge capacity retention rates as high as 87% and 88%. The reason that Practical Examples 1 to 5 exhibited high capacity retention rates is considered to be that, as a result of the refill non-aqueous electrolyte liquid leaking toward the electrode assembly, fresh non-aqueous electrolyte liquid was fed to the electrode assembly. By contrast, Comparative Example exhibited a discharge capacity retention rate of 70% or less (69%), which was lower than those exhibited by Practical Examples 1 to 5. This is considered to have resulted from, unlike in Practical Examples 1 to 5, no fresh non-aqueous electrolyte liquid was fed to the electrode assembly. The reason that Practical Examples 1 and 4 exhibited lower discharge capacity retention rates is considered to be that, in Practical Examples 1 and 4, only one elevated portion (cavity portion) was formed and accordingly the amount of non-aqueous electrolyte liquid stored in the cavity portion was smaller (the amount of non-aqueous electrolyte liquid fed was small) than that in Practical Examples 2, 3, and 5, where a plurality of elevated portions (cavity portions) were formed.

Thus, it was verified that, by storing refill non-aqueous electrolyte liquid in a cavity portion formed as a result of an elevated portion being formed, and letting the refill non-aqueous electrolyte liquid leak toward the electrode assembly through a sealing member (hole), it is possible to improve charge-discharge cycle characteristics, and to improve the life characteristics of the battery. Moreover, by forming an elevated portion on the lid plate, it is possible to improve the rigidity of the lid plate as well. Thus, it is possible to improve the pressure resistance of the package container and the characteristics of the battery (prolong its life) simultaneously.

The charge-discharge cycle tests were performed in an accelerated fashion, and this quickened the deterioration of the sealing member (sealing resin); this is considered to have caused the non-aqueous electrolyte liquid to leak at an increased rate. Thus, similar results are believed to be obtained in ordinary use.

From the results shown in Tables 1 and 2, it is readily expected that, also by giving the elevated portions on the lid plate (first plate member) a shape similar to any of their shapes in Embodiments 4, 6, and 8 to 12, it is possible to obtain an effect of improving the rigidity of the lid plate and an effect of improving the life characteristics.

Embodiment 13

Figure 62:
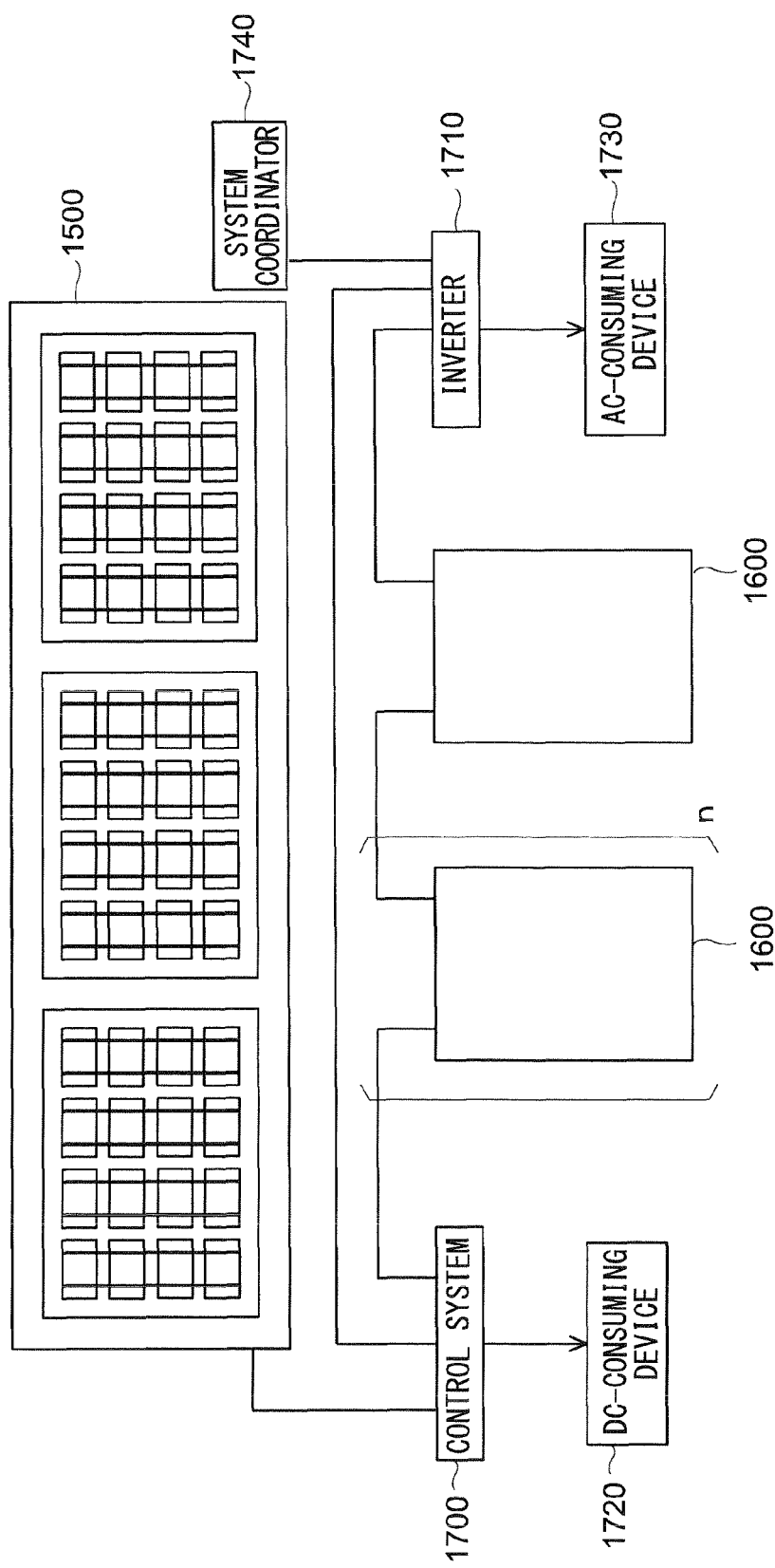
FIG. 62 is an outline diagram of a solar power generating system according to Embodiment 13 of the invention.

FIG. 62 is an outline diagram of a solar power generation system according to a thirteenth embodiment (Embodiment 13) of the invention. Next, with reference to FIG. 62, the solar power generation system according to Embodiment 13 of the invention will be described.

As shown in FIG. 62, the solar power generation system according to Embodiment 13 includes solar cells 1500 and an electric power storage battery (secondary battery) 1600 for storing the electric power generated by the solar cells 1500. In Embodiment 13, a secondary battery like the lithium-ion secondary batteries of Embodiments 1 to 12 described previously is used as the electric power storage battery 1600.

The storage battery 1600 may be a single lithium-ion secondary battery, or may be composed of a plurality of lithium-ion secondary batteries. Any number n (where n is a natural number including zero) of storage batteries 1600 may be connected together depending on the power generation capability of the solar cells 1500. In a case where a plurality of storage batteries 1600 are connected together, they may be connected in series, in parallel, or in a configuration involving both serial and parallel connection. The storage batteries 1600 may be connected together by any means.

In Embodiment 13, the storage batteries 1600 are placed with the lid plate up (at the top) so that the refill non-aqueous electrolyte liquid may be fed toward the electrode assembly.

Moreover, the solar cells 1500 are connected to a control system 1700, and via this control system 1700, the storage batteries 1600 are connected to the solar cells 1500. The output side of the storage batteries 1600 is connected to an inverter 1710. The electric power generated by the solar cells 1500 is charged in the storage batteries 1600, and these storage batteries 1600 feed electric power to a DC (direct-current)-consuming device 1720 and an AC (alternating-current)-consuming device 1730.

In some cases, the electric power generated by the solar cells 1500 is fed, for example after measurement of the amount of electric power generated, via the inverter 1710 to the AC-consuming device 1730 and to a system coordinator 1740 without passing through the storage batteries 1600.

In the solar power generation system according to Embodiment 13, as described above, owing to the provision of the electric power storage batteries 1600, it is possible to charge the storage batteries 1600 with the electric power generated by the solar cells 1500 during the day, and to discharge the storage batteries 1600 and use the electric power stored in them at night. Moreover, by using as the electric power storage batteries 1600 any of the lithium-ion secondary batteries according to Embodiments 1 to 12 described previously, it is possible to prolong the life of electric power storage equipment, and thus to reduce the cost of the solar power generation system as a whole. In addition, by using lithium-ion secondary batteries as the storage batteries 1600, it is possible to make the entire system including electric power storage equipment of a similar scale more compact and lightweight than by using batteries other than lithium-ion secondary batteries, such as lead rechargeable batteries or nickel metal hydride secondary batteries.

In cases where a lithium-ion secondary battery is used in a home-use solar power generation system, it is imperative to secure high safety. Accordingly, it is preferable to use, as the active material for the positive electrode, any of various compounds having an olivine structure represented by the general formula $Li_xMPO_4$ (where M represents one or more transition metals) for their high thermal stability during charging. Particularly preferable is lithium iron phosphate because it decomposes little of the electrolyte liquid and offers high safety.

Embodiment 14

Figure 63:
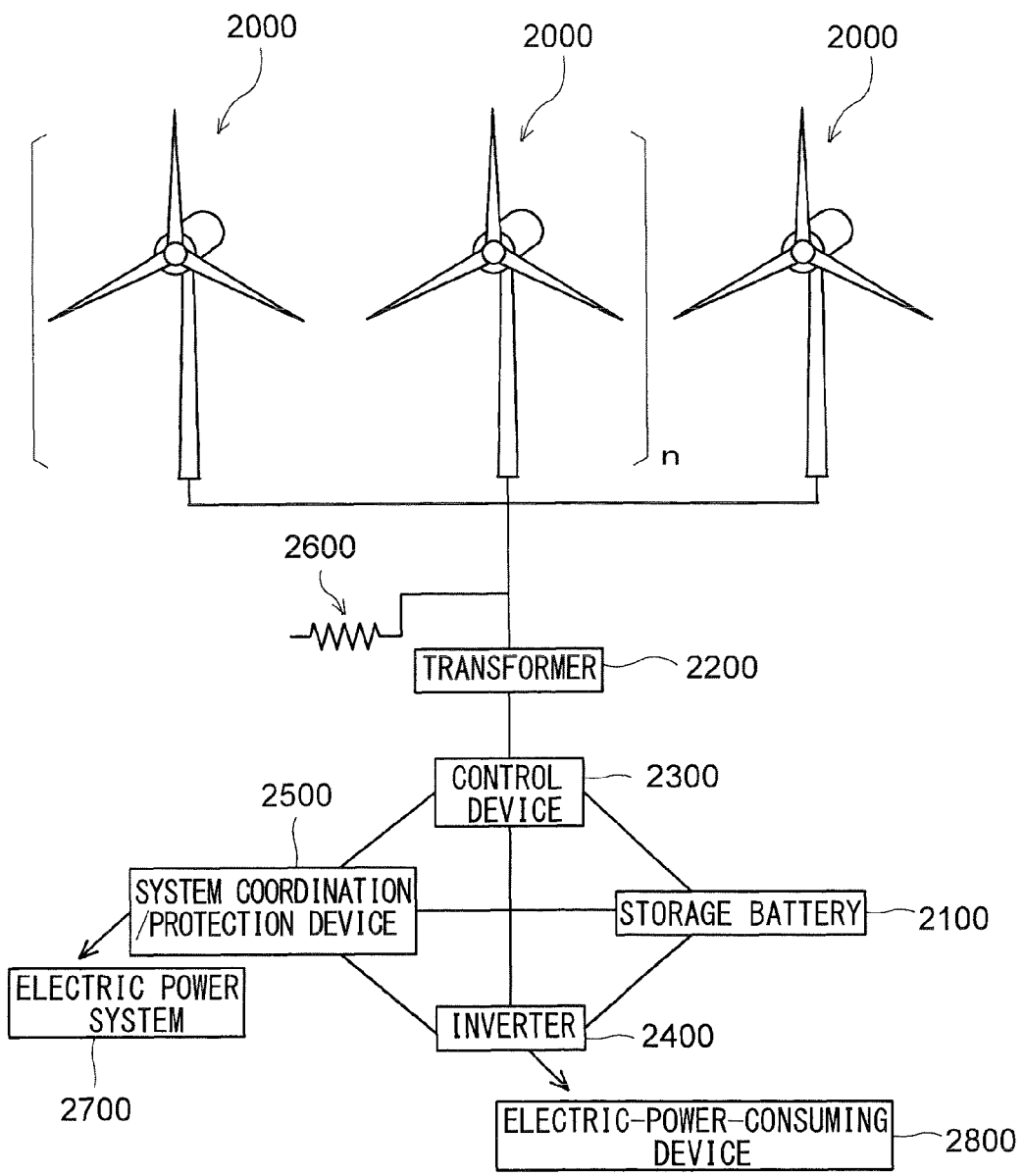
FIG. 63 is an outline diagram of a wind power generating system according to Embodiment 14 of the invention.

FIG. 63 is an outline diagram of a wind power generation system according to a fourteenth embodiment (Embodiment 14) of the invention. Next, with reference to FIG. 63, the wind power generation system according to Embodiment 14 of the invention will be described.

As shown in FIG. 63, the wind power generation system according to Embodiment 14 includes windmills 2000 and an electric power storage battery (secondary battery) 2100 for storing the electric power generated by the windmills 2000. In Embodiment 14, used as the electric power storage battery 2100 is a secondary battery like any of the lithium-ion secondary batteries of Embodiments 1 to 12 described previously. Any number n (where n is a natural number including zero) of windmills 2000 may be provided.

The electric power storage battery 2100 may be a single lithium-ion secondary battery, or may be composed of a plurality of lithium-ion secondary batteries, and any number of lithium-ion secondary batteries may be used depending on the power generation capability of the windmills 2000. In a case where a plurality of storage batteries 2100 are connected together, they may be connected in series, in parallel, or in a configuration involving both serial and parallel connection. The storage batteries 2100 may be connected together by any means.

The windmills 2000 are connected via a transformer 2200 to a control device 2300. This control device 2300 is connected to the storage battery 2100, an inverter 2400, and a system coordination/protection device 2500. The storage battery 2100, which is connected to the control device 2300, is connected to the system coordination/protection device 2500 and the inverter 2400 as well. Furthermore, the system coordination/protection device 2500 is also connected to the inverter 2400. Between the windmills 2000 and the transformer 2200, a resistor 2600 is connected.

In the wind power generation system configured as described above, the electric power generated by the windmills 2000 is subjected to voltage conversion by the transformer 2200, and is then distributed by the control device 2300 among different power feed destinations, namely the storage battery 2100, the inverter 2400, and the system coordination/protection device 2500. When electric power is fed to the storage battery 2100, the storage battery 2100 is charged with the electric power thus fed. When electric power is fed to the system coordination/protection device 2500, the electric power is fed from the system coordination/protection device 2500 to an electric power system 2700. When electric power is fed to the inverter 2400, the electric power is fed via the inverter 2400 to an electric-power-consuming device 2800. For example, in situations as when no electric power is being fed from the windmills 2000, the storage battery 2100 feeds electric power to the system coordination/protection device 2500 and the inverter 2400. The electric power thus fed is fed via the system coordination/protection device 2500 and the inverter 2400 to the electric power system 2700 and the electric-power-consuming device 2800 respectively.

With the wind power generation system according to Embodiment 14, as described above, by using as the electric power storage battery 2100 any of the lithium-ion secondary batteries of Embodiments 1 to 12 described previously, it is possible to prolong the life of electric power storage equipment, and thus to reduce the cost of the wind power generation system as a whole. In addition, by using a lithium-ion secondary battery as the storage battery 2100, it is possible to make the entire system including electric power storage equipment of a similar scale more compact and lightweight than by using batteries other than lithium-ion secondary batteries, such as lead rechargeable batteries or nickel metal hydride secondary batteries.

Embodiment 15

Figure 64:
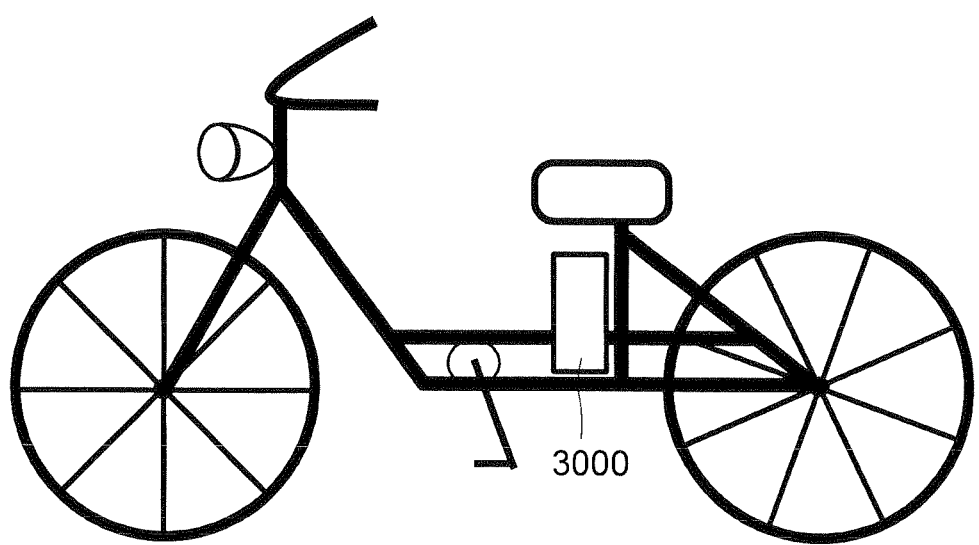
FIG. 64 is an outline diagram of a motorized bicycle according to Embodiment 15 of the invention.

FIG. 64 is an outline diagram of a motorized bicycle (electric bike) according to a fifteenth embodiment (Embodiment 15) of the invention. Next, with reference to FIG. 64, the motorized bicycle (vehicle) according to Embodiment 15 of the invention will be described.

The motorized bicycle according to Embodiment 15 is a bicycle provided with a motor-assisted propelling system that assists with the propelling of the bicycle with an electric motor, and incorporates, as shown in FIG. 64, a storage battery 3000 for feeding electric power to the electric motor. Used as the storage battery 3000 here is a secondary battery like the lithium-ion secondary batteries of Embodiments 1 to 12 described previously.

In the motorized bicycle according to Embodiment 15, as described above, by using as the storage battery 3000 for feeding electric power to the electric motor a lithium-ion secondary battery which has a higher energy density than a nickel metal hydride secondary battery or the like, it is possible to make the storage battery 3000 compact and lightweight. This makes it possible to make the bicycle as a whole lightweight, and thus to improve the operability of the bicycle. In addition, by making the storage battery 3000 compact, it is possible to increase the flexibility in the design of the bicycle.

Embodiment 16

Figure 65:
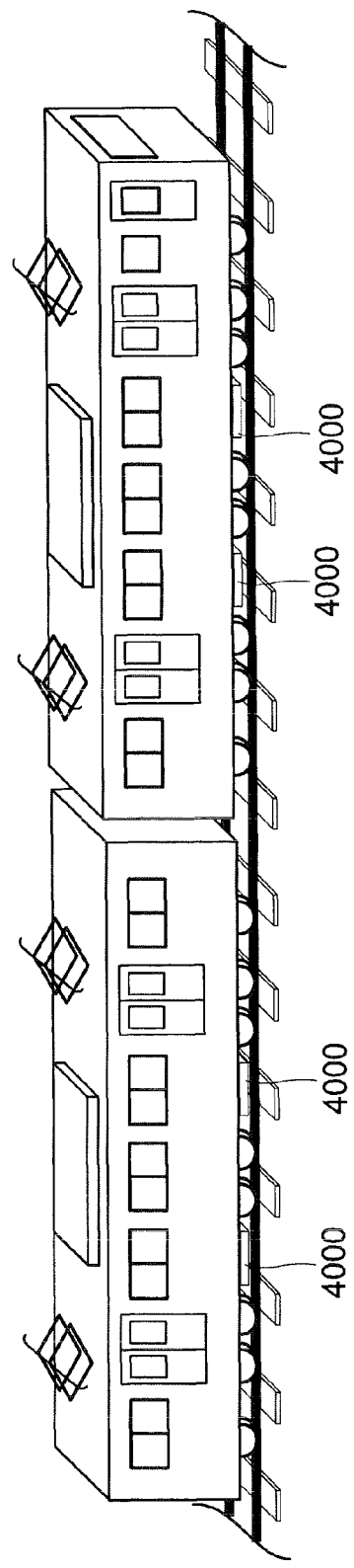
FIG. 65 is an outline diagram of an electric railway vehicle according to Embodiment 15 of the invention.

FIG. 65 is an outline diagram of an electric railway vehicle according to a sixteenth embodiment (Embodiment 16) of the invention. Next, with reference to FIG. 65, the electric railway vehicle according to Embodiment 16 of the invention will be described.

As shown in FIG. 65, the electric railway vehicle according to Embodiment 16 incorporates storage batteries 4000 for feeding electric power to electric motors, which are the source of propelling power. Used as the storage batteries 4000 here are secondary batteries like the lithium-ion secondary batteries of Embodiments 1 to 12 described previously. When no electric power is fed from an overhead or other power feed line, the storage batteries 4000 discharge to feed electric power to the electric motors.

The electric power from the storage batteries 4000 is used not only for the propelling of the electric motors but also for operating electric equipment such as air-conditioning and lighting equipment inside the vehicle.

As described above, owing to the provision of the storage batteries 4000 which feed electric power to electric motors, the electric railway vehicle according to Embodiment 16 can run even when no electric power is fed from a power feed line. Thus, even in regions where it is geographically or economically difficult to construct power feed lines and accordingly internal combustion-powered vehicles such as diesel-powered vehicles are used, it is possible to run electric railway vehicles. Thus, by running electric railway vehicles instead of internal combustion-powered vehicles, it is possible to reduce emission of carbon dioxide. Thus, with the configuration described above, it is possible to provide a means of transport that imposes little burden on the environment.

With the railway operation systems in current operation, electric power is controlled in a concentrated fashion, and therefore in case of troubles such as power failures, railway vehicles stop, with passengers confined in them. In such situations, if no electric power for operating air-conditioning equipment is available, the temperature inside vehicles rises, causing passengers to feel increased stress. When the storage batteries 4000 described above are incorporated in vehicles, however, even when electric power ceases to be fed, it is possible, by use electric power from the storage batteries 4000, to operate electric equipment as usual.

Embodiment 17

A lithium-ion secondary battery according to a seventeenth embodiment (Embodiment 17) of the invention is, like those of Embodiments 1 to 16 described previously, an electric power storage battery from which a particularly long life is expected, or a storage battery for EVs or HEVs, and is suitable as a storage battery with a per-cell capacity of 10 Ah or more which is difficult to bring into equipment such as a glove box. The lithium-ion secondary battery according to Embodiment 17 is built as a stacked or wound type.

The lithium-ion secondary battery according to Embodiment 17 is provided with a battery portion, which has positive electrodes, negative electrodes, and separators housed inside a package member and which is filled with non-aqueous electrolyte liquid, and a non-aqueous electrolyte liquid storage portion (cavity portion), in which refill non-aqueous electrolyte liquid is stored. In addition, between the battery portion and the non-aqueous electrolyte liquid storage portion, a partition wall having an opening (hole) is arranged, with a seeping portion (leaking portion) provided in the opening.

In the lithium-ion secondary battery according to Embodiment 17, the seeping portion is implemented with, for example, a screw. A screw achieves coupling by meshing between an internal thread and an external thread. Generally, the internal and external threads have a gap between them, and this gap allows the electrolyte liquid to seep out. In a case where the seeping portion is a metal screw, the seeping occurs through the gap of the screw. For example, an internal screw with tolerance position G is combined with an external screw with tolerance position h, e, f, or g; or an internal screw with tolerance position H is combined with an external screw with tolerance position e, f, or g. The tolerance positions here represent allowed errors with respect to nominal dimensions as defined in JIS B0209-1. In a case where the seeping portion is a resin screw or a resin sealing stopper (sealing member), it is necessary to select as the resin one that deteriorates with time and, at the lapse of a predetermined time, lets the refill non-aqueous electrolyte liquid seep out into the battery portion. The time it takes for the refill non-aqueous electrolyte liquid to start to seep out into the battery portion depends on the combination of the type of the electrolyte liquid (for examples, its dielectric constant, SP value (solubility parameter), etc.) and the dielectric constant and SP value of the resin; accordingly, the type of the electrolyte liquid, the material, amount, and surface area of the resin, etc. are determined with consideration given to the product life of the lithium-ion secondary battery in such a way as to prolong the product life.

In Embodiment 17, an "opening" denotes one located inside the package member to serve as a passage through which, after the package member is air-tightly closed, the refill non-aqueous electrolyte liquid is fed into the battery portion inside the package member where an electric power storage element is provided which has negative and positive electrodes stacked or wound with separators between them. That is, here, an "opening" does not denote a filling hole provided on the outer surface of the package member.

In Embodiment 17, there is no particular limitation on the specific shape of the opening. Considering, however, that the seeping portion is implemented with, for example, a screw, it is preferable to make the opening circular. If the opening has an opening area of 3 $cm^2$ or more, stopping it requires a large amount of sealing resin, and also diminished sealing strength results. If the opening area is less than 0.001 $cm^2$, however, it is too small to allow sufficient feeding of the non-aqueous electrolyte liquid. Accordingly, it is preferable that the opening have an opening area of about 3 $cm^2$ to about 0.001 $cm^2$.

In Embodiment 17, there is no particular restriction on the specific properties of the sealing stopper (sealing member). The sealing stopper, however, is assumed not to adversely affect the battery performance, and therefore it is preferable to conduct experiments for the purpose of controlling the seeping time. For example, in a case where the sealing stopper is formed of resin, it is possible to select a resin that exerts no adverse effect by evaluating battery performance by use of an electrolyte liquid having the resin of which the sealing stopper is formed immersed in it. Moreover, with reference to JIS K 6858 and JIS K 7114, it is possible to previously measure the variation in weight and the rate of shape change that a resin material exhibits when immersed in a non-aqueous electrolyte liquid, and determine the shape of the opening and the amount of the resin used to form the sealing stopper. Then, based on the results of these experiments, it is possible to compare charge-discharge characteristics and cycle characteristics between a battery according to the embodiment under discussion and a battery for comparison which has a construction according to this embodiment but is provided with no refill non-aqueous electrolyte liquid, and determine the type and amount of resin material for the sealing stopper. The time it takes for the refill non-aqueous electrolyte liquid to start to seep out into the battery portion can be adjusted to suit the use environment and the battery specifications. It is known that common resin materials leak by contact leakage or permeation leakage, and the leakage depends on the adhesion strength between the resin sealing stopper and the bonded member and the affinity with the substance lying in contact with the sealing resin.

Figure 66:
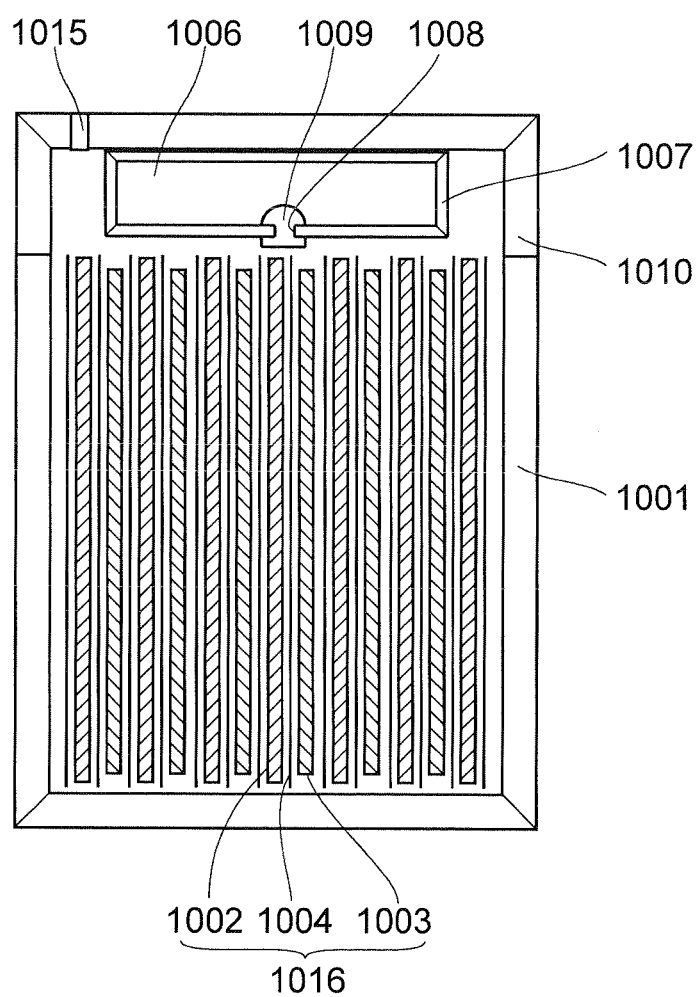
FIG. 66 is a sectional view of a lithium-ion secondary battery according to Embodiment 17 of the invention.

A sectional structural diagram of the lithium-ion secondary battery according to Embodiment 17 of the invention is shown in FIG. 66. The lithium-ion secondary battery shown in FIG. 66 has, inside a package member 1001, a battery portion 1005 in which an electric power storage element (electrode assembly) 1016 is housed which includes negative electrodes 1002, positive electrodes 1003, and separators 1004. The negative electrodes 1002, the positive electrodes 1003, and the separators 1004 are stacked or wounded, and are soaked with a non-aqueous electrolyte liquid to form the electric power storage element 1016. Also housed inside the package member 1001 in addition to the battery portion 1005 is a non-aqueous electrolyte liquid container 1007 which is filled with refill non-aqueous electrolyte liquid 1006. The non-aqueous electrolyte liquid container 1007 has an opening 1008 at a position facing the battery portion 1005, and the opening 1008 is stopped with a sealing stopper 1009. The sealing stopper 1009 serves as a seeping portion. Preferably, the opening 1008 is provided at the center of the face across which the battery portion 1005 and the non-aqueous electrolyte liquid container 1007 face each other.

Figure 67:
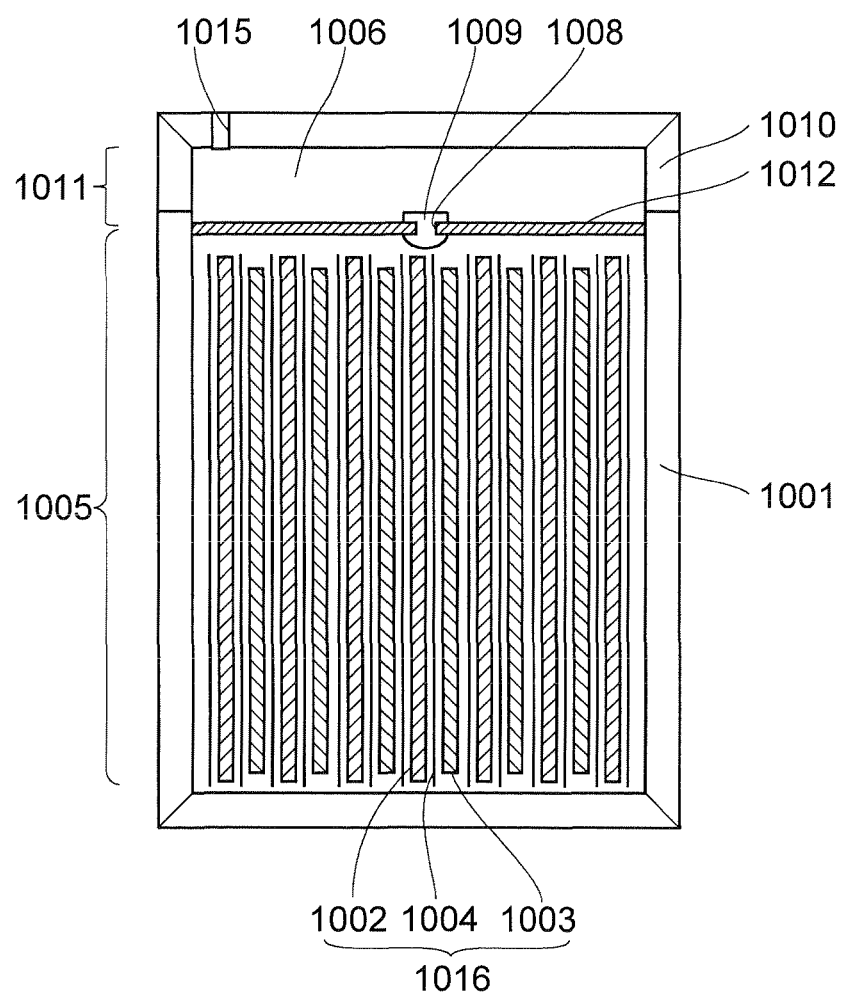
FIG. 67 is a sectional view of another example of a lithium-ion secondary battery according to Embodiment 17.

FIG. 67 shows a sectional structural diagram of a lithium-ion secondary battery having a different structure from the lithium-ion secondary battery in FIG. 66. The difference is that the lithium-ion secondary battery in FIG. 67 does not use a non-aqueous electrolyte liquid container. Specifically, the battery portion 1005 is separated from a non-aqueous electrolyte liquid storage portion 1011 by an partition wall 1012, and a non-aqueous electrolyte liquid is stored in the battery portion 1005 and the electrolyte liquid storage portion 1011. The opening 1008 is provided at a position between the battery portion 1005 and the electrolyte liquid storage portion 1011, and the opening 1008 is stopped with a sealing stopper 1009. The sealing stopper 1009 serves as a seeping portion according to this embodiment. Preferably, the opening 1008 is provided at the center of the face across which the battery portion 1005 and the electrolyte liquid storage portion 1011 face each other.

Figure 68:
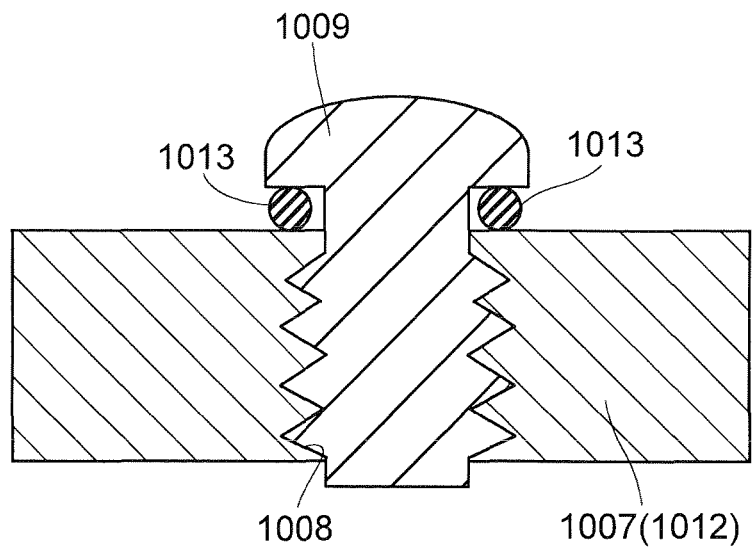
FIG. 68 is a sectional view of part of the lithium-ion secondary battery according to Embodiment 17.

FIG. 68 is a sectional view of the opening and the sealing stopper shown in FIGS. 66 and 67. In FIG. 68, the opening 1008 is formed in the non-aqueous electrolyte liquid container 1007 or the partition wall 1012 to be circular, and has an internal thread on its inside.

The sealing stopper 1009 has an external thread, which meshes with the internal thread of the opening 1008. Moreover, as shown in FIG. 68, for enhanced air-tightness, between the sealing stopper 1009 and the rim of the opening 1008, an O-ring 1013 is fitted. Preferably, the sealing stopper 1009 and the O-ring 1013 are formed of resin.

The screw (internal and external thread) and the O-ring, or a seal, may be formed of resin. It is generally known that a resin is a synthetic high polymer, which usually deteriorates with time. Among the many factors that contribute to deterioration of a high polymer, particular attention is given to the control of its resistance to chemicals in the embodiment under discussion. Presumed causes for deterioration include oxygen in the atmosphere, moisture, ultraviolet radiation, and heat. In this embodiment, in cases where a resin is used for the sealing stopper, since this is accommodated inside the metal package member, the effects of oxygen in the atmosphere, moisture, and ultraviolet are small. As for heat, so long as a resin that is stable within the use temperature range of common lithium-ion secondary batteries is taken into consideration, its resistance (i.e., poor resistance) to chemicals contributes more to deterioration. Known patterns of leakage of a liquid chemical resulting from deterioration of a common resin (adhesive) are: interface leakage in which leakage occurs through the interface between the base material and the adhesive; permeation leakage in which the liquid chemical permeates through the high polymer contained in the adhesive; and destruction leakage in which the bonds in the high polymer are broken to create physical gaps. In this embodiment, deterioration of a resin exposed to an electrolyte liquid is exploited to let the electrolyte liquid seep out; specifically, the electrolyte liquid seeps out as a result of one of the above-mentioned phenomena, namely interface leakage, permeation leakage, and destruction leakage, occurring alone or two or more of them occurring in combination.

Here, it is preferable that the refill non-aqueous electrolyte liquid seep out into the battery portion. To achieve that, in this embodiment, the storage portion for the refill non-aqueous electrolyte liquid is located above the battery portion so that the refill non-aqueous electrolyte liquid is fed to the battery portion under gravity.

Figure 69:
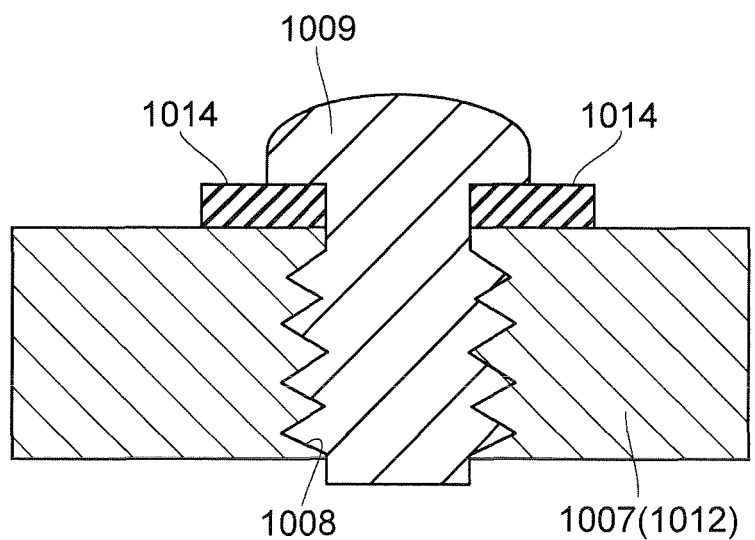
FIG. 69 is a sectional view of another example of the part of the lithium-ion secondary battery according to Embodiment 17.

FIG. 69 is a sectional view of an opening and a sealing stopper different from those in FIG. 68. The difference of what is shown in FIG. 69 from what is shown in FIG. 68 is the use of a disc-shaped resin seal 1014 in place of the O-ring 1013. In other respects, the structure here is the same as that in FIG. 68.

In a case where the sealing stopper 1009 is a screw, even when the O-ring 1013 or seal 1014 is provided, the construction needs to be such that the refill non-aqueous electrolyte liquid can seep out into the space inside the package member where the electric power storage element is provided which has the negative and positive electrodes stacked or wound with the separators between them. In this embodiment, the seeping portion of the lithium-ion secondary battery is implemented with a screw.

A screw is composed of an internal thread and an external thread. Generally, there is a gap between the internal and external threads, and through this gap, the refill non-aqueous electrolyte liquid can seep into the battery portion. That is, the package member of the lithium-ion secondary battery is formed of metal, and the volume inside it is constant until it is deformed under pressure. The electrolyte liquid in a lithium-ion secondary battery is volatile, and therefore in an environment with a temperature higher than that during the sealing of the battery, the solvent component of the electrolyte liquid evaporates, causing the internal pressure to rise. Moreover, as the battery is charged and discharged, oxidization and reduction occur, in the course of which the electrolyte liquid decomposes and releases gas, again causing the internal pressure to rise. In this embodiment, the screw (external thread) is tightened from the side where the refill non-aqueous electrolyte liquid is stored, and therefore when pressure is applied from the battery portion side, the gap between the internal and external threads widens, letting the refill non-aqueous electrolyte liquid seep out through the gap. Also when a fall in temperature diminishes evaporation, since the refill non-aqueous electrolyte liquid is kept in contact with the external thread, it seeps out through the gap. The amount of the refill non-aqueous electrolyte liquid that seeps into the battery portion can be adjusted by appropriately designing the combination of the tolerance positions of the external and internal threads with respect to the nominal dimensions, the volatility of the electrolyte liquid, and the difference in volume between the battery portion and the non-aqueous electrolyte liquid storage portion.

In the embodiment shown in FIG. 66, the opening 1008 shown in FIGS. 68 and 69 is provided at the center of the face across which the battery portion 1005 and the non-aqueous electrolyte liquid container 1007 face each other. The opening, however, does not necessarily have to be provided at the center; it may instead be provided in a corner part of, or at a position away from the center of, the face across which the battery portion 1005 and the non-aqueous electrolyte liquid container 1007 face each other. The opening does not necessarily have to be circular; it may instead be rectangular, triangular, or of any other shape. Instead of using a screw, it is also possible to form the sealing stopper by drying and hardening, or by ultraviolet-curing, a sealing agent.

Also in the embodiment shown in FIG. 67, the opening 1008 is provided at the center of the partition wall 1012, but it may instead be provided in a corner part of, or at a position away from the center of, the partition wall. The opening may be, instead of circular, triangular, rectangular, oval, or of any other shape. Instead of using a screw, it is also possible to form the sealing stopper by drying and hardening, or by ultraviolet-curing, a sealing agent.

In the lithium-ion secondary battery of this embodiment, the resin used for the sealing stopper 1009 is a material resistant to organic electrolyte liquids, preferable examples including SBR (styrene-butadiene rubber), EPDM (ethylene propylene diene monomer), butyl rubber, silicone rubber, and rubber containing fluorine resin. When exposed to a non-aqueous electrolyte liquid, these resins deteriorate to let the refill non-aqueous electrolyte liquid leak out into the battery portion.

In the lithium-ion secondary battery of this embodiment, the resin used for the O-ring 1013 is a material resistant to organic electrolyte liquids, preferable examples including SBR (styrene-butadiene rubber), EPDM (ethylene propylene diene monomer), butyl rubber, silicone rubber, and rubber containing fluorine resin.

In the lithium-ion secondary battery of this embodiment, the resin used for the seal 1014 is a material resistant to organic electrolyte liquids, preferable examples including polypropylene (PP), polyethylene (PE), a copolymer of PP and PE, SBR (styrene-butadiene rubber), EPDM (ethylene propylene diene monomer), butyl rubber, silicone rubber, and rubber containing fluorine resin, and Teflon (registered trademark) seal tape formed of PTFE (polytetrafluoroethylene).

In the lithium-ion secondary battery of this embodiment, usable as the package member 1001 is iron, nickel-plated iron, stainless steel, or aluminum formed into a box-shaped or cylindrical form. The non-aqueous electrolyte liquid container 1007 and the partition wall 1012 may be formed of a material similar to that of the package member 1001. Forming the package member 1001, the non-aqueous electrolyte liquid container 1007, and the partition wall 1012 all out of the same material gives them an equal expansion coefficient, and this ensures satisfactory fabrication from the viewpoint of weldability.

In the lithium-ion secondary battery of this embodiment, usable as the positive electrode active material are: titanium disulfide, vanadium pentoxide, and molybdenum trioxide; and various compounds represented by the general formula $Li_xMO_2$ (where M represents one or more transition metals) such as lithium cobalt composite oxides, lithium nickel composite oxides, and spinel-structure lithium manganese composite oxides. Among these, in a case where the lithium-ion secondary battery of this embodiment is used in combination with a home-use solar power generating system and thus it is imperative to secure high safety, preferable as the positive electrode active material are various compounds having an olivine structure represented by the general formula $Li_xMPO_4$ (where M represents one or more transition metals) for their high thermal stability during charging. Particularly preferable is lithium iron phosphate because it decomposes little of the electrolyte liquid and offers high safety.

Usable as the negative electrode active material for the lithium-ion secondary battery are various materials such as metal lithium, alloys containing lithium, and carbon materials that can occlude and release lithium. Among these, using carbon materials helps realize a battery with a long cycle life and achieve high safety.

Used for the separators of the lithium-ion secondary battery is porous polyethylene film.

Used as the electrolyte liquid for the lithium-ion secondary battery is typically one having a supporting salt, such as $LiPF_6$ or $LiBF_4$, dissolved in a mixture solvent of a high dielectric constant solvent, such as ethylene carbonate (EC) or propylene carbonate, and a low viscosity solvent, such as diethyl carbonate (DEC).

Figure 70:
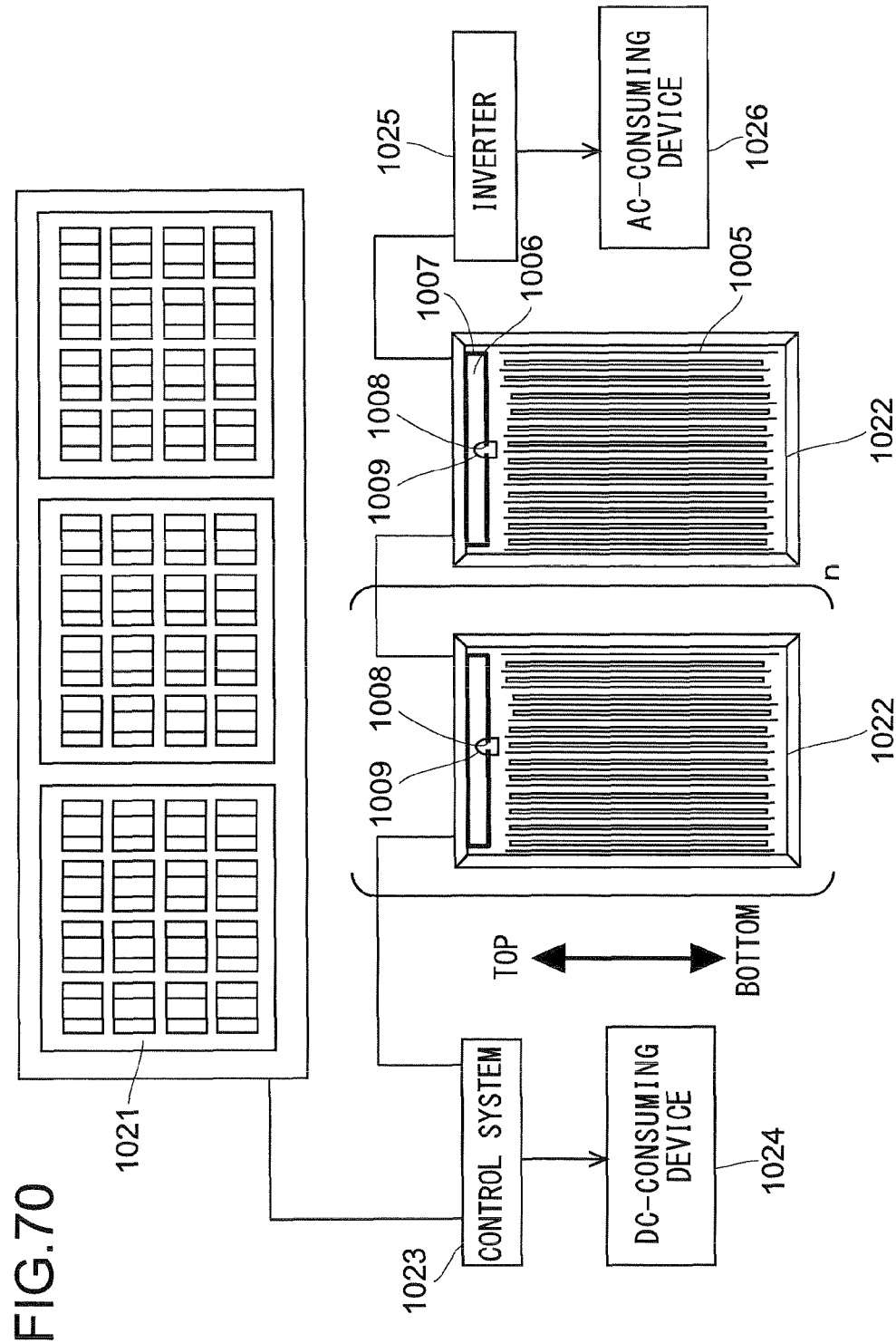
FIG. 70 is a diagram illustrating a mode of use of the lithium-ion secondary battery according to Embodiment 17.

FIG. 70 is a diagram illustrating a case where the lithium-ion secondary battery of this embodiment is incorporated in a solar power generating system. Specifically, the solar power generating system is composed of: three solar power generation devices 1021; two lithium-ion secondary batteries 1022; a control system 1023 which controls the charging and discharging of the three solar power generation devices 1021 and the two lithium-ion secondary batteries 1022 to feed direct-current electric power to a DC-consuming device 1024; and an inverter 1025 which feeds the direct-current electric power of the lithium-ion secondary batteries 1022 to an AC-consuming device 1026. Here, the lithium-ion secondary batteries 1022 are each the lithium-ion secondary battery that has been described with respect to FIGS. 66 to 69, and are arranged with the battery portion 1005 down and the non-aqueous electrolyte liquid container 1007 for the refill non-aqueous electrolyte liquid 1006 up. This arrangement ensures that the refill non-aqueous electrolyte liquid 1006 seeps out into the battery portion 1005 under gravity. Moreover, only one opening and one sealing stopper are needed, and this is preferable from the viewpoint of cost.

In FIG. 70, the solar power generation devices 1021 and the lithium-ion secondary batteries 1022 may be provided in any numbers. The number of solar power generation devices 1021 may be determined depending on the power generation capability, and the number of lithium-ion secondary batteries 1022 may be determined depending on the amount of electric power to be stored. In the solar power generating system shown in FIG. 70, the DC-consuming device 1024 is connected to the control system 1023 and the AC-consuming device 1026 is connected to the inverter 1025. Any other interconnection than this, however, may instead be adopted depending on the type and power consumption of the DC-consuming device 1024 and the AC-consuming device 1026.

Figure 71A:
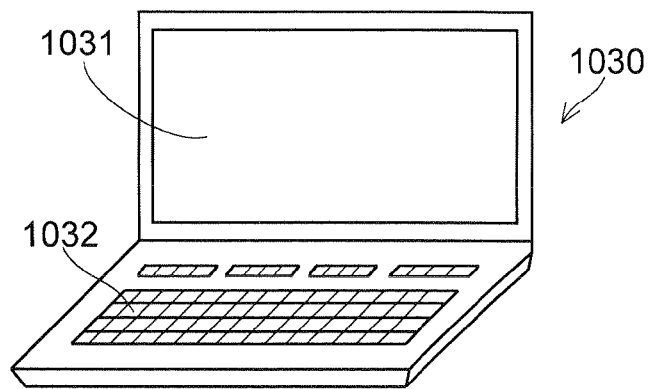
FIGS. 71A to 71C are diagrams illustrating another mode of use of the lithium-ion secondary battery according to Embodiment 17, FIG. 71A showing a portable lap-top personal computer using the lithium-ion secondary battery, FIG. 71B showing the lithium-ion secondary battery used in the portable lap-top personal computer, and FIG. 71C being a schematic sectional view of the lithium-ion secondary battery in FIG. 71B.
Figure 71B:
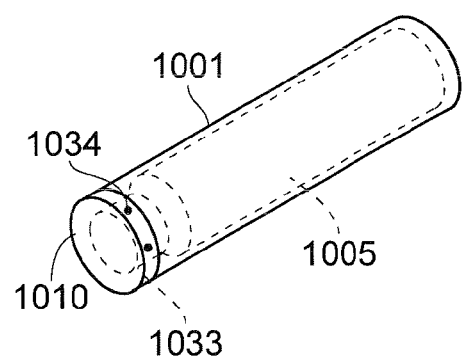
Figure 71C:
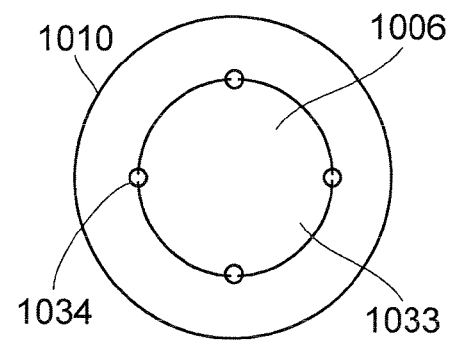

FIG. 71 is a diagram illustrating a case where the lithium-ion secondary battery of this embodiment is used as an electric power source in a portable lap-top personal computer. FIG. 71A shows the portable lap-top personal computer 1030, which has a display screen 1031 and a keyboard 1032. FIG. 71B shows the lithium-ion secondary battery that has been described with respect to FIGS. 66 to 69, which is housed inside the portable lap-top personal computer 1030. That is, as shown in FIG. 71B, the lithium-ion secondary battery has a cylindrical exterior, and has, housed inside a package member 1001, a battery portion 1005 and a cylindrical refill tank 1033 for storing refill non-aqueous electrolyte liquid 1006. As shown in a sectional view in FIG. 71C, this refill tank 1033 is provided with four sealing stoppers 1034 around it. Preferably, the four sealing stoppers 1034 are arranged at equal intervals.

There is no restriction on the number and arrangement of openings, but arranging four openings at equal intervals ensures that, irrespective of in what position the portable lap-top personal computer is placed, the refill non-aqueous electrolyte liquid 1006 seeps out into the battery portion 1005.

Figure 72A:
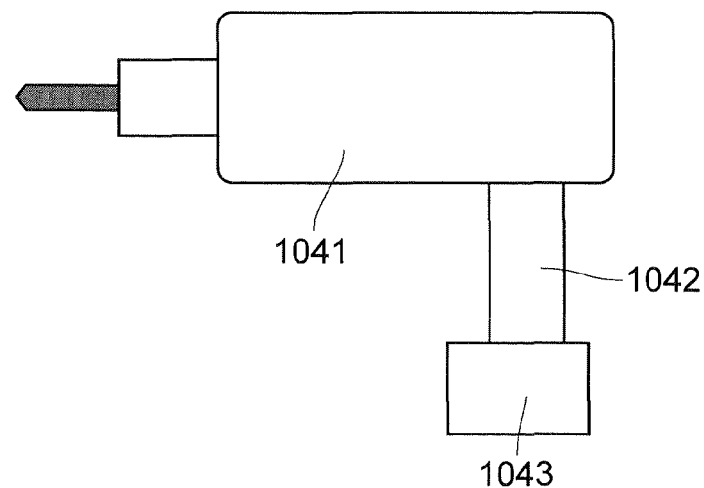
FIGS. 72A to 72C are diagrams illustrating yet another mode of use of the lithium-ion secondary battery according to Embodiment 17, FIG. 72A illustrating a case in which the lithium-ion secondary battery is used as an electric power source in an electrically driven tool, FIG. 72B showing the lithium-ion secondary battery housed in a battery portion of the electrically driven tool, and FIG. 72C being a schematic sectional view of the lithium-ion secondary battery in FIG. 72B.
Figure 72B:
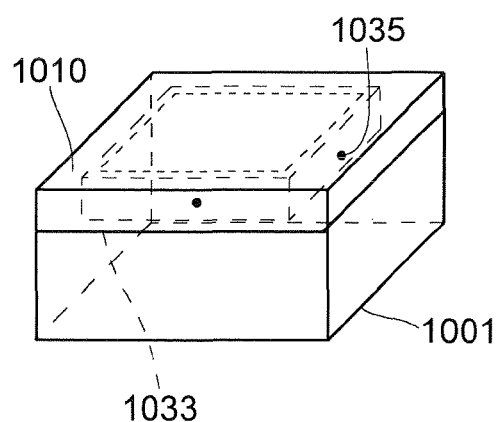
Figure 72C:
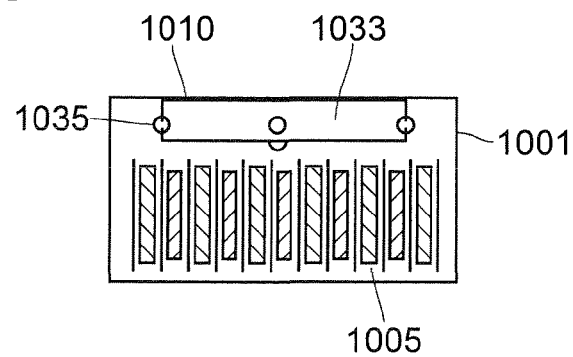

FIG. 72 is a diagram illustrating a case where the lithium-ion secondary battery of this embodiment is used as an electric power source in an electrically driven tool. FIG. 72A shows an electrically driven tool, which is composed of an electric screwdriver portion 1041, a grip portion 1042, and a battery portion 1043. FIG. 72B shows the lithium-ion secondary battery of this embodiment, which is housed in the battery portion 1043. That is, as shown in FIG. 72B, the lithium-ion secondary battery has, housed inside a package member 1001 having a box-shaped exterior, a battery portion 1005 and a cylindrical refill tank 1033 for storing refill non-aqueous electrolyte liquid 1006. As shown in FIG. 72C, this refill tank 1033 is provided with four sealing stoppers 1034 around it. Preferably, the four sealing stoppers 1034 are arranged at equal intervals.

Arranging four openings at equal intervals in this way ensures that, irrespective of in what position the electrically driven tool is placed or used, the refill non-aqueous electrolyte liquid 1006 seeps into the battery portion 1005.

In the lithium-ion secondary battery of this embodiment shown in FIGS. 66 to 72 and described above, there is no particular restriction on the number and arrangement of electrolyte liquid internal filling holes. In a case where it is used as a stationary storage battery in a solar power generating system or wind power generation system, however, providing an electrolyte liquid internal filling hole in the bottom side of the space in which refill non-aqueous electrolyte liquid is stored helps minimize the number of electrolyte liquid internal filling holes that need to be formed and the number of internal filling hole stoppers that need to be provided, and this is preferable from the viewpoint of cost. In cases where, as with portable lap-top personal computers and electrically driven tools, the position for storage is unpredictable, it is preferable to provide a plurality of electrolyte liquid internal filling holes and hence internal filling hole stoppers in different directions.

While FIGS. 70 to 72 show examples of uses of the lithium-ion secondary battery of this embodiment, it can be used in any other electronic and electric devices; for example, it can be used in digital cameras, cellular phones, video camcorders, motorized bicycles, EVs, and HEVs.

To verify the effect of the lithium-ion secondary battery of this embodiment, a comparison was made between the lithium-ion secondary battery of this embodiment, which was provided with refill non-aqueous electrolyte liquid, and a lithium-ion secondary battery for comparison, which was provided with no refill non-aqueous electrolyte liquid. Specifically, it was verified that, even having gone through cycles at the end of which the discharge capacity of the lithium-ion secondary battery for comparison, which was provided with no refill non-aqueous electrolyte liquid, dropped to 70% or less of that on cycle 1, the lithium-ion secondary battery of this embodiment, which was provided with refill non-aqueous electrolyte liquid, had 80% or more of its discharge capacity on cycle 1. Thus, it was verified that it is possible to obtain a lithium-ion secondary battery that exhibits little drop in discharge capacity through repeated charge-discharge cycles, in other words, a lithium-ion secondary battery with a long charge-discharge cycle.

The lithium-ion secondary battery of this embodiment is fabricated in the following manner.

According to a first fabrication method, first, a non-aqueous electrolyte liquid container 1007 having at least one opening 1008 is welded to a lid portion 1010. Thereafter, the non-aqueous electrolyte liquid container 1007 is filled with refill non-aqueous electrolyte liquid 1006, and the opening 1008 is sealed with a sealing stopper 1009. Next, lead terminals (not shown) inside a package member 1001 are connected to positive and negative charge collectors, respectively, of an electric power storage element 1016 having negative electrodes 1002, positive electrodes 1003, and separators 1004, and the electric power storage element 1016 is housed in the package-container 1001. Then, the lid portion 1010 prepared as described above to have the non-aqueous electrolyte liquid container 1007 filled with the refill non-aqueous electrolyte liquid 1006 is joined to the package member 1001. Thereafter, through a filling hole (opening) 1015 in the lid portion 1010 or the package member 1001, non-aqueous electrolyte liquid is injected, and then the filling hole 1015 is sealed to be air-tightly closed. By this fabrication method, the lithium-ion secondary battery shown in FIG. 66 can be fabricated.

According to a second fabrication method, the lithium-ion secondary battery of this embodiment is fabricated in the following manner.

First, an electric power storage element 1016 having negative electrodes 1002 and positive electrodes 1003 stacked or wound with separators 1004 between them is housed in a package member 1001, and lead terminals (not shown) inside the package member 1001 are connected to positive and negative charge collector, respectively, of the electric power storage element 1016. Next, a partition wall plate 1012 having an opening 1008 previously formed in it, or a partition wall plate 1012 having a cut part serving as an opening, is fitted inside the package member 1001. Next, non-aqueous electrolyte liquid is injected through the opening 1008, and the opening 1008 is stopped with a sealing stopper 1009. In a case where gas draining is performed after initial charging, initial charging and discharging are performed directly, then the sealing stopper 1009 is removed, then, if necessary, electrolyte liquid is injected again, and then the opening 1008 is stopped with the sealing stopper 1009. Thereafter, a lid portion 1010 is joined, refill non-aqueous electrolyte liquid is injected through a filling hole provided in the lid portion 1010 or the package member 1001, and the filling hole in the lid portion 1010 or the package member 1001 is sealed. In a case where gas draining is not performed, no initial charging is performed at this point, but the lid portion 1010 is joined, refill non-aqueous electrolyte liquid is injected, and the filling hole in the lid portion 1010 or the package member 1001 is sealed. By this fabrication method, the lithium-ion secondary battery shown in FIG. 67 can be fabricated.

Next, further practical examples of the invention (practical examples according to Embodiment 17) will be described. It should be understood that none of the practical examples presented below is meant to limit the invention in any way.

PRACTICAL EXAMPLE 6

A box-shaped lithium-ion secondary battery was fabricated which was constructed as follows: an electric power storage element having positive electrodes, negative electrodes, and separators and filled with non-aqueous electrolyte liquid and a non-aqueous electrolyte liquid container for storing refill non-aqueous electrolyte liquid were housed inside a package member; an opening was provided in a tank partition wall between a battery portion and the non-aqueous electrolyte liquid container; and the opening was sealed with a sealing stopper. The secondary battery according to Practical Example 6 had the same sectional structure as that shown in FIG. 66.

As the positive electrode composite agent, a slurry was prepared by blending together 90 parts by weight of $LiFePO_4$ as an active material, 5 parts by weight of acetylene black as a conductive agent, and 5 parts by weight of polyvinylidene fluoride as a binding agent, and then adding to and dispersing in the blend an adequate amount of N-methyl-2-pyrrolidone. This slurry was then applied evenly to both sides of a charge collector of aluminum with a thickness of 20 μm, and was then dried; thereafter, the product was compressed on a roll press, and was then cut to the desired size; in this way, the positive electrodes were fabricated.

As the negative electrode composite agent, a slurry was prepared by blending together 90 parts by weight of natural graphite occurring in China and 10 parts by weight of polyvinylidene fluoride, and then adding to and dispersing in the blend an adequate amount of N-methyl-2-pyrrolidone. The slurry was then applied evenly to both sides of a charge collector of copper with a thickness of 16 µm, and was then dried; thereafter, the product was compressed on a roll press, and was then cut to the desired size; in this way, the negative electrodes were fabricated.

As the separators, a microporous film of polyethylene with a thickness of 25 µm was used.

As the non-aqueous electrolyte liquid, a mixture liquid of ethylene carbonate (EC) and diethyl carbonate (DEC) mixed in a ratio of 30:70 by volume and having 1 mol/L of $LiPF_6$ dissolved in it was used.

The lithium-ion secondary battery of Practical Example 6 was fabricated in the following manner. First, a non-aqueous electrolyte liquid container of aluminum having a circular opening with a diameter of 1 mm was welded to a lid portion, and the non-aqueous electrolyte liquid container was filled with 20 ml of the above-mentioned non-aqueous electrolyte liquid through the electrolyte liquid internal filling hole (opening). Thereafter, 0.5 g of ThreeBond 1171, a sealing agent for lithium-ion batteries, was applied to the electrolyte liquid internal filling hole (opening) and was dried, and thereby the electrolyte liquid internal filling hole (opening) was sealed. This sealing agent acted as the above-mentioned sealing stopper, letting the non-aqueous electrolyte liquid inside the non-aqueous electrolyte liquid container seep out into the battery portion.

Next, the battery portion, which was the electric power storage element having the positive and negative electrodes stacked with the separators between them, was housed in the package member, and then lead terminals were connected. Next, the lid portion provided with the above-mentioned non-aqueous electrolyte liquid container was laser-welded to the package member having the battery portion housed in it, then 20 ml of the above-mentioned non-aqueous electrolyte liquid was filled, and then the filling hole in the lid portion was sealed; in this way, the box-shaped lithium-ion secondary battery was fabricated.

The battery had a nominal voltage of 3.2 V and an internal resistance of 3 mΩ. Moreover, it had a discharge capacity of 50 Ah when charged for 6 hours at a constant current and voltage of 10 A and 3.8V at an ambient temperature of 25° C. and discharged at 10 A down to 2.25 V.

When this battery was subjected to cycle tests under the charge-discharge conditions noted above at an ambient temperature of 25° C., its discharge capacity on cycle 1500 was 92% of that on cycle 1. As a comparative example, a lithium-ion secondary battery was fabricated through a similar procedure but with the non-aqueous electrolyte liquid container sealed without being filled with the above-mentioned refill non-aqueous electrolyte liquid; the discharge capacity of this lithium-ion secondary battery on cycle 1500 was 69% of that on cycle 1.

In the cycle tests, the battery was so placed that the electrolyte liquid internal filling hole (opening) was located in the bottom face of the non-aqueous electrolyte liquid container. This means that, in the case of the battery under discussion, it was placed upright with the lid portion at the top. In cycle tests conducted with the electrolyte liquid internal filling hole (opening) located in the top face of the non-aqueous electrolyte liquid container, that is, with the battery placed with the lid portion down and thus with the battery can inverted, the discharge capacity on cycle 1500 was 68% of that on cycle 1.

While in this practical example a box-shaped battery having positive and negative electrode plates stacked with separators between them was used, a cylindrical or otherwise shaped battery having elongate positive and negative electrode plates wound with elongate separators between them achieved the same effect.

PRACTICAL EXAMPLE 7

An electric power storage element having positive electrodes and negative electrodes stacked with separators between them was housed in a package member, and lead terminals were connected. Next, a partition wall plate 12 having a threaded hole previously formed in it which meshed with an M2 screw was laser-welded inside the package member. The threaded hole served as an opening. Next, 200 ml of non-aqueous electrolyte liquid was injected through the threaded hole, and the threaded hole was stopped with an M2 screw. The M2 screw served as a sealing stopper. Here, an M2 screw denotes a screw complying with the ISO standards for metric screws: an M2 screw has, for example, a nominal major diameter of 2 mm, a pitch of 0.4 mm, and a nominal minor diameter of 1.567 mm.

Thereafter, a lid portion was laser-welded, and, through a filling hole formed in the top face of the lid portion, refill non-aqueous electrolyte liquid was injected; lastly, the filling hole in the lid portion was sealed. In this way, a box-shaped lithium-ion secondary battery was fabricated. The positive electrodes, the negative electrodes, the separators, and the electrolyte liquid here are the same as those in Practical Example 6. The battery thus fabricated had the same sectional structure as that shown in FIG. 67.

The lithium-ion secondary battery of Practical Example 7 was subjected to cycle tests under similar conditions as those for Practical Example 6. The discharge capacity on cycles 1500 and 2000 was 87% and 80%, respectively, of that on cycle 1. In comparison, with a comparative lithium-ion secondary battery fabricated through a similar procedure but sealed without being filled with the above-mentioned refill non-aqueous electrolyte liquid, the discharge capacity on cycles 1500 and 2000 was 68% and 45%, respectively, of that on cycle 1. The lithium-ion secondary battery of Practical Example 7 was also subjected to cycle tests at an ambient temperature of 45° C., and its discharge capacity on cycle 1000 was 80% of that on cycle 1. In comparison, the discharge capacity of the comparative battery on cycle 1000 was 52% of that on cycle 1.

PRACTICAL EXAMPLE 8

A box-shaped lithium-ion secondary battery was fabricated through a similar procedure as for Practical Example 7 except that, after the opening was stopped with an M2 screw as a sealing stopper, 0.05 g of ThreeBond 1171, a sealing agent for lithium-ion batteries, was applied and dried to seal the electrolyte liquid internal filling hole (opening). The cycle tests were conducted under similar conditions as for Practical Example 6. The discharge capacity on cycles 1500 and 2000 was 84% and 82%, respectively, of that on cycle 1. In comparison, with a comparative lithium-ion secondary battery fabricated through a similar procedure but sealed without being filled with the above-mentioned refill non-aqueous electrolyte liquid, the discharge capacity on cycles 1500 and 2000 was 68% and 45%, respectively, of that on cycle 1.

PRACTICAL EXAMPLE 9

The battery of Practical Example 6 was connected to the solar power generating system of FIG. 70; during the day, the electric power generated by the solar power generating system was charged in the lithium-ion secondary battery, and at night, the lithium-ion secondary battery was discharged and the electric power from it was used. With the system using the lithium-ion secondary battery of the invention, as compared with a system provided with electric power storage equipment of a similar scale which used a secondary battery other than a lithium-ion secondary battery, such as a lead rechargeable battery or a nickel metal hydride secondary battery, it was possible to make the system as a whole compact and lightweight. Moreover, with a lithium-ion secondary battery provided with refill non-aqueous electrolyte liquid, as compared with a lithium-ion secondary battery of a same scale which was not provided with refill non-aqueous electrolyte liquid, it was possible to prolong the life of the electric power storage equipment, and thus to reduce the cost of the system as a whole.

The battery of Practical Example 9 was connected in the same manner as in FIG. 70. Using the secondary battery of the invention in a wind power generation system instead of a solar power generating system offered a similar effect.

PRACTICAL EXAMPLE 10

A cylindrical non-aqueous electrolyte liquid container of aluminum was welded to a lid portion, and in the faces of the former other than the face at which it is welded to the latter, electrolyte liquid internal filling holes (openings) were formed, one in the bottom face and four in the side face at equal intervals around it. At the four electrolyte liquid internal filling holes (openings) formed in the side face, 0.1 g of ThreeBond 1171, a sealing agent for lithium-ion batteries, was applied and dried to seal them. Thereafter, 5 ml of the above-mentioned non-aqueous electrolyte liquid was injected through the remaining one electrolyte liquid internal filling hole (opening) formed in the bottom face, and then 0.1 g of ThreeBond 1171, a sealing agent for lithium-ion batteries, was applied and dried to seal it. This sealing agent served as the above-mentioned sealing stopper, letting the non-aqueous electrolyte liquid in the non-aqueous electrolyte liquid container seep out into the battery portion.

Next, an electric power storage element having positive electrode plates and negative electrode plates wound with separators between them was housed in a package member, then lead terminals were connected, and then 50 ml of the above-mentioned non-aqueous electrolyte liquid was injected. Next, the lid portion provided with the above-mentioned non-aqueous electrolyte liquid container was laser-welded to the package member having the electric power storage element housed in it; in this way, a cylindrical lithium-ion secondary battery was fabricated.

Next, the cylindrical battery thus fabricated was used as the battery of a lap-top personal computer. As compared with a lap-top personal computer using a comparative battery fabricated through a similar procedure except that no refill non-aqueous electrolyte liquid was injected, the lithium-ion secondary battery of Practical Example 10 exhibited a smaller deterioration in the battery discharge capacity through repeated charging and discharging. The non-aqueous electrolyte liquid container and the arrangement of internal filling hole stoppers in the battery of Practical Example 10 were the same as those shown in FIG. 71.

PRACTICAL EXAMPLE 11

A rectangular parallelepiped non-aqueous electrolyte liquid container of aluminum was welded to a lid portion, and in five faces of the former other than the face at which it is welded to the latter, electrolyte liquid internal filling holes (openings) were formed. At four of those electrolyte liquid internal filling holes (openings), 0.1 g of ThreeBond 1171, a sealing agent for lithium-ion batteries, was applied and dried to seal them. Thereafter, 5 ml of the above-mentioned non-aqueous electrolyte liquid was injected through the remaining one electrolyte liquid internal filling hole (opening), and then 0.1 g of ThreeBond 1171, a sealing agent for lithium-ion batteries, was applied and dried to seal it. This sealing agent served as the above-mentioned sealing stopper, letting the non-aqueous electrolyte liquid in the non-aqueous electrolyte liquid container seep out into the battery portion.

Next, an electric power storage element having positive electrode plates and negative electrode plates wound with separators between them was housed in a package member, then lead terminals were connected, and then 50 ml of the above-mentioned non-aqueous electrolyte liquid was injected. Next, the lid portion provided with the above-mentioned non-aqueous electrolyte liquid container was laser-welded to the package member having the electric power storage element housed in it; in this way, a box-shaped lithium-ion secondary battery was fabricated.

Next, the box-shaped battery thus fabricated was used as the battery of a rechargeable screwdriver-drill. In contrast to a case where a nickel-cadmium secondary battery, a nickel metal hydride second battery, or the like is used, with the screwdriver-drill using the lithium-ion secondary battery of the invention, as compared with an electrically driven tool provided with a battery of a similar scale, it was possible to make the rechargeable screwdriver-drill compact and lightweight. Moreover, as compared with a rechargeable screwdriver-drill using a comparative battery fabricated through a similar procedure except that no refill non-aqueous electrolyte liquid was injected, the rechargeable screwdriver-drill using the lithium-ion secondary battery of the invention exhibited a smaller deterioration in the battery discharge capacity through repeated charging and discharging.

The non-aqueous electrolyte liquid container and the arrangement of internal filling hole stoppers in the battery of Practical Example 11 were the same as those shown in FIG. 72 (FIGS. 72A to 72C). Using the battery of the invention, in the form of a plurality of them connected together, to a motor-assisted bicycle instead of a rechargeable screwdriver-drill offered a similar effect.

It should be understood that all the embodiments and examples presented herein are in every respect illustrative and not restrictive. The scope of the present invention is defined not by the embodiments and examples described above but by the appended claims, and the invention encompasses any variations and modifications in the sense and scope equivalent to those of the claims.

For example, although Embodiments 1 to 12 described above deal with examples where the invention is applied to a lithium-ion secondary battery of a stacked type, this is not meant to limit the invention; the invention may be applied to a lithium-ion secondary battery of a wound type.

Although Embodiments 1 to 12 described above deal with examples where the invention is applied to a lithium-ion secondary battery (non-aqueous electrolyte secondary battery) as an example of a secondary battery, this is not meant to limit the invention; the invention may be applied to a non-aqueous electrolyte secondary battery other than a lithium-ion secondary battery, and may also be applied to a secondary battery other than a non-aqueous electrolyte secondary battery. The invention is applicable even to secondary batteries that are yet to be developed.

Although Embodiments 1 to 12 described above deal with examples where an elevated portion having a cavity portion for storing refill non-aqueous electrolyte liquid is formed on the lid plate, this is not meant to limit the invention; instead, an elevated portion having a cavity portion for storing refill non-aqueous electrolyte liquid may be formed on the bottom face of the package can. In that case, to increase the rigidity of the lid plate, it is preferable to form a rib or an elevated portion on the lid plate. Projections having cavity portions for storing refill non-aqueous electrolyte liquid may be formed both on the lid plate and on the bottom face of the package can. It is, however, preferable to form an elevated portion having a cavity portion for storing refill non-aqueous electrolyte liquid on the lid plate, because it is then possible to obtain an effect of improving the rigidity of the lid plate and an effect of improving the life characteristics simultaneously.

In Embodiments 1 to 12 described above, the shape, size, depth, etc. of the elevated portion may be changed as necessary. Different features of the elevated portions in Embodiments 1 to 12 may be combined as necessary. Likewise, the size, shape, etc. of the package container (lid plate, package can) may be changed in many ways.

Although Embodiments 1 to 12 described above deal with examples where a second plate member of the lid plate is welded to a first plate member thereof and thereby the opening of the depressed portion in the first plate member is stopped by the second plate member, any other construction may instead be adopted so long as the opening of the depressed portion in the first plate member can be stopped. For example, instead of the second plate member, a sheet-shaped member may be bonded with adhesive or the like so that the sheet-shaped member stops the opening in the first plate member.

Figure 73:
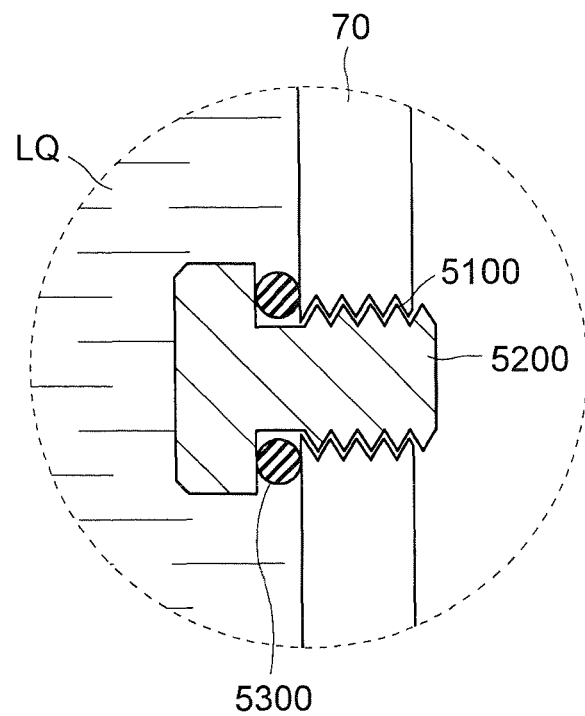
FIG. 73 is a sectional view showing how a hole in an elevated portion is sealed in a lithium-ion secondary battery of a first modified example of the invention (the diagram showing part of the battery enlarged)
Figure 74:
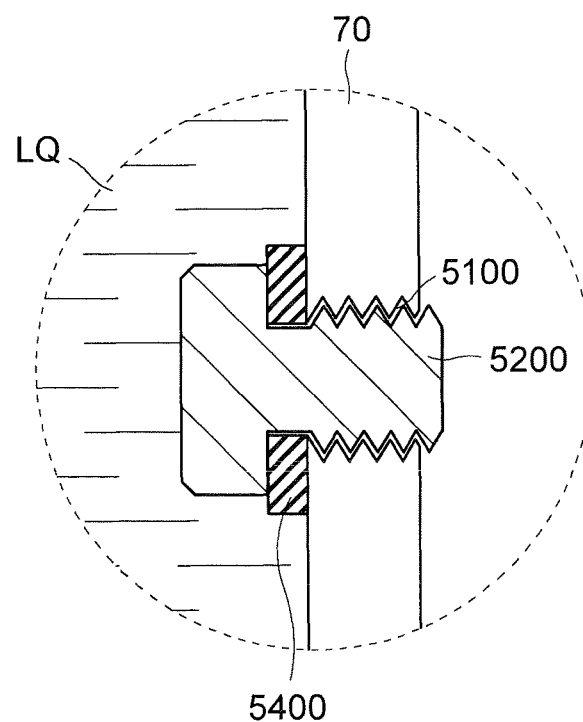
FIG. 74 is a sectional view showing how a hole in an elevated portion is sealed in a lithium-ion secondary battery of a second modified example of the invention (the diagram showing part of the battery enlarged)

Although Embodiments 1 to 12 described above deal with examples where a hole in the elevated portion is sealed with a sealing member formed of a resin material (sealing resin), this is not meant to limit the invention; the hole may instead be sealed with a screw. That is, the seeping portion may be implemented with a screw. Specifically, as shown in FIGS. 73 and 74, in an elevated portion on the first plate member 70, for example, an M2 threaded hole 5100 is formed, and this threaded hole 5100 is sealed with a screw 5200. An M2 screw denotes a screw complying with the ISO standards for metric screws. In that case, the pitch of the screw 5200 is designed to be such that the non-aqueous electrolyte liquid LQ gradually flows (leaks) between the screw 5200 and the threaded hole 5100 (through the gap between the external and internal threads). The specific thread pitch can be selected to suit the design life of the product, and may be, for example, 0.4 mm. Moreover, it is preferable that the screw 5200 for sealing the threaded hole 5100 be fitted with an O-ring 5300 (see FIG. 73) or a seal 5400 (see FIG. 74) to keep air tightness. It is preferable that the O-ring 5300 be formed of a material resistant to an organic electrolyte liquid, examples including SBR, EPDM, butyl rubber, silicone rubber, and rubber containing fluorine resin. It is preferable that the seal 5400 be formed of a material resistant to an organic electrolyte liquid, examples including polypropylene (PP), polyethylene (PE), a copolymer of PP and PE, SBR, EPDM, butyl rubber, silicone rubber, and rubber containing fluorine resin, and Teflon (registered trademark) seal tape formed of PTFE (polytetrafluoroethylene). The screw serving as the seeping portion may also be formed of a resin similar to those that can be used for the O-ring, the seal, and the sealing member. Furthermore, it is preferable that the screw 5200 be tightened with such a torque that, as the pressure inside the package container rises, the refill non-aqueous electrolyte liquid LQ is fed (leaks) toward the electrode assembly. In a case where a screw 5200 is used as the sealing member, the lid plate can be assembled, for example, in the following manner. After the threaded hole 5100 in the elevated portion is sealed with the screw 5200, the second plate member having a filling hole previously formed in it is welded to the first plate member. Next, through the filling hole in the second plate member, refill non-aqueous electrolyte liquid LQ is injected. Thereafter, the filling hole in the second plate member is sealed. In this way, a lid plate provided with refill non-aqueous electrolyte liquid LQ is built.

Although Embodiments 1 to 12 described above deal with examples where one hole through which refill non-aqueous electrolyte liquid is fed toward the electrode assembly is formed in the elevated portion (depressed portion, cavity portion) of the lid plate, this is not meant to limit the invention; a plurality of such holes may be formed in the elevated portion (depressed portion, cavity portion) of the lid plate.

Although Embodiments 1 to 12 described above deal with examples where the hole is formed in a side face of the depressed portion formed as a result of the elevated portion being formed, this is not meant to limit the invention; the hole may be formed in the bottom face of the depressed portion. Holes may be formed both in a side face and in the bottom face.

In Embodiments 1 to 12 described above, a filling hole through which refill non-aqueous electrolyte liquid is injected may be formed in the second plate member of the lid plate.

In Embodiments 1 to 12 described above, the bottom face of the cavity portion (the bottom face of the depressed portion) may be inclined so that the refill non-aqueous electrolyte liquid flows toward the hole (leaking portion).

Figure 75:
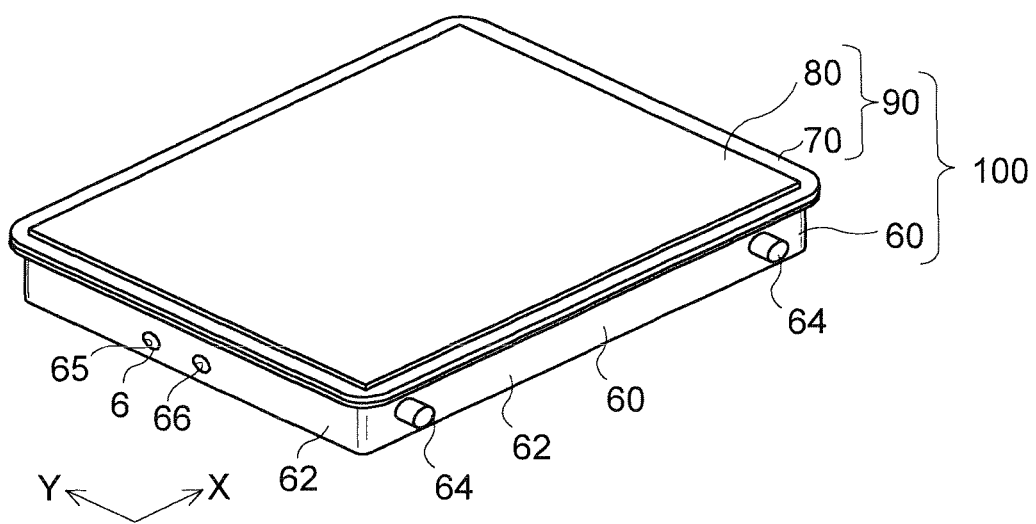
FIG. 75 is a perspective view of a lithium-ion secondary battery according to a third modified example of the invention.

Although Embodiments 1 to 12 described above deal with examples where a filling hole for injecting non-aqueous electrolyte liquid is formed in a side wall of the package can at one end in its shorter-side direction, this is not meant to limit the invention; the filling hole may be formed at any other position, so long as it allows the non-aqueous electrolyte liquid to be fed into the space where the electrode assembly is housed. For example, as shown in FIG. 75, the filling hole 65 may be formed in a side wall 62 of the package can 60 at one end in its longer-side direction (X direction). Although FIG. 75 shows an example in which a safety valve 66 is provided near the filling hole 65, the safety valve 66 may be provided at any other position than shown in FIG. 75.

Figure 76:
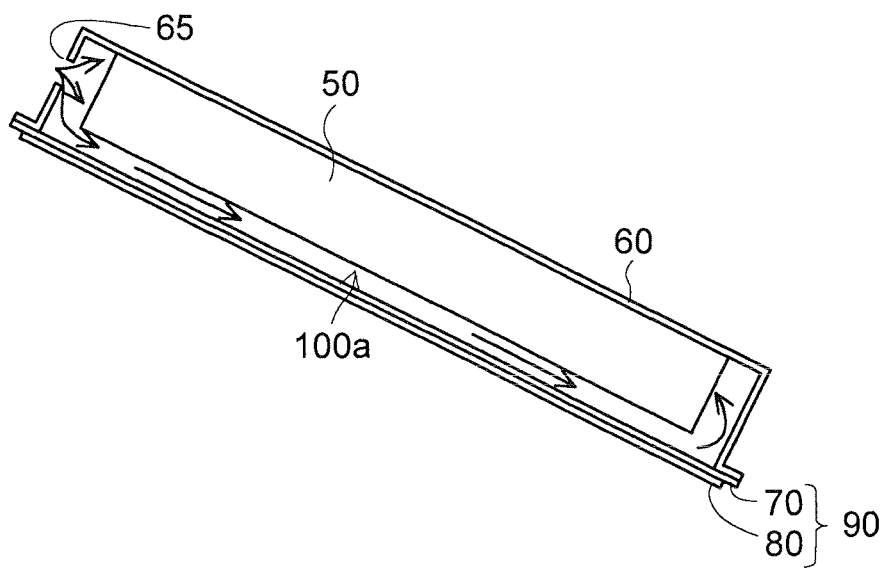
FIG. 76 is a schematic diagram illustrating electrolyte liquid filling operation in the lithium-ion secondary battery according to the third modified example of the invention.
Figure 77:
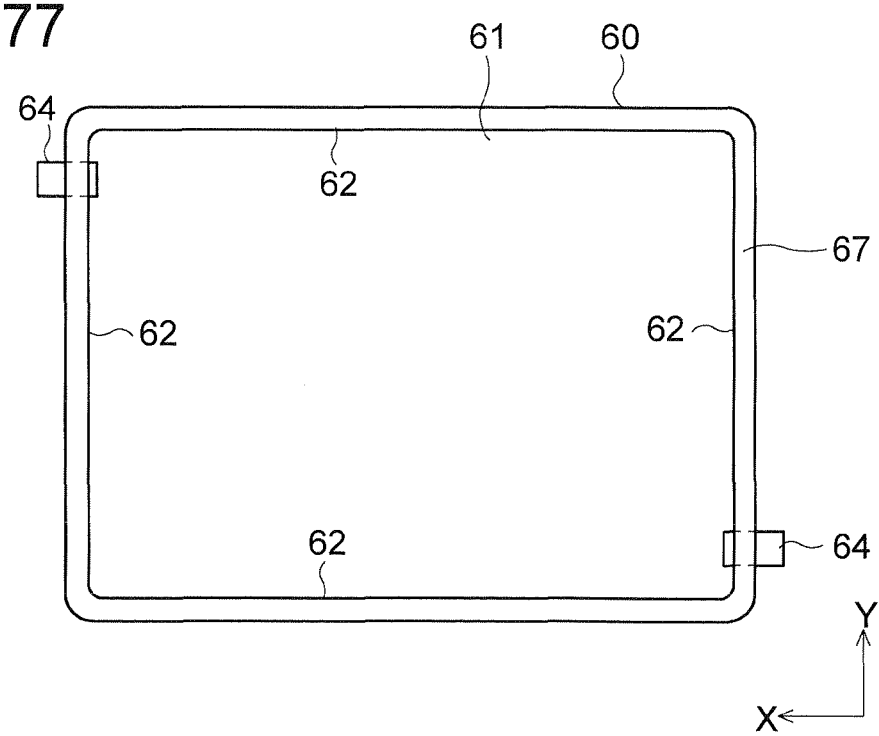
FIG. 77 is a plan view of a package can in a lithium-ion secondary battery of a fourth modified example of the invention.
Figure 78:
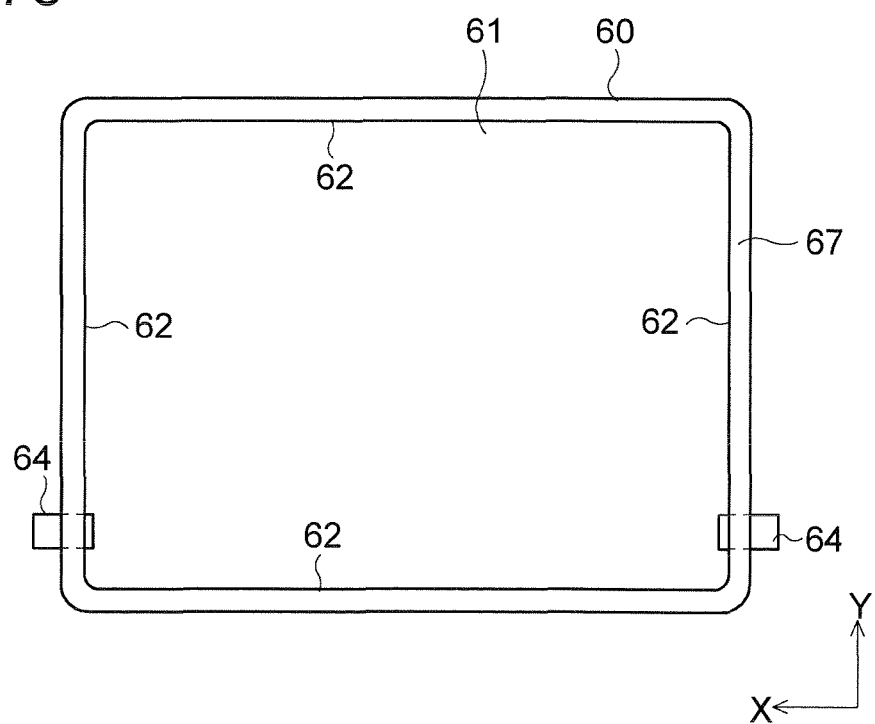
FIG. 78 is a plan view of a package can in a lithium-ion secondary battery of a fifth modified example of the invention.

In the embodiments described above, as a result of an elevated portion being formed on the lid plate, a gap is formed between the lid plate and the electrode assembly; thus, when non-aqueous electrolyte liquid is injected through the filling hole after the welding of the lid plate, through that gap, the non-aqueous electrolyte liquid can be led in a different direction from the filling hole. For example, in the construction of Embodiment 1, as shown in FIG. 26, as a result of the elevated portions 71 being formed, a gap 100*a* is formed between the lid plate 90 and the electrode assembly 50. Thus, for example in a case where a filling hole 65 is formed at the position shown in FIG. 75, when non-aqueous electrolyte liquid is injected, tilting the lithium-ion secondary battery as shown in FIG. 76 causes the non-aqueous electrolyte liquid injected through the filling hole 65 to flow through the gap 100*a* away from the filling hole 65. This permits the non-aqueous electrolyte liquid injected to permeate into the electrode assembly 50 from the side opposite from the side where the filling hole 65 is formed. This helps achieve satisfactory permeation with the non-aqueous electrolyte liquid. In a similar manner, it is possible to achieve satisfactory permeation with the non-aqueous electrolyte liquid in any embodiment other than Embodiment 1.

Although Embodiments 1 to 12 described above deal with examples where an active material layer is formed on both sides of a charge collector, this is not meant to limit the invention; an active material layer may be formed on only one side of a charge collector. The electrode assembly may partly include electrodes (positive, negative) having an active material layer formed on only one side of a charge collector.

Although Embodiments 1 to 12 described above deal with examples where the positive and negative electrodes are arranged so that the charge collector-exposed portion of the positive electrodes and the charge collector-exposed portion of the negative electrodes are located at opposite sides, this is not meant to limit the invention; the positive and negative electrodes may be arranged so that the charge collector-exposed portion of the positive electrodes and the charge collector-exposed portion of the negative electrodes are located at the same side.

Although Embodiments 1 to 12 described above deal with examples where a charge collector-exposed portion is formed at one end of charge collectors, this is not meant to limit the invention; a charge collector-exposed portion may be formed, for example, at each end of charge collectors. Any other construction than those may be adopted.

Although Embodiments 1 to 12 described above deal with examples where the two electrode terminals (positive and negative electrode terminals) are formed in a side wall at a longer side of the package can, this is not meant to limit the invention; the electrode terminals may be formed at any other positions. For example, the electrode terminals 64 may be formed at the positions shown in FIG. 70, or may be formed at the positions shown in FIG. 71.

In the embodiments described above, it is also possible to adopt a construction in which, in a case where a plurality of elevated portions are formed on the lid plate, the refill non-aqueous electrolyte liquid stored in different cavity portions is fed (leaks) toward the electrode assembly at different feed rates (leak rates). For example, in a case where a screw is used as the sealing member for sealing a hole in an elevated portion (cavity portion), by varying the thread pitch or the like, it is possible to vary the feed rate (leak rate) of the non-aqueous electrolyte liquid from different cavity portions. Specifically, by using a thread with a greater pitch, or by combining an internal thread with tolerance position G with an external thread with tolerance position e (>f>g), it is possible to shorten the time it takes for the non-aqueous electrolyte liquid to start to be fed (leak). The tolerance positions here represent allowed errors with respect to nominal dimensions as defined in JIS B0209-1. In a case where a resin material is used as the sealing member for sealing a hole in an electric power (cavity portion), by varying the amount of the resin material used, it is possible to vary the feed rate (leak rate) of the non-aqueous electrolyte liquid from different cavity portions. For example, by reducing the amount of sealing resin used to seal a hole, it is possible to shorten the time it takes for the non-aqueous electrolyte liquid to start to be fed (leak). By varying the feed rate (leak rate) of the non-aqueous electrolyte liquid from different cavity portions in this way, it is possible to design the life of a product easily.

Although Embodiments 1, 2, and 9 to 12 described above deal with examples where a hole (through which refill non-aqueous electrolyte liquid is fed toward the electrode assembly) is formed in a side face of a depressed portion at one end thereof (its side face at one end in the longer-side direction), this is not meant to limit the invention; holes may be formed in side faces of a depressed portion at both ends thereof (its side faces at both ends in the longer-side direction). With this construction, it is possible to feed the refill non-aqueous electrolyte liquid to both ends of the electrode assembly, and thus to achieve satisfactory permeation with the non-aqueous electrolyte liquid. Any such hole may be formed in a side face other than those mentioned above (for example, in a shorter-side-direction side face).

The lithium-ion secondary batteries of Embodiments 1 to 12 described above may be used not only in solar power generating systems, wind power generation systems, motorized bicycles, and electric railway vehicles, but also as storage batteries in hybrid electric vehicles (HEVs) and electric vehicles (EVs).

The invention encompasses, in its technical scope, any embodiments achieved by appropriately combining technical features from different ones of Embodiments 1 to 12 presented above.

What is claimed is:

1. A secondary battery comprising:
    a battery portion having a positive electrode, a negative electrode, and a separator and filled with non-aqueous electrolyte liquid;
    a non-aqueous electrolyte liquid storage portion in which refill non-aqueous electrolyte liquid is stored;
    a package member in which the battery portion and the non-aqueous electrolyte liquid storage portion are housed;
    a partition wall disposed inside the package member, between the battery portion and the non-aqueous electrolyte liquid storage portion; and
    a seeping portion provided on the partition wall and configured to let the refill non-aqueous electrolyte liquid step out from the non-aqueous electrolyte liquid storage portion into the battery portion; wherein the seeping portion includes:
        an opening formed in the partition wall and having an internal thread on the inside thereof; and
        an external thread meshing with the internal thread.

2. The secondary battery according to claim 1, wherein the non-aqueous electrolyte liquid storage portion comprises a tank in which the refill non-aqueous electrolyte liquid is stored.

3. The secondary battery according to claim 1, wherein the external thread is formed of resin.

4. The secondary battery according to claim 3, wherein the resin is a resin which deteriorates through exposure to a non-aqueous electrolyte liquid and thereby lets the refill non-aqueous electrolyte liquid seep into the battery portion.

5. The secondary battery according to claim 3, wherein the resin deteriorates with time whereby, after a lapse of predetermined time, the refill non-aqueous electrolyte liquid seeps out into the battery portion.

6. The secondary battery according to claim 1, wherein the seeping portion has an O-ring or a seal formed of resin disposed around the external thread.

7. The secondary battery according to claim 1, wherein the external and internal threads have a gap therebetween so as to let the refill non-aqueous electrolyte liquid seep into the battery portion through the gap.

8. The secondary battery according to claim 1, wherein the seeping portion comprises a sealing stopper formed by drying-and hardening or ultraviolet-curing a sealing agent.

9. The secondary battery according to claim 1, wherein the non-aqueous electrolyte liquid storage portion is disposed over the battery portion so that, when the secondary battery is placed for use, the electrolyte liquid in the non-aqueous electrolyte liquid storage portion moves to the battery portion under gravity.

10. An electronic or electric device comprising the secondary battery according to claim 1 as an electric power source.

11. A method for fabrication of a secondary battery, comprising:
   including in a package member an electric power storage element having negative and positive electrodes stacked or wound with a separator therebetween;
   including inside the package member a partition wall plate comprising an opening;
   filling non-aqueous electrolyte liquid through the opening;
   sealing the opening with a sealing stopper, joining a lid portion, and filling refill non-aqueous electrolyte liquid through a filling hole in the lid portion or the package member; and
   sealing the filling hole in the lid portion or the package member; and
   providing a seeping portion on the partition wall plate to let the refill non-aqueous electrolyte liquid seep out from a non-aqueous electrolyte liquid storage portion into a battery portion by configuring the opening formed in the partition wall plate to have an internal thread on the inside thereof and by providing on the sealing stopper an external thread meshing with the internal thread.

12. The method of claim 11, further comprising forming the sealing stopper with a resin that deteriorates with time whereby, after a lapse of predetermined time, the refill non-aqueous electrolyte liquid seeps out into the battery portion.

* * * * *